(12) United States Patent
Fukuzawa

(10) Patent No.: US 10,032,829 B2
(45) Date of Patent: *Jul. 24, 2018

(54) MAGNETIC MEMORY WITH SPIN DEVICE ELEMENT EXHIBITING MAGNETORESISTIVE EFFECT

(71) Applicant: BlueSpin, Inc., Kanagawa (JP)

(72) Inventor: Hideaki Fukuzawa, Kanagawa (JP)

(73) Assignee: BLUESPIN, INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/811,942

(22) Filed: Nov. 14, 2017

(65) Prior Publication Data

US 2018/0083066 A1 Mar. 22, 2018

Related U.S. Application Data

(63) Continuation of application No. 14/728,651, filed on Jun. 2, 2015, now Pat. No. 9,847,374.

(30) Foreign Application Priority Data

Mar. 6, 2015 (JP) .................................. 2015-045194

(51) Int. Cl.
*G11C 11/00* (2006.01)
*H01L 27/22* (2006.01)
(Continued)

(52) U.S. Cl.
CPC .......... *H01L 27/222* (2013.01); *G11C 11/161* (2013.01); *G11C 11/1675* (2013.01);
(Continued)

(58) Field of Classification Search
CPC ... H01L 27/222; H01L 43/08; H01L 41/0926; H01L 43/02; G11C 11/161; G11C 11/1675

See application file for complete search history.

(56) References Cited

U.S. PATENT DOCUMENTS 6,055,178 A 4/2000 Naji
6,424,562 B1 7/2002 Rosner et al.
(Continued)

FOREIGN PATENT DOCUMENTS

JP 2006-165327 6/2006
JP 2007-513501 5/2007
(Continued)

OTHER PUBLICATIONS

Kuntal Roy et al. "Hybrid spintronics and straintronics: A magnetic technology for ultra low energy computing and signal processing", Applied Physics Letters 99, 063108 (2011).
(Continued)

*Primary Examiner* — Hien Nguyen
(74) *Attorney, Agent, or Firm* — Wenderoth, Lind & Ponack, L.L.P.

(57) ABSTRACT

A magnetic memory includes a deformable base plate, a spin device element coupled with the deformable base plate and storing a data as a magnetization direction, and a bending mechanism to bend the deformable base plate. At least one of upper and lower surfaces of the deformable base plate faces a space which is not filled with solid substance.

11 Claims, 63 Drawing Sheets

(51) Int. Cl.
    *H01L 43/08*      (2006.01)
    *H01L 43/02*      (2006.01)
    *H01L 41/09*      (2006.01)
    *G11C 11/16*      (2006.01)

(52) U.S. Cl.
    CPC .......... *H01L 41/0926* (2013.01); *H01L 43/02* (2013.01); *H01L 43/08* (2013.01)

(56) References Cited

U.S. PATENT DOCUMENTS

| | | | |
|---|---|---|---|
| 7,453,719 B2 | 11/2008 | Sakimura et al. | |
| 7,835,210 B2 | 11/2010 | Shimizu | |
| 7,852,665 B2 | 12/2010 | Chen et al. | |
| 8,040,718 B2 | 10/2011 | Ueda | |
| 8,077,501 B2 | 12/2011 | Ong | |
| 8,093,668 B2 | 1/2012 | Ueda | |
| 8,159,864 B2 | 4/2012 | Yoon et al. | |
| 8,207,757 B1 | 6/2012 | Chen et al. | |
| 8,369,129 B2 | 2/2013 | Fujita et al. | |
| 8,665,638 B2 | 3/2014 | Rao et al. | |
| 8,743,595 B2 | 6/2014 | Kitano | |
| 8,830,735 B2 | 9/2014 | Kariyada et al. | |
| 8,902,642 B2 | 12/2014 | Mitou | |
| 8,971,101 B2 | 3/2015 | Matsui | |
| 9,076,953 B2 | 7/2015 | Du | |
| 9,379,312 B2 | 6/2016 | Sugibayashi et al. | |
| 9,847,374 B2 * | 12/2017 | Fukuzawa | H01L 27/222 |
| 2006/0118842 A1 | 6/2006 | Iwata | |
| 2007/0285184 A1 | 12/2007 | Eyckmans et al. | |
| 2011/0170339 A1 | 7/2011 | Wunderlich et al. | |
| 2012/0079887 A1 | 4/2012 | Giddings et al. | |
| 2012/0267735 A1 | 10/2012 | Atulasimha et al. | |
| 2013/0062714 A1 | 3/2013 | Zhu et al. | |
| 2013/0064011 A1 | 3/2013 | Liu et al. | |
| 2013/0121066 A1 | 5/2013 | Zhu et al. | |
| 2013/0250661 A1 | 9/2013 | Sandhu et al. | |
| 2013/0256819 A1 | 10/2013 | Watanabe et al. | |
| 2013/0272059 A1 | 10/2013 | Lin et al. | |
| 2013/0334630 A1 | 12/2013 | Kula et al. | |
| 2014/0125332 A1 | 5/2014 | Lage et al. | |
| 2014/0175582 A1 | 6/2014 | Apalkov et al. | |
| 2014/0197505 A1 | 7/2014 | Zhou et al. | |

FOREIGN PATENT DOCUMENTS

| | | |
|---|---|---|
| JP | 2007-200928 | 8/2007 |
| JP | 2012-009786 | 1/2012 |
| WO | 2005/050653 | 6/2005 |

OTHER PUBLICATIONS

Ayan K. Biswas et al., "Energy-efficient magnetoelastic non-volatile memory", Applied Physics Letters 104, 232403 (2014).
Written Opinion of the International Searching Authority dated Aug. 25, 2015 in International Application No. PCT/JP2015/071719. (English Translation).
International Search Report dated Aug. 25, 2015 in International Application No. PCT/JP2015/071719. (English Translation).
Office Action dated Apr. 8, 2016 in U.S. Appl. No. 14/815,217.
Notice of Allowance dated Sep. 13, 2016 in U.S. Appl. No. 14/815,217.
Office Action dated Aug. 25, 2017 in U.S. Appl. No. 15/377,111.

* cited by examiner

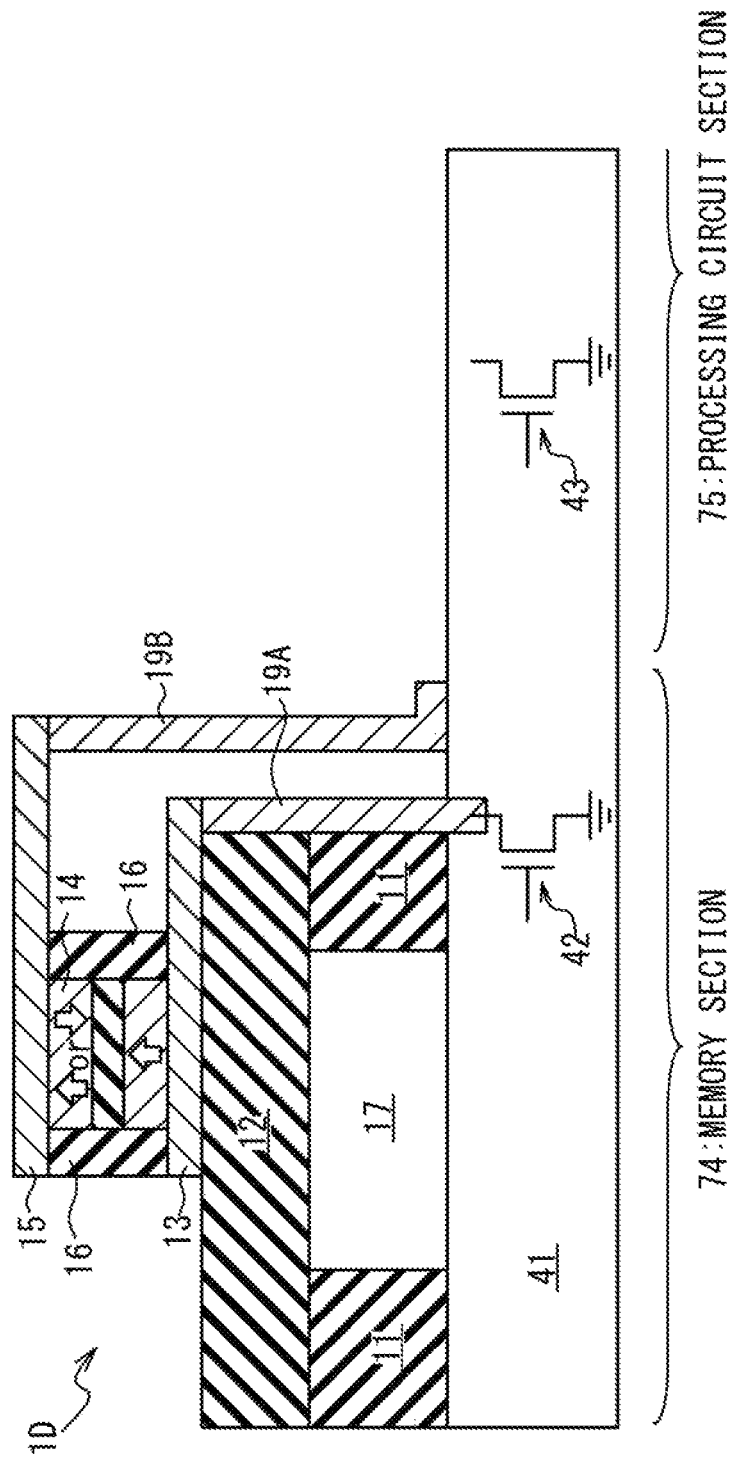

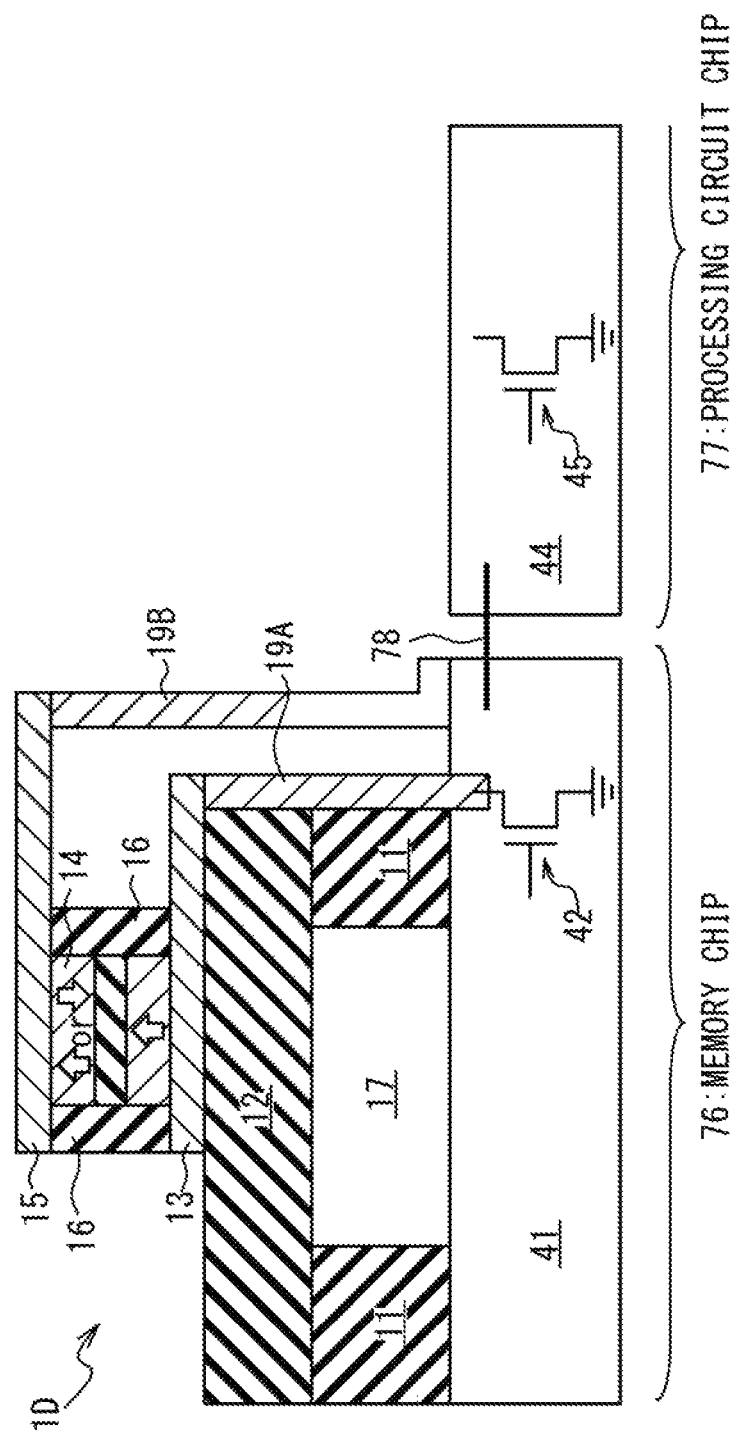

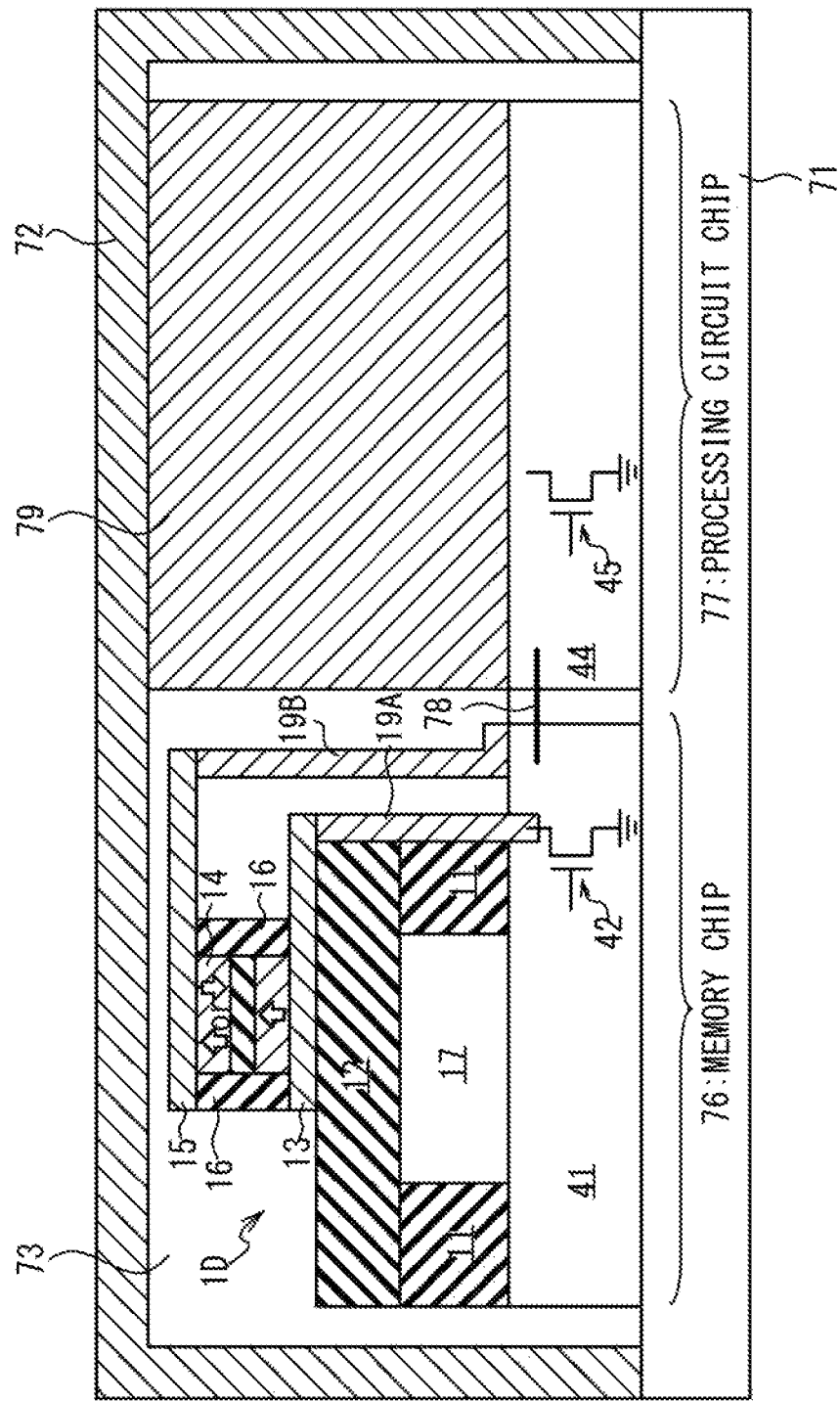

MAGNETIC MEMORY WITH SPIN DEVICE ELEMENT EXHIBITING MAGNETORESISTIVE EFFECT

CROSS REFERENCE

This application claims priority of Japanese Patent Application No. Japanese Patent Application No. 2015-045194, filed on Mar. 6, 2015, the disclosure which is incorporated herein by reference.

TECHNICAL FIELD

The present invention relates to a magnetic memory, a data writing method into a magnetic memory and a semiconductor device.

BACKGROUND ART

Extensive research and development activities have been conducted for magnetic memories, which are expected as non-volatile memories with high speed operation, large capacity and reduced power consumption. One type of the magnetic memories which have been studied most extensively in recent years is the STT-MRAM (spin transfer torque-magnetoresistive random access memory). The STT-MRAM is a magnetic memory which achieves data writing into a memory cell by using a spin transfer torque, enjoying an advantage of reduction in the write current for a reduced memory cell size. Such advantage is expected to be favorable in realizing a large memory capacity and reduced power consumption at the same time.

Unfortunately, in fact, there still remain considerable problems in meeting this expectation and achieving commercialization of a magnetic memory. One of the most significant problems is a difficulty in concurrently satisfying these three requirements: data read sensitivity, data stability and data write power (electric power consumed in a data writing operation). These three requirements are in trade-off relationship each other. Even if one or two of the three requirements is met, the other one or two requirements are sacrificed. When the MR (magnetoresistance) ratio is increased to improve the data read sensitivity and to thereby reduce the error rate in read operations, for instance, this makes it difficult to reduce the data write power required for generating a spin transfer torque. The opposite also applies. As for the relation between the data write power and data stability, the data stability increases proportionally with the magnetic anisotropy energy KuV (where Ku is the magnetic anisotropy constant and V is the volume) while the data write power also increases proportionally with the magnetic anisotropy energy KuV. Accordingly, the improvement in the data stability inevitably increases the data write power.

Another case is that if the write power for generating the spin transfer torque is decreased, this means that there is a reduced margin between the read current and the write current. This may cause a disturbance of the magnetic layer during read operation, which affects the bit error rate. Accordingly, it is very difficult to satisfy both requirements of the reduced write power and the reliable read operation.

As thus discussed, although it is possible to individually satisfy each of the above-described three requirements with the current technologies, it is difficult to satisfy the three requirements at the same time with the current technologies, due to the trade-off relationship. If a conflict between two of the three above-described requirements is resolved, this would effectively contribute commercialization of magnetic memories.

It should be noted that the following documents may disclose related magnetic memories. Applied Physics Letters 99, 063108 (2011) and Applied Physics Letters 104, 232403 (2014) disclose magnetic memories in which a piezoelectric film is coupled with a magnetic film.

U.S. Patent Application Publication No. 2013/0062714 A discloses a magnetic memory in which an MTJ (magnetic tunnel junction) is covered with a film that applies a stress to the MTJ. U.S. Patent Application Publication No. 2013/0250661 A also discloses a structure for applying a stress to a memory cell of a magnetic memory.

Japanese Patent Application Publication No. 2012-9786 A discloses a magnetic memory in which a piezoelectric body is disposed at such a position that the piezoelectric body causes a mechanical effect on a recording layer. The magnetic memory is configured to generate such a stress that the coercive force of the recording layer is reduced by applying an electric field to the piezoelectric body in recording information into the recording layer to thereby reduce a spin injection current required for the recording. This patent literature also discloses that an empty space is formed in a substrate at a position just under the main body of a memory element and a piezoelectric element.

U.S. Patent Application Publications Nos. 2012/0267735 A and 2013/0064011 A disclose magnetic memories in which a piezoelectric layer is coupled with a magnetoresistive layer to apply a stress to the magnetoresistive layer.

U.S. Patent Application Publication No. 2013/0334630 A discloses a structure in which a stress-compensating material is provided in a memory cell of a magnetic memory to reduce the net stress.

U.S. Patent Application Publication No. 2014/0197505 A discloses a magnetic shield structure used in a package accommodating a magnetic memory chip.

SUMMARY OF INVENTION

Therefore, one objective of the present invention is to relieve a conflict between the data stability and data write power in a magnetic memory.

Other objectives and new features of the present invention would be understood by a person skilled in the art from the attached drawings and the following disclosure.

In an aspect of the present invention, a magnetic memory includes: a deformable base plate; a spin device element coupled with the deformable base plate and storing a data as a magnetization direction; and a bending mechanism to bend the deformable base plate. At least one of upper and lower surfaces of the deformable base plate faces a space which is not filled with solid substance.

In another aspect of the present invention, a data writing method is provided which is suitable for the above-described magnetic memory. The data writing method includes: writing a data into the spin device element by feeding a write signal to the spin device element in a state in which the deformable base plate is bent by the bending mechanism.

In still another aspect of the present invention, a semiconductor device includes: a magnetic memory; and a package incorporating the magnetic memory in an enclosing space formed in the package. The magnetic memory includes: a deformable base plate; at least one spin device element coupled with the deformable base plate and storing a data as a magnetization direction; and a bending mechanism to bend the deformable base plate. The enclosed space includes such a cavity that at least one of the upper and lower surfaces of the deformable base plate faces a space which is not filled with solid substance.

In still another aspect of the present invention, a method of manufacturing a magnetic memory, including: forming a sacrificial layer on a semiconductor substrate in which a transistor is integrated; forming a deformable base plate on the sacrificial layer; forming a spin device element on the deformable base plate, the spin device element storing a data as a magnetization direction; forming a piezoelectric layer coupled with the deformable base plate; and forming a space which is not filled with solid substance by removing at least a portion of the sacrificial layer, so that the lower surface of the deformable base plate faces the space.

The present invention provides a technique for effectively relieving a conflict between the data stability and data write power in a magnetic memory.

BRIEF DESCRIPTION OF THE DRAWINGS

The above and other advantages and features of the present invention will be more apparent from the following description taken in conjunction with the accompanied drawings, in which:

FIG. 36 is a sectional-view illustrating the structure of a semiconductor integrated circuit of one embodiment, in which a magnetic memory and a processing circuit (logic circuit) are monolithically integrated;

FIG. 38 is a cross-sectional view illustrating the structure of a semiconductor device in which a magnetic memory and a processing circuit (logic circuit) are integrated in separate chips, in one embodiment;

FIG. 39B is a cross-sectional view illustrating another example of the structure of a package in which the semiconductor device illustrated in FIG. 38 is packaged.

DESCRIPTION OF PREFERRED EMBODIMENTS

Figure 1A:
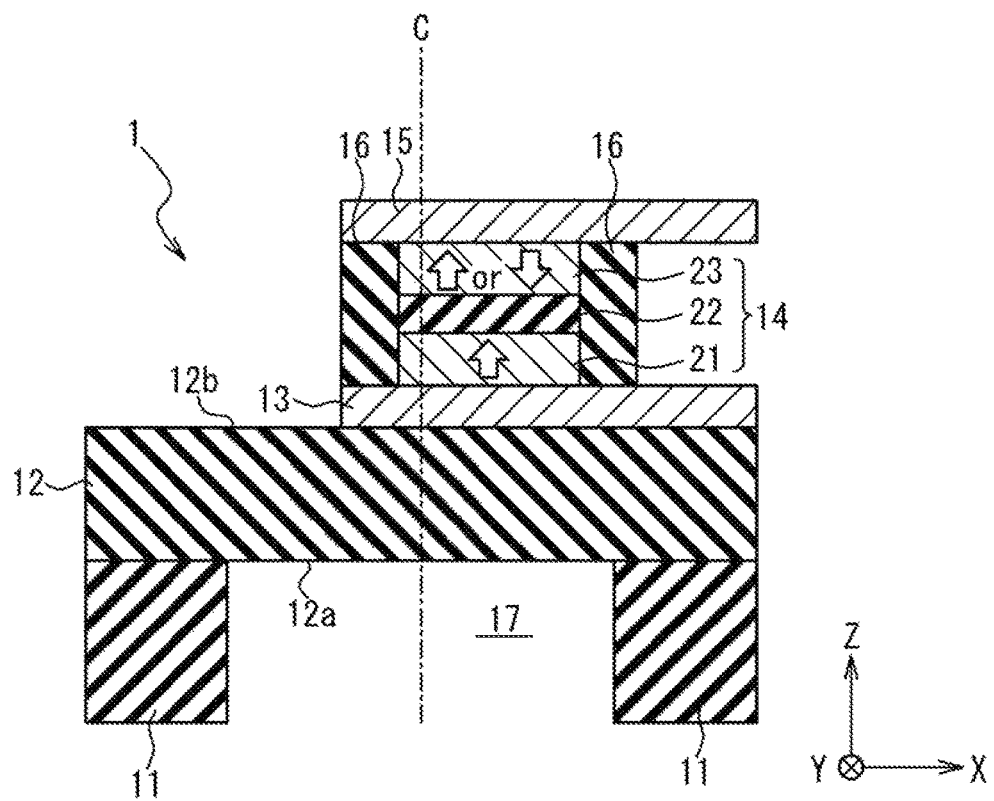
FIG. 1A is a cross-sectional view illustrating an exemplary principle structure of a magnetic memory in one embodiment of the present invention.

Preferred Embodiments of the present invention will be described below with reference to the attached drawings. In the attached drawings and the following description, the same or similar elements are denoted by the same or corresponding reference numerals. It should be noted that respective components may be illustrated with emphasis in the attached drawings so that the operation principles of respective embodiments would be easily understood, and the dimensions of the illustrated components may not reflect the actual dimensions.

(Structure and Operation of Magnetic Memory)

Figure 1B:
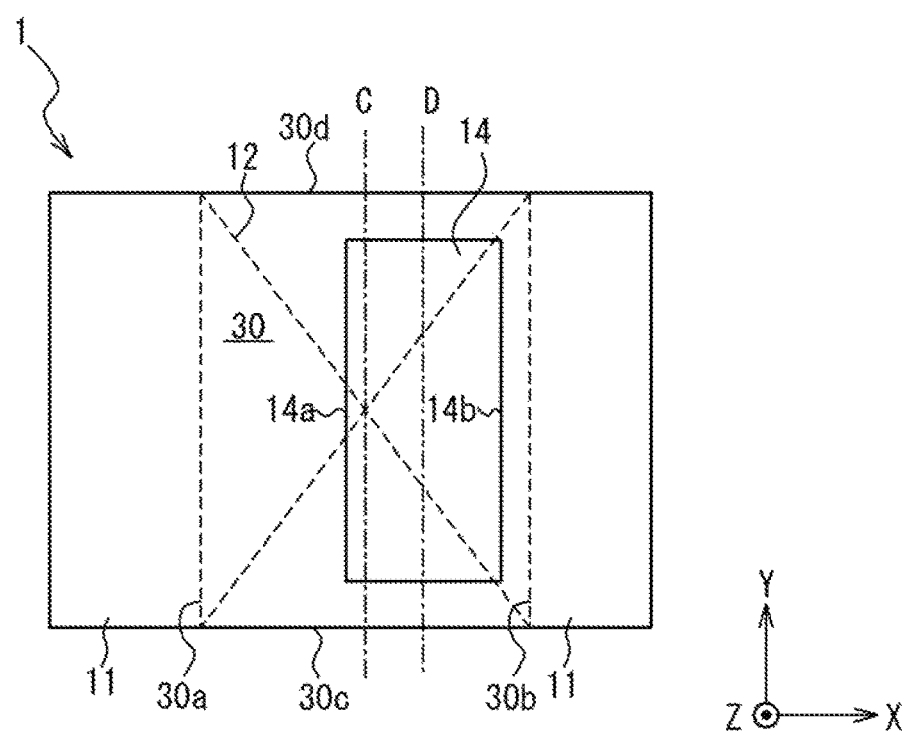
FIG. 1B is a plan view illustrating the in-plane structure of the magnetic memory illustrated in FIG. 1A.

FIG. 1A is a cross-sectional view illustrating an exemplary principle structure of a magnetic memory in one embodiment of the present invention and FIG. 1B is a plan view illustrating the in-plane structure of the magnetic memory illustrated in FIG. 1A. It should be noted that directions may be indicated with an XYZ Cartesian coordinate system in the drawings. In the XYZ Cartesian coordinate system, the X-axis, Y-axis and Z-axis are orthogonal to each other. In one embodiment, a magnetic memory 1 includes a fixture base 11, a deformable base plate 12, a lower electrode 13, a spin device element 14 and an upper electrode 15.

The fixture base 11 is a structural member which supports the deformable base plate 12. In the structure illustrated in FIG. 1A, the fixture base 11 is coupled with on the lower surface 12a of the deformable base plate 12.

The deformable base plate 12 is configured to be deformable so that the deformable base plate 12 can be bent. The deformable base plate 12 may be formed of silicon, silicon oxide, silicon nitride, silicon oxynitride or the like. Materials and processes used in a SON (Si-on-nothing) technology may be used for the formation of the deformable base plate 12. The deformable base plate 12 preferably has a thickness of 200 nm to 5 μm, for example. As described later, the magnetic memory 1 in the present embodiment is configured so that a data is written into the spin device element 14 in a state in which the deformable base plate 12 is bent.

The lower electrode 13 is used as a conductor which establishes an electrical connection with the spin device element 14. In the structure illustrated in FIG. 1A, the lower electrode 13 is formed on the upper surface 12b of the deformable base plate 12. The lower electrode 13 may be formed of copper (Cu), gold (Au), silver (Ag), aluminum (Al) and an alloy of two or more of these metals. Preferably, the lower electrode 13 has a thickness of 50 to 500 nm, for example.

The spin device element 14, which has the function of storing a data as the magnetization direction of magnetic material, is used as a memory cell of the magnetic memory 1. In the present embodiment, the spin device element 14 includes a reference layer 21, a spacer layer 22 and a recording layer 23. The reference layer 21 and recording layer 23 are opposed to each other across the spacer layer 22. In the present embodiment, the reference layer 21 is coupled with the upper surface of the lower electrode 13 and the spacer layer 22 is coupled with the upper surface of the reference layer 21, while the recording layer 23 is formed on the upper surface of the spacer layer 22. Note that the positions of the reference layer 21 and the recording layer 23 may be interchanged; the recording layer 23 may be positioned below the spacer layer 22 and the reference layer 21 may be disposed above the spacer layer 22.

Although not illustrated in FIG. 1A (and other figures) for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

Also, although not illustrated in FIG. 1A (and other figures), a capping layer may be inserted between the recording layer 23 and the upper electrode 15 (or between the reference layer 21 and the upper electrode 15 when the reference layer 21 is positioned above the recording layer 23.)

The reference layer 21 and recording layer 23 are configured to exhibit a spontaneous magnetization (hereinafter, simply referred to as "magnetization"), each including at least one magnetic film. The spacer layer 22 is, on the other hand, formed of non-magnetic material. The magnetization direction of the reference layer 21 is fixed while the magnetization direction of the recording layer 23 is reversible. In the configuration illustrated in FIG. 1A, the magnetization of the reference layer 21 is fixed in the upward direction, and the magnetization of the recording layer 23 is reversible between the upward and downward directions. The reference layer 21 and the recording layer 23 may be formed of an elementary substance of magnetic metal, such as iron (Fe), cobalt (Co) and nickel (Ni), or a ferromagnetic alloy including at least one of these magnetic metals, for example. The reference layer 21 and the recording layer 23 may be formed of a ferromagnetic alloy including at least one of these magnetic metals. The reference layer 21 and the recording layer 23 may be doped with one or more non-magnetic elements. Non-magnetic elements which may be contained in the reference layer 21 and the recording layer 23 include boron, carbon, nitrogen, oxygen, aluminum, silicon, titanium, vanadium, chromium, manganese, copper, zinc, zirconium, niobium, molybdenum, ruthenium, rhodium, palladium, silver, hafnium, tantalum, tungsten, iridium, platinum and gold. Preferred materials and properties of the reference layer 21 and the recording layer 23 are discussed later in detail.

In the present embodiment, the spin device element 14 stores one bit data as the magnetization direction of the recording layer 23. In one example, the magnetization of the recording layer 23 is directed upward when data "1" is stored in the spin device element 14 and downward when data "0" is stored in the spin device element 14. The association of the magnetization direction of the recording layer 23 with data "0" and "1" may be opposite.

Figure 1C:
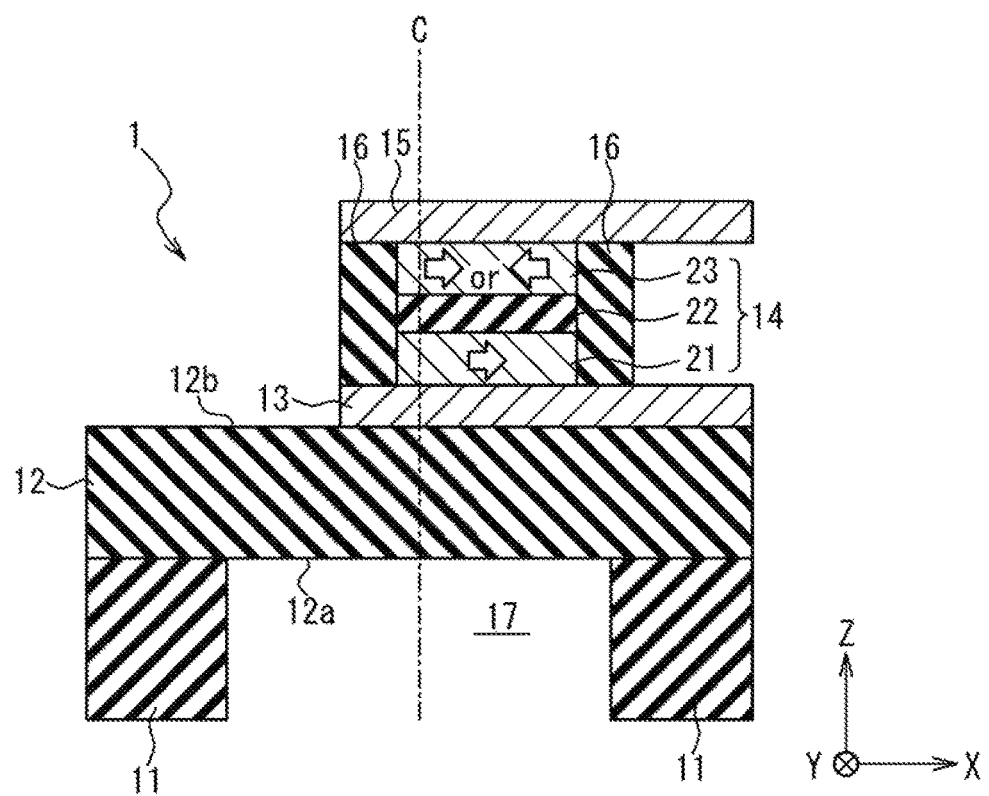
FIG. 1C is a cross-sectional view illustrating a modified structure of the magnetic memory in the present embodiment.

In one embodiment, as illustrated in FIG. 1A, the reference layer 21 and the recording layer 23 are formed to exhibit perpendicular magnetic anisotropy. In this case, the reference layer 21 is formed so that the magnetization is fixed in a thickness direction of the reference layer 21 and the recording layer 23 is formed so that the magnetization is reversible between the thickness directions of the recording layer 23. It should be noted that the reference layer 21 and the recording layer 23 may be formed to exhibit in-plane magnetic anisotropy, as illustrated in FIG. 1C.

In one embodiment, the spacer layer 22 may be formed of a dielectric film having such a thin thickness that a tunnel current can flow through the spacer layer 22. In this case, the spin device element 14 operates as a TMR (tunnel magnetoresistance) element that exhibits a TMR effect. To obtain a sufficiently large TMR effect, it is preferable that the spacer layer 22 is formed of, for example, magnesium oxide (MgO), aluminum oxide (AlOx) or the like. Alternatively, the spacer layer 22 may be formed of oxide, nitride or oxynitride of magnesium (Mg), aluminum (Al), silicon (Si), zirconium (Zr), hafnium (Hf), tantalum (Ta) or the like.

The spacer layer 22 may be formed of a metal conductor to reduce the resistance of the spin device element 14. In this case, the spin device element 14 is configured as a spin valve element that exhibits a giant magnetoresistance (GMR) effect. To achieve a sufficiently large GMR effect, the spacer layer 22 may be formed of non-magnetic metal, such as copper (Cu), gold (Au), silver (Ag) and aluminum (Al) or an alloy of these non-magnetic metals. A composite spacer layer that includes an oxide matrix and metal columns penetrating through the oxide matrix in the thickness direction may be used as the spacer layer 22. In this case, the oxide matrix of the composite spacer layer may be formed of aluminum oxide and the metal columns, which penetrates through the oxide matrix in the thickness direction, may be formed of copper (Cu). The spacer layer 22 preferably has a thickness of 1 to 3 nm.

In both cases, the data stored in the spin device element 14 can be identified by generating a sensing signal (current signal or voltage signal) having a signal level depending on the resistance of the spin device element 14 through applying a voltage or current to the spin device element and detecting the signal level of the sensing signal, since the resistance of the spin device element 14 is determined on the relative direction of the magnetizations of the reference layer 21 and the recording layer 23.

Although the simplest structure of the spin device element 14 is illustrated in FIG. 1A, the structure of the spin device element 14 may be variously modified. For example, the reference layer 21 may be formed of a film stack including a magnetic film and an antiferromagnetic film that fixes the magnetization of the magnetic film.

In order to compensate the static magnetic field generated by the reference layer 21, a synthetic antiferromagnetic or antiferrimagnetic multilayer may be used as the reference layer 21. In this case, the reference layer 21 may include at least two magnetic layers separated by a ruthenium (Ru) or rhodium (Rh) layer. The magnetizations of adjacent two magnetic layers in a synthetic antiferromagnetic or antiferrimagnetic multilayer are directed in the opposite directions due to the RKKY (Ruderman-Kittel-Kasuya-Yosida) coupling across the ruthenium or rhodium layer. The reference layer 21 may include a plurality of synthetic antiferromagnetic or antiferrimagnetic multilayers which are serially stacked, in order to minimize the static field generated by the reference layer 21 and applied to the recording layer 23.

The reference layer 21 and the recording layer 23 may be composed of a multilayer stack which includes two or more laminated magnetic films. The reference layer 21 and the recording layer 23 may be configured as a multilayer stack which includes a plurality of magnetic films and one or more non-magnetic films, each providing a ferromagnetic coupling between adjacent two of the magnetic films. In any cases, a layer which contains elements selected from the group consisting of Fe, Co and Ni may be used as the reference layer 21 and the recording layer 23.

Although not illustrated in FIG. 1A, an underlayer may be disposed below the reference layer 21 to control the crystal orientation of the reference layer 21. The underlayer may be composed of a multilayer stack including a buffer layer and a seed layer. The buffer layer may be formed of at least one of elements selected from the group consisting of Ti, V, Cr, Zn, Nb, Mo, Hf and Ta; these are typical elements which cause a buffer effect. The buffer layer may be formed of alloy metal which includes one or more of these elements. The seed layer, which is formed on the upper surface of the buffer layer to control the crystal orientation of the reference layer 21, may be formed of metal which shows an fcc (face-centered cubic) crystal orientation, a bcc (body-centered cubic) crystal orientation or a hcp (hexagonal close-packed)

crystal orientation. The seed layer may be formed of a layer which contains Cu, Ru or NiFe. The seed layer may be doped with one or more other elements.

The upper electrode 15 is used as another conductor which establishes an electrical connection with the spin device element 14. In the structure illustrated in FIG. 1A, the upper electrode 15 is coupled with the upper surface of the recording layer 23. The upper electrode 15 may be formed of, for example, copper (Cu), gold (Au), silver (Ag), aluminum (Al) and an alloy of two or more of these metals. The upper electrode 15 preferably has a thickness of 50 to 500 nm, for example.

A dielectric layer 16 is formed on the side surface of the spin device element 14 to protect the spin device element 14. The dielectric layer 16 covers the side surface of the film stack in which the reference layer 21, the spacer layer 22 and the recording layer 23 are stacked.

In the present embodiment, the deformable base plate 12 is formed so that at least one of the lower surface 12a (that is, the surface opposed to the surface on which the spin device element 14 is formed) and the upper surface 12b (that is, the surface on which the spin device element 14 is formed) of the deformable base plate 12 faces a space which is not filled with solid substance. The "space which is not filled with solid substance" referred to herein may be filled with fluid, including gas (such as air, nitrogen) and liquid. Alternatively, the space which is not filled with solid substance may be vacuumed.

In detail, in the present embodiment, the lower surface 12a of the deformable base plate 12 faces a space 17 which is not filled with solid substance. Referring to FIG. 1B, it should be noted that the portion of the deformable base plate 12 which portion directly faces the space 17 which is not filled with solid substance may be referred to as the deformable portion 30. The spin device element 14 is formed on the deformable portion 30 of the deformable base plate 12. In other words, the spin device element 14 is positioned in the Z-axis direction with respect to the deformable portion 30.

The magnetic memory 1 of the present embodiment is configured so that the ends in the X-axis directions (the first directions) of the deformable portion 30 are fixed ends, and the ends in the Y-axis directions are free ends (not-fixed ends). In FIG. 1B, the fixed end facing the −X direction of the deformable portion 30 is denoted by numeral 30a, and the fixed end facing the +X direction is denoted by numeral 30b. In addition, the free end facing the −Y direction of the deformable portion 30 is denoted by numeral 30c, and the free end facing the +Y direction is denoted by numeral 30d. To form the free ends 30c and 30d on the ends in the Y-axis directions of the deformable portion 30, the end faces facing the Y-axis directions of at least the deformable portion 30 of the deformable base plate 12 face a space which is not filled with solid substance.

Figure 2A:
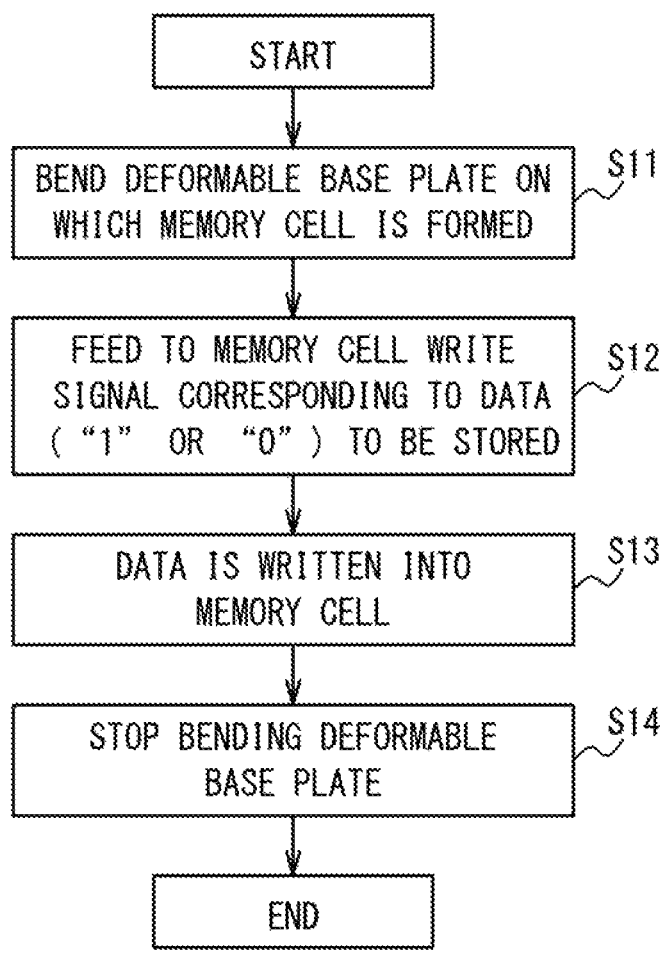
FIG. 2A is a flowchart illustrating an exemplary data writing method into a spin device element (memory cell) of a magnetic memory in the present embodiment.
Figure 3:
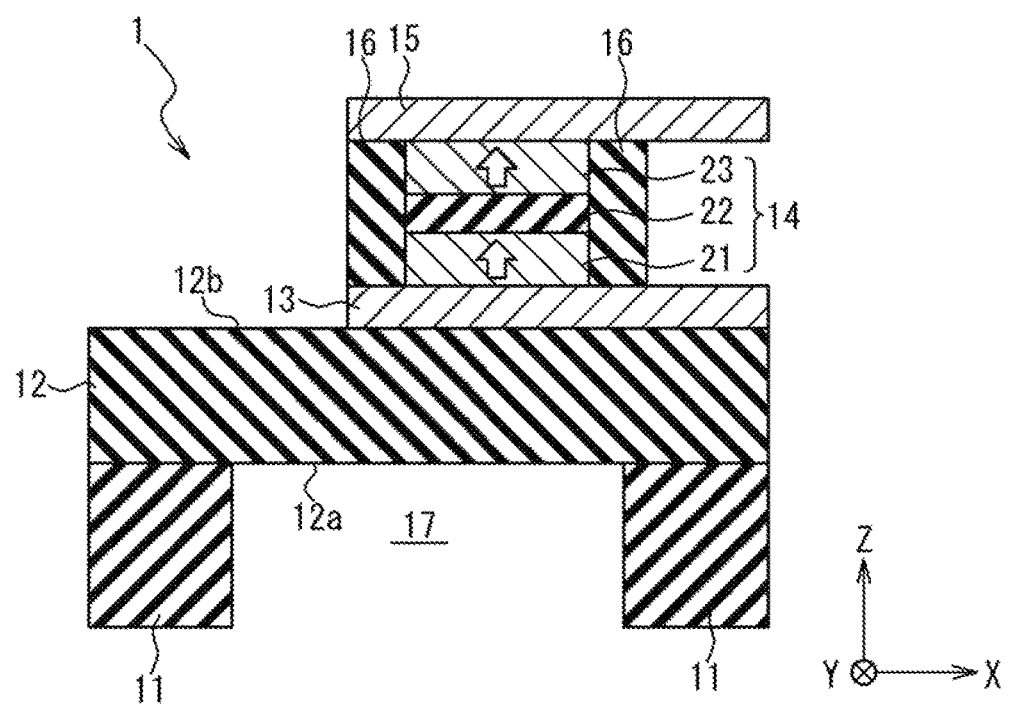
FIG. 3 is a cross-sectional view illustrating one example of the initial status of the magnetic memory in the data writing method illustrated in FIG. 2A.

FIG. 2A is a flowchart illustrating an exemplary data writing method into the spin device element 14 (the memory cell) of the magnetic memory 1 illustrated in FIG. 1A in the present embodiment. FIG. 3 illustrates the initial status of the magnetic memory 1. It is assumed that, for example, the magnetization of the recording layer 23 is initially directed in the upward direction to store data "1" in the spin device element 14.

Figure 4:
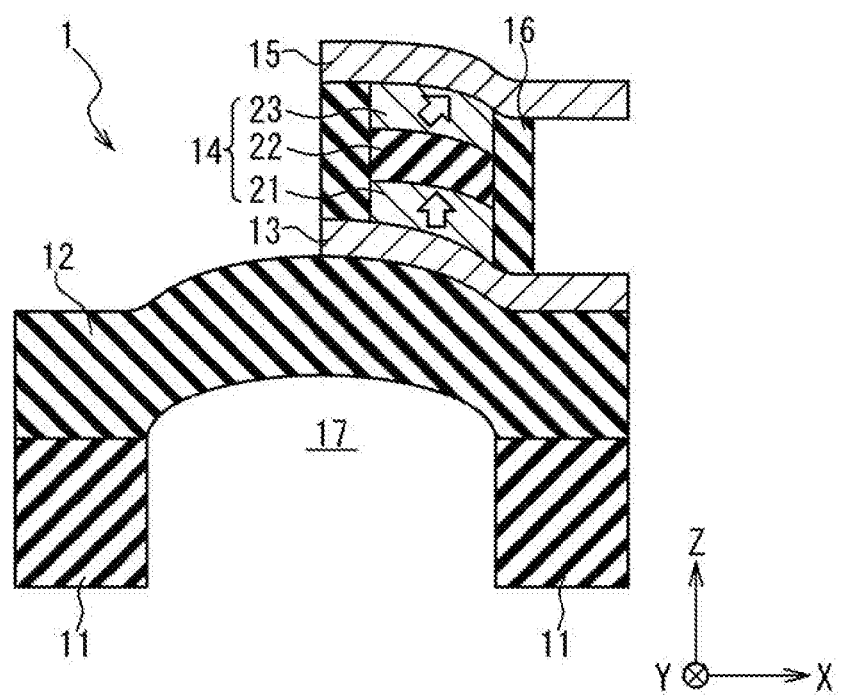
FIG. 4 is a cross-sectional view illustrating the data writing method into the magnetic memory in the present embodiment.

As illustrated in FIG. 4, when a data is written into the spin device element 14, the deformable base plate 12 is bent (at step S11). It should be noted that a mechanism to bend the deformable base plate 12 (bending mechanism) is not illustrated in FIG. 1A. A mechanism using a piezoelectric effect or a mechanism using a force exerted between a pair of capacitor electrodes may be used as the bending mechanism which bends the deformable base plate 12. The structure of the bending mechanism to bend the deformable base plate 12 will be described later in detail.

When the deformable base plate 12 is bent by any method, a mechanical stress is applied to the spin device element 14. This stress generates a strain in the spin device element 14. When the strain is generated, the magnetization direction of the recording layer 23 is tilted from the original magnetization direction. This phenomenon is caused by a change in the magnetic anisotropy of the recording layer 23 through a magnetostrictive effect depending on the amount of the strain. The magnetostrictive effect is known as a phenomenon in which the strain of a magnetic body varies depending on the magnetization status and the magnetization status of a magnetic body varies depending on the strain applied to the magnetic body. Strictly, the latter effect should be referred to as an inverse magnetostrictive effect; however, these effects are collectively referred to as the magnetostrictive effect in the present application, since the magnetostrictive effect in the broad sense usually means to encompass both of the magnetostrictive effect and inverse magnetostrictive effect in the narrow sense.

Due to the tilt of the magnetization direction of the recording layer 23 from the original magnetization direction caused by the change in the magnetization anisotropy of the recording layer 23, the recording layer 23 is placed into a state in which the magnetization thereof is easy to be reversed. This state may be hereinafter referred to as "half select". Applying a strain to the spin device element 14 through bending the deformable base plate 12, allows temporarily placing the spin device element 14 into a state in which the spin device element 14 has a reduced data stability.

For applying a sufficiently large strain to the spin device element 14, it is effective to increase the displacement (amount of bending) of the deformable base plate 12. Largely bending the deformable base plate 12 results in that a large stress is applied to the spin device element 14 and this causes a large strain in the recording layer 23 of the spin device element 14. Generation of a large strain in the recording layer 23 is effective to extract the effect of the magnetic memory of the present embodiment. Even if the magnetostriction of the recording layer 23 is unchanged, a larger displacement of the deformable base plate 12 can enhance the effect of the magnetic memory of the present embodiment, namely, the reduction in the write power consumption without sacrificing the stability of the data retention. Also, since the decrease in the write power consumption is achieved other than through an improvement in the efficiency of the spin transfer torque (STT) effect, a magnetic layer which does not exhibit a large STT effect can be used as the recording layer 23. This means that a read current does not affect the data stability of the recording layer 23 even if the read current is relatively large. This is quite different from the case when the write power is reduced only through an improvement in the efficiency of the spin transfer torque (STT) effect.

Also, as discussed later in detail, it is naturally preferable that the magnetostriction of the recording layer 23 is large to obtain a large magnetostrictive effect.

It should be noted that the magnetic memory 1 of the present embodiment is configured so that at least one of the lower and upper surfaces 12a and 12b of the deformable base plate 12 faces the "space which is not filled with solid substance" and this allows the deformable base plate 12 to be deformed with a sufficiently large displacement. The "space which is not filled with solid substance" referred herein may be filled with fluid, including gas (for example, air and nitrogen) and liquid, or vacuumed.

More specifically, in the structure illustrated in FIG. 1A, the lower surface 12a of the deformable base plate 12 (the surface of the deformable base plate 12 opposed to the surface on which the spin device element 14 is formed) partially faces the space 17 that is not filled with solid substance, and the spin device element 14 is arranged to be opposed to the space 17 across the deformable base plate 12. This structure is especially useful for increasing the displacement of the deformable base plate 12 to increase the stress applied to the spin device element 14. A larger stress applied to the spin device element 14 results in a large strain in the spin device element 14. The strain generated in the recording layer 23 of the spin device element 14 is of importance in the magnetic memory of the present embodiment. It should be noted that, in the structure illustrated in FIG. 1A, the portion of the upper surface 12b of the deformable base plate 12 on which the spin device element 14 is not formed may be covered with an appropriate dielectric film for protection.

Furthermore, a write signal corresponding to a desired data, that is, a signal that directs the magnetization direction of the recording layer 23 into the direction corresponding to the desired data is fed to the spin device element 14 (at step S12). Since the magnetostrictive effect is a uniaxial effect rather than a unidirectional effect, it is impossible to direct the magnetization direction of the recording layer 23 (which corresponds to data "0" or "1") into the desired direction only with the magnetostrictive effect; the magnetostrictive effect exerted in the recording layer 23 only achieves an effect of tilting the magnetization of the recording layer 23 by about 90 degree from the direction of the magnetic anisotropy of the recording layer 23 at the maximum. The write signal corresponding to the desired data is fed to the spin device element 14 to limit the magnetization direction of the recording layer 23 to only one direction. The write signal may be a write current that applies a spin transfer torque to the recording layer 23, or a current-induced magnetic field.

Figure 5A:
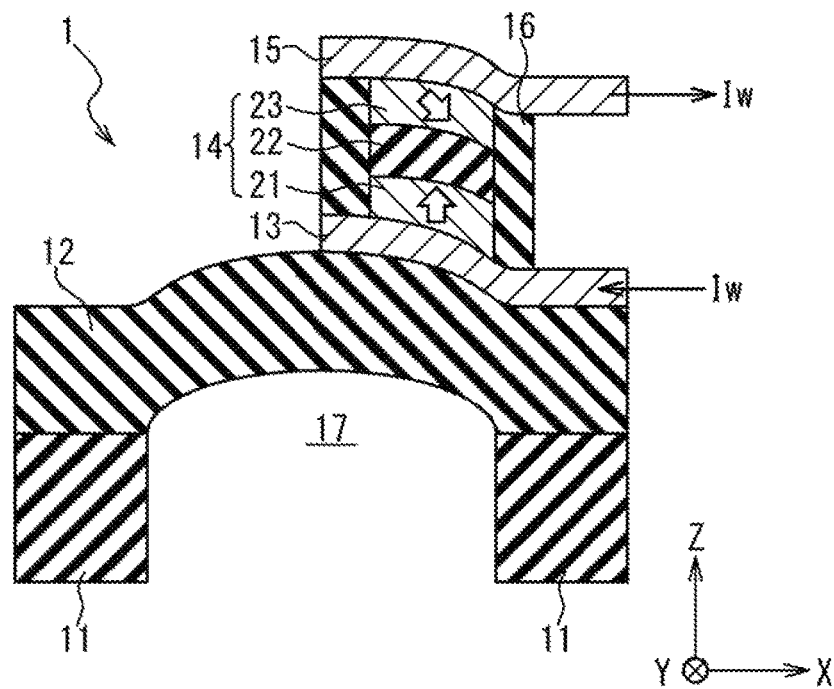
FIGS. 5A and 5B are cross-sectional views illustrating a data writing method into the magnetic memory in the present embodiment, which uses a spin-polarized current for data writing.
Figure 5B:
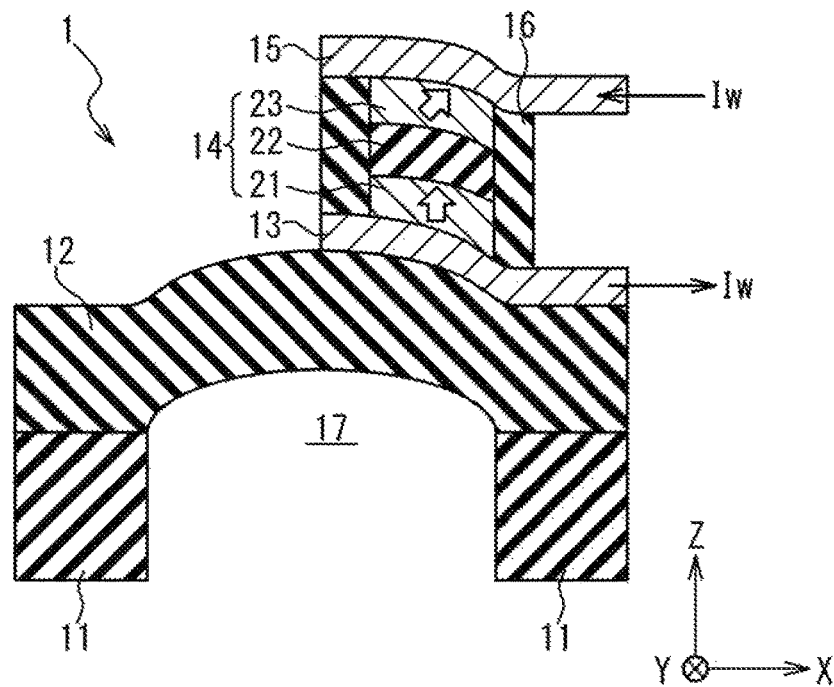

FIGS. 5A and 5B conceptually illustrate one example of the operation in which a write current Iw is fed to the spin device element 14 as the write signal. In data writing, a write current Iw is generated which flows between the lower electrode 13 and the upper electrode 15. Since the write current Iw passes through the reference layer 21 and the recording layer 23, which are both formed of magnetic material, the write current Iw applies a spin transfer torque on the magnetization of the recording layer 23. It is possible to write a desired data into the spin device element 14 by determining the direction of the write current Iw depending on the direction into which the magnetization of the recording layer 23 is to be directed, that is, the data to be written in the spin device element 14.

In detail, when the magnetization of the recording layer 23 is to be directed in the direction opposite of that of the magnetization of the reference layer 21 in the data writing, as illustrated in FIG. 5A, the write current Iw is generated so as to flow from the lower electrode 13 to the upper electrode 15. In this case, since the write current Iw flows from the reference layer 21 to the recording layer 23 via the spacer layer 22, a spin transfer torque is applied to the magnetization of the recording layer 23 to direct the magnetization of the recording layer 23 into the direction opposite to that of the magnetization of the reference layer 21. When the magnetization of the recording layer 23 is to be directed in the same direction as the magnetization of the reference layer 21 in the data writing, on the other hand, the write current Iw is generated so as to flow from the upper electrode 15 to the lower electrode 13 as illustrated in FIG. 5B. In this case, since the write current Iw flows from the recording layer 23 to the reference layer 21 via the spacer layer 22, a spin transfer torque is applied to the magnetization of the recording layer 23 to direct the magnetization of the recording layer 23 into the same direction as the magnetization of the reference layer 21.

Figure 6A:
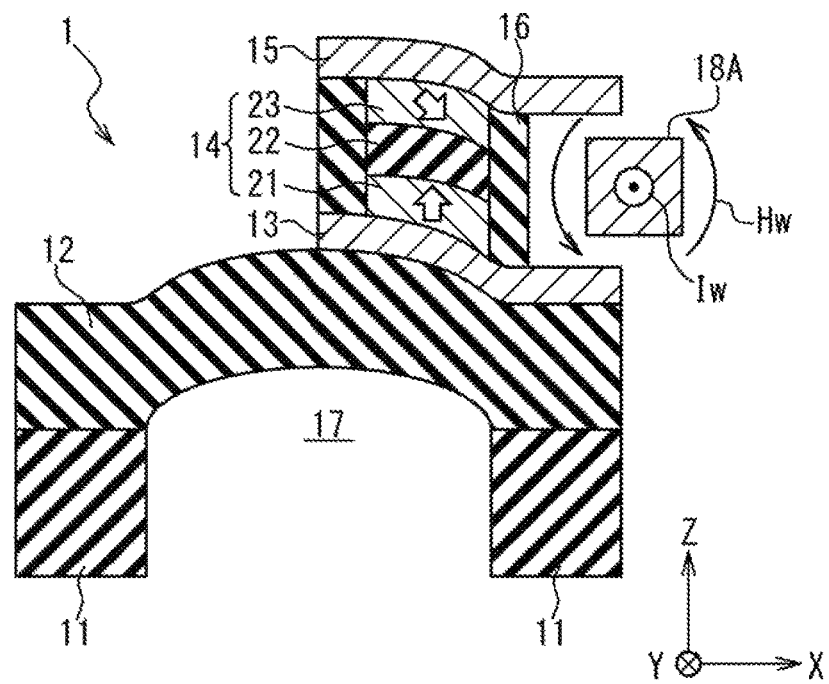
FIGS. 6A and 6B are cross-sectional views illustrating a data writing method into the magnetic memory in the present embodiment, which uses a current-induced magnetic field for data writing.
Figure 6B:
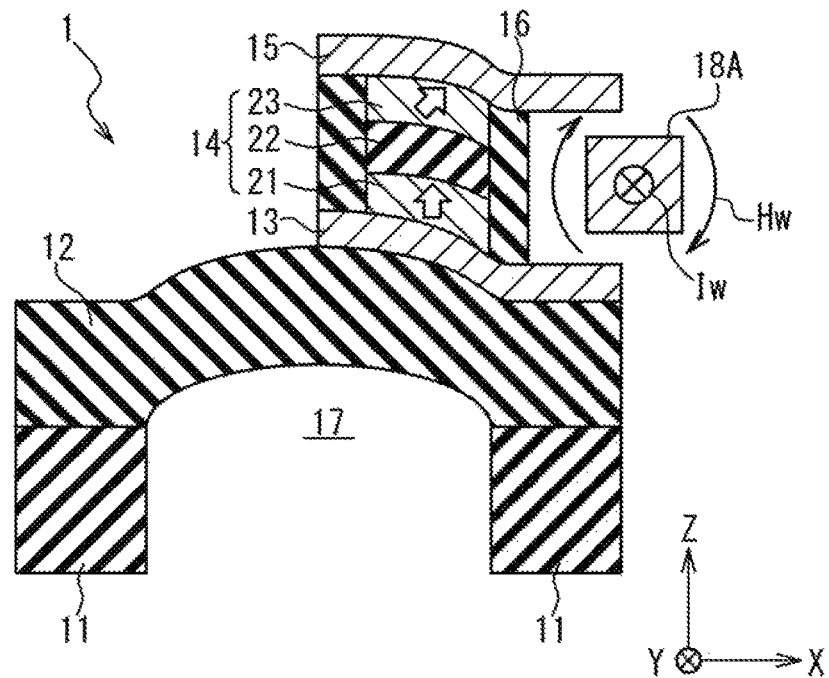

FIGS. 6A and 6B conceptually illustrate one example of the operation in which a current-induced magnetic field is fed to the spin device element 14 as the write signal. When this operation is performed, a write current line 18A is disposed in the vicinity of the spin device element 14. In the structure illustrated in FIGS. 6A and 6B, the write current line 18A is positioned sideward with respect to the spin device element 14.

In data writing, a write current Iw is generated which flows through the write current line 18A in the direction corresponding to the data to be written, that is, the direction into which the magnetization of the recording layer 23 is to be directed. The magnetization of the recording layer 23 is directed into the desired direction by a current-induced magnetic field Hw generated by the write current Iw flowing through the write current line 18A. In the structure illustrated FIGS. 6A and 6B, when the magnetization of the recording layer 23 is to be directed into the opposite direction of the magnetization of the reference layer 21 in a data writing, the write current Iw is generated which flows through the write current line 18A in the direction out of the figure (see FIG. 6A). When the magnetization of the recording layer 23 is to be directed into the same direction as the magnetization of the reference layer 21 in a data writing, on the other hand, the write current Iw is generated which flows through the write current line 18A in the direction into the figure (see FIG. 6B).

Figure 7A:
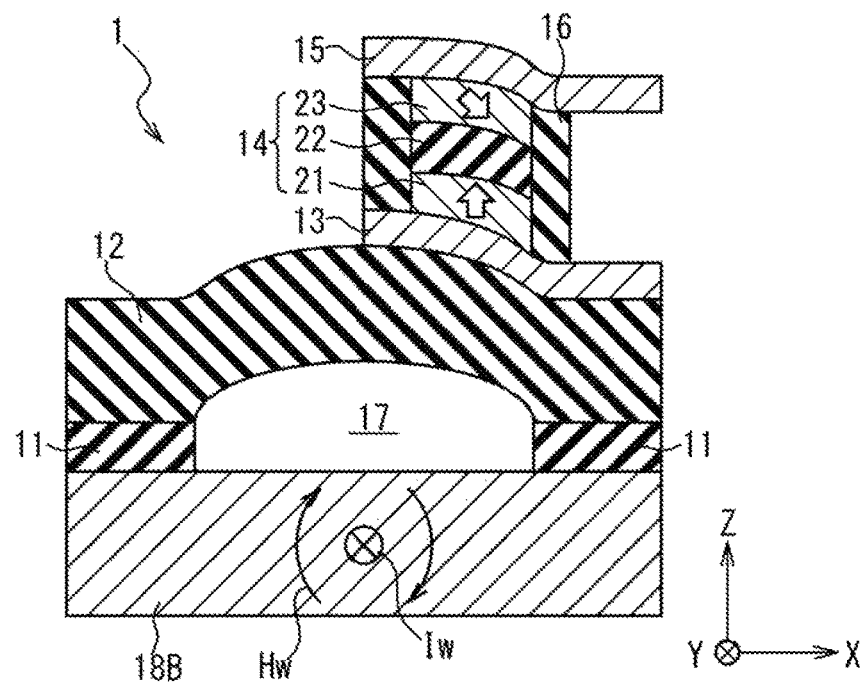
FIGS. 7A and 7B are cross-sectional views illustrating another data writing method into the magnetic memory in the present embodiment, which uses a current-induced magnetic field for data writing.
Figure 7B:
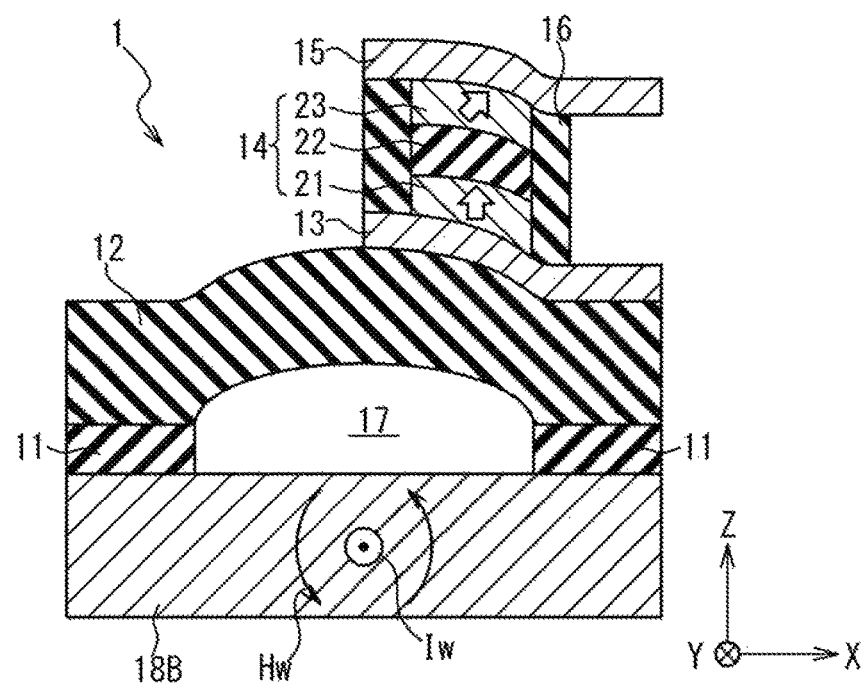

It should be noted that the direction of a write current, which flows through the write current line to generate a current-induced magnetic field, is to be appropriately selected in accordance with the positional relation between the write current line and the spin device element 14. FIGS. 7A and 7B illustrates a write operation in the case when a write current line 18B, which generates a current-induced magnetic field, is positioned below the spin device element 14. In the structure illustrated FIGS. 7A and 7B, when the magnetization of the recording layer 23 is to be directed into the opposite direction of the magnetization of the reference layer 21 in a data writing, the write current Iw is generated which flows through the write current line 18B in the direction into the figure (see FIG. 7A). When the magnetization of the recording layer 23 is to be directed into the same direction as the magnetization of the reference layer 21 in a data writing, on the other hand, the write current Iw is generated which flows through the write current line 18B in the direction out of the figure (see FIG. 7B).

The desired data is written into the spin device element 14 by feeding to the spin device element 14 a write signal corresponding to a desired data (for example, a spin-polarized current or a current-induced magnetic field) in the state in which the deformable base plate 12 is bent (at step S13).

Figure 8:
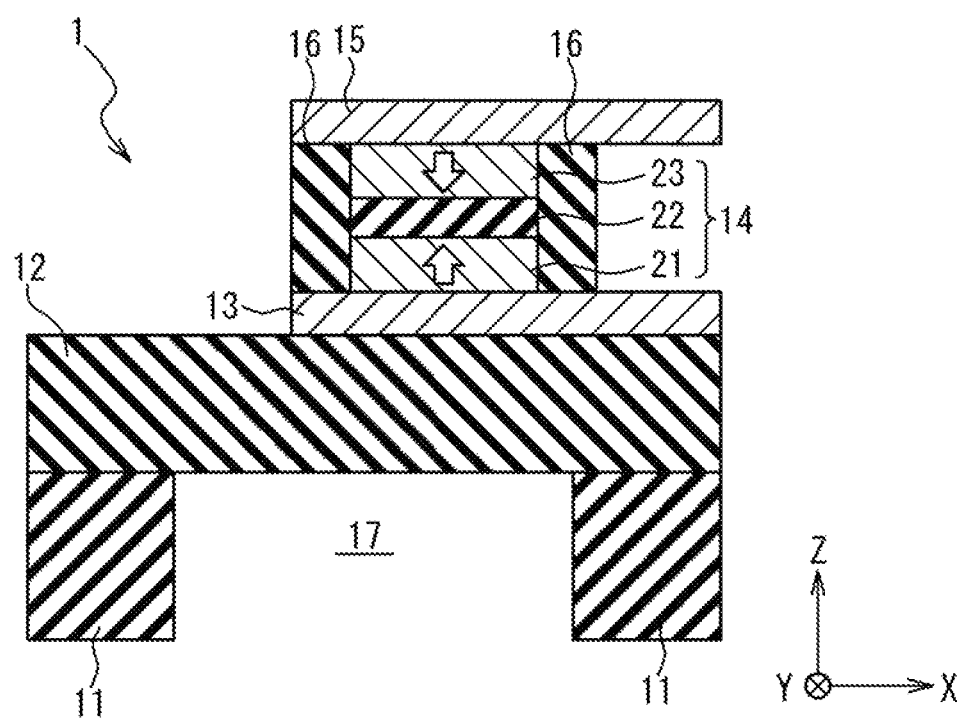
FIG. 8 is a cross-sectional view illustrating the status of the magnetic memory after the data writing is completed, in the data writing method illustrated in FIG. 2A.

Subsequently, the deformable base plate 12 stops being bent (at step S14). The above-described procedure completes data writing. FIG. 8 illustrates the magnetic memory 1 in the state in which the data writing has been completed; as illustrated in FIG. 8, the magnetization of the recording layer 23 is directed in the opposite direction from the original state (initial state) illustrated in FIG. 3. The magnetization of the recording layer 23 is reversed downward through the data writing, and the spin device element 14 is placed into the state in which data "0" is stored, for example.

Since the data writing is assisted by the magnetostrictive effect caused by the strain applied to the spin device element 14, the above-described operation effectively achieves data writing with a reduced data write power, even if magnetic material exhibiting superior data stability is used as the recording layer 23 of the spin device element 14. In other words, the magnetic memory 1 and data writing method in the present embodiment advantageously relieves a conflict between the data stability and data write power.

Figure 2B:
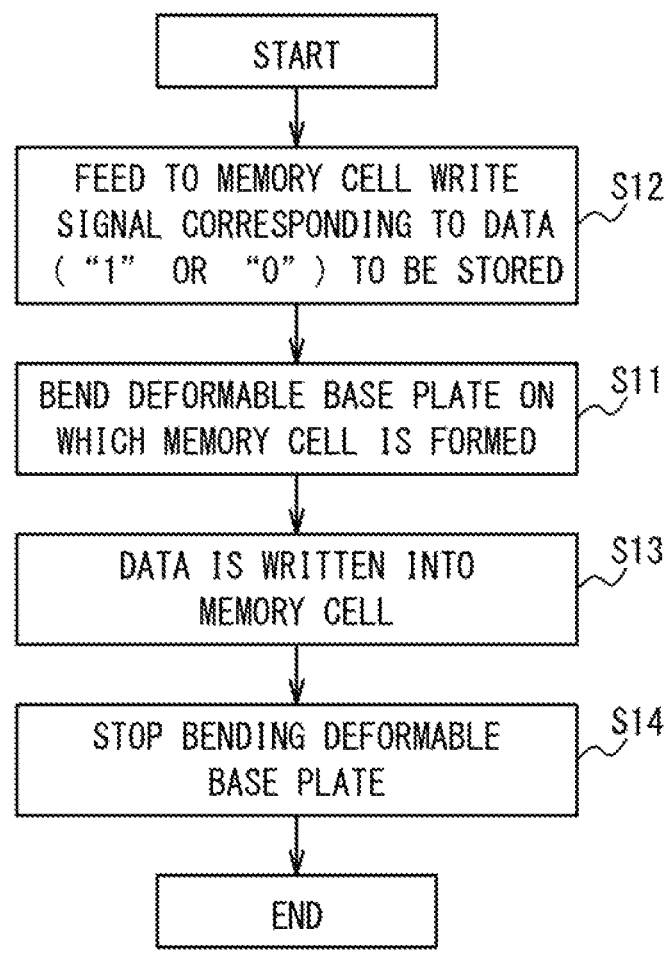
FIG. 2B is a flowchart illustrating a modification of the data writing method in the present embodiment.

It should be noted that, although the flowchart of FIG. 2A illustrates the procedure in which the operation of bending the deformable base plate 12 (at step S11) is started before the operation of feeding a write signal corresponding to a desired data (at step S12), the order of these two operations may be reversed. FIG. 2B is a flowchart illustrating the procedure of data writing in which the operation of feeding a write signal corresponding to write a desired data (at step S12) is started before the operation of bending the deformable base plate 12 (at step S11). It should be noted however that the procedure illustrated in FIG. 2B undesirably lengthens the time duration during which the write current is generated, compared with the procedure illustrated in FIG. 2A. Accordingly, the procedure illustrated in FIG. 2A, in which the operation of bending the deformable base plate 12 (this operation requires only a reduced power) is first performed and a write signal is then fed to the spin device element 14, is rather preferred.

Discussed in detail in the following are preferred materials and structures of the reference layer 21 and the recording layer 23 in the present embodiment. Since the magnetostrictive effect generated by bending the deformable base plate 12 is used to tilt the magnetization direction of the recording layer 23, it is preferable that the absolute value of the magnetostriction $\lambda$ of the recording layer 23 is large (the term "absolute value" is used because the magnetostriction $\lambda$ may take positive and negative signs), while it is rather preferable that the absolute value of the magnetostriction $\lambda$ of the reference layer 21 is small, in contrast to the recording layer 23. This aims at making the tilt of the magnetization direction of the recording layer 23 sufficiently larger than the tilt of the magnetization direction of the reference layer 21 when the deformable base plate 12 is bent. The amount of the tilt of the magnetization direction is determined on the absolute value of the magnetostriction $\lambda$ for a fixed amount of bending of the deformable base plate 12. The amount of the tilt of the magnetization direction of the recording layer 23 caused by the application of a stress is represented by the following expression (1):

$$(1/2)\Delta H_k \cdot B_s = (3/2)\Delta\sigma \cdot \lambda \quad (1)$$

where $B_s$ is the saturation magnetization of the recording layer 23 and $\lambda$ is the magnetostriction of the recording layer 23. Both parameters are physical properties dependent on the material of the recording layer 23 and the film structure nearby. The parameter $\Delta H_k$ on the left side represents the amount of the change in the magnetic anisotropy field of the recording layer 23 and corresponds to the amount of the tilt of the magnetization direction of the recording layer 23. The parameter $\Delta\sigma$ on the right side represents the amount of the change in the stress applied to the recording layer 23 caused by the deformable base plate 12 being bent. Expression (1) implies that, for increasing the amount of the tilt of the recording layer 23, it is effective to increase the amount of bending of the deformable base plate 12. Also, a large absolute value of the magnetostriction $\lambda$ for the recording layer 23 is effectively for realizing a large change in $\Delta H_k$. Note that these parameters are described in the right side of expression (1). In contrast, for the reference layer 21, it is preferable that the absolute value of the magnetostriction $\lambda$ is reduced, because it is desirable that the tilt of the magnetization direction of the reference layer 21 is reduced when the deformable base plate 12 is bent.

As described above, it is preferable that the absolute value of the magnetostriction $\lambda$ of the recording layer 23 is increased. In one embodiment, the absolute value of the magnetostriction $\lambda$ of the recording layer 23 is preferably larger than $1 \times 10^{-5}$, and further preferably than $1 \times 10^{-4}$. With respect to the relation between the absolute value of the magnetostriction $\lambda$ of the recording layer 23 and that of the reference layer 21 the absolute value of the magnetostriction $\lambda$ of the recording layer 23 is preferably twice or more of that of the reference layer 21, more preferably ten times or more, since it is preferable that the tilt of the magnetization direction of the reference layer 21 is reduced when the deformable base plate 12 is bent.

In order to realize a large magnetorestriction $\lambda$ for the recording layer 23, it is preferable that a multilayer stack of ultra-thin films is used as the recording layer 23. Such structure offers a large magnetostriction $\lambda$ originated from a large interface magnetic anisotropy. More specifically, in one embodiment, the recording layer 23 is preferably configured as a multilayer stack in which cobalt (Co) films and ultra-thin films of a different element(s) are alternately laminated, or as an artificial film stack composed of N sub-stacks in each of which cobalt films and ultra-thin films of a different element(s) are alternately laminated. Examples of the "different element(s)" may include nickel (Ni), palladium (Pd), silver (Ag), iridium (Ir), platinum (Pt) and gold (Au). The thickness of each cobalt film preferably ranges from 0.1 to 2.0 nm, more preferably, from 0.2 to 1.0 nm. The number N of the sub-stacks preferably ranges from one to ten, more preferably from two to seven.

The absolute values of the magnetostrictions $\lambda$ of the recording layer 23 and the reference layer 21 are each determined as a physical property value which depends on the structure and material; it should be noted however that the absolute values of the magnetostrictions $\lambda$ of the recording layer 23 and the reference layer 21 are not necessarily constant for given material compositions. Specifically, the magnetostriction $\lambda$ of the recording layer 23 may be enlarged, when a stress is applied to the recording layer 23. By bending the deformable base plate 12, a strain $\in$ is generated in the recording layer 23. For such a case, the magnetostriction $\lambda$ may be a function of the strain $\in$, although it is rarely cared. Therefore, the magnetostriction $\lambda$ may be represented as $\lambda(\in)$. In the present embodiment, when the deformable base plate 12 is bent in data writing, a stress $\sigma$ is applied to the recording layer 23 and accordingly a strain $\in$ is generated in the recording layer 23. It is quite advantageous that the magnetostriction $\lambda(\in)$ of the recording layer 23 is increased by the generation of a large strain $\in$, since this allows enhancing the advantage of the present embodiment. To allow the magnetostriction $\lambda$ to be a function of the strain $\in$, a preferable embodiment is that the recording layer 23 is composed of a multilayer stack structure in which cobalt films and ultra-thin films of a different element(s) are alternately layered to generate interfacial strains, as described above. The above-described artificial film stack is a typical structure that meets this requirement. In order to generate large interfacial strains in the cobalt films, it is preferable that the element(s) contained in the ultra-thin films, which are alternately laminated with the cobalt films, has an atomic radius largely different from that of cobalt. More specifically, the element(s) contained in the ultra-thin films is selected from elements having an atomic radius larger than that of cobalt. Accordingly, the ultra-thin films alternately laminated with the cobalt films are preferably formed of an element(s) having an atomic radius larger than that of cobalt, such as palladium (Pd) and platinum (Pt), rather than nickel (Ni).

In contrast, the magnetostriction λ of the reference layer 21 is preferably reduced as described above, and therefore the reference layer 21 is preferably structured so that the magnetostriction λ is less dependent on the strain ∈. In the case when the reference layer 21 is structured so that the magnetostriction λ depends on the strain ∈, it is preferable that the absolute value of the magnetostriction λ is reduced by generation of the strain ∈, in contrast to the recording layer 23. Accordingly, the reference layer 21 is preferably structured as a single-layer film, a film stack of a reduced number of films or a magnetic film mainly consisting of iron (Fe), rather than an artificial film stack incorporating cobalt (Co) films, which is suitable as the recording layer 23. A preferable embodiment is that the reference layer 21 is formed of or FePt-based material doped with a non-magnetic element(s), for example. The thickness of each layer contained in the reference layer 21 is preferably larger than 1 nm, in the order of several nanometers. Accordingly, in a preferred combination, the recording layer 23 is preferably structured as an artificial multilayer stack which includes first films including cobalt (Co) as a major ingredient and having a thickness of 1 nm or less and second films consisting of palladium (Pd), silver (Ag), iridium (Ir), platinum (Pt), gold (Au), alloy of two or more of these metals or the like, while the reference layer 21 is preferably structured as a magnetic film having a thickness more than 1 nm or a magnetic film including iron (Fe) a major ingredient.

When the spacer layer 22 is composed of an MgO layer, a CoFeB layer may be inserted as an interface layer between the MgO layer and the reference layer 21 to enhance the MR ratio. Additionally, or alternatively, a CoFeB layer may be inserted as an interface layer between the MgO layer and the recording layer 23 to enhance the MR ratio, when the spacer layer 22 is composed of an MgO layer.

The strain ∈ generated in the recording layer 23 of the spin device element 14 also depends on the arrangement of the spin device element 14 in the deformable portion 30 of the deformable base plate 12. Discussed in the following are preferred arrangements of the spin device element 14.

Figure 9A:
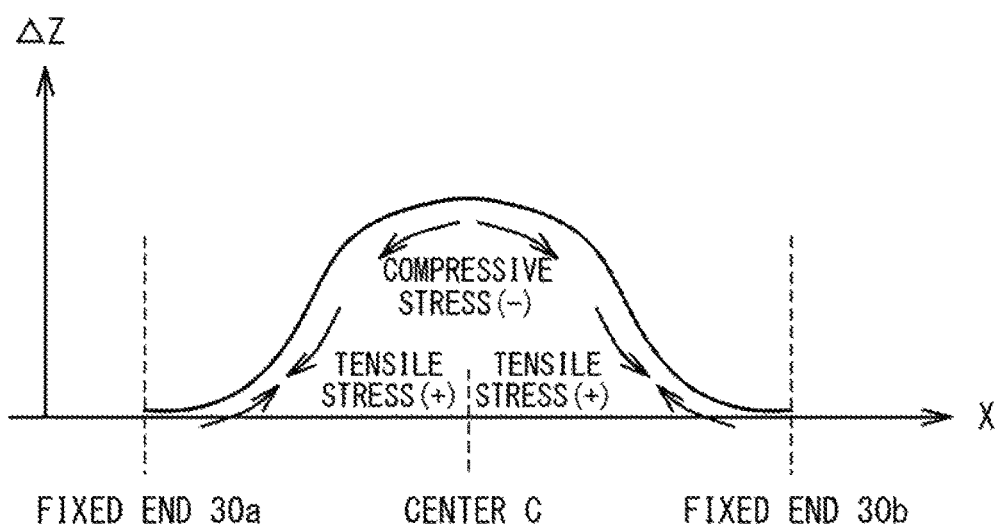
FIG. 9A is a graph illustrating an exemplary distribution in the X-axis direction of the displacement in the Z-axis direction of a deformable portion of a deformable base plate.
Figure 9B:
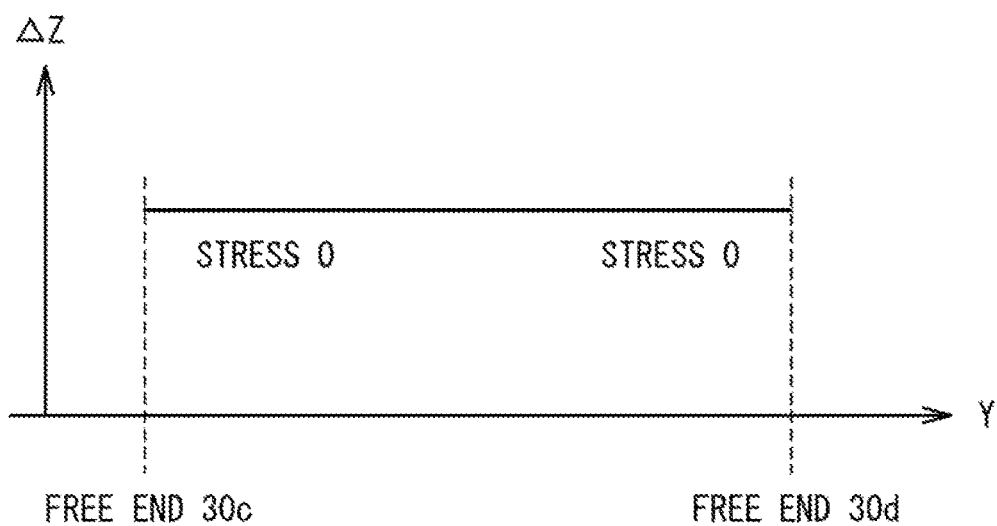
FIG. 9B is a graph illustrating an exemplary distribution in the Y-axis direction of the displacement in the Z-axis direction of the deformable portion of the deformable base plate.

FIG. 9A is a graph illustrating the distribution of the displacement ΔZ of the deformable portion 30 of the deformable base plate 12 in the X-axis direction, and FIG. 9B is a graph illustrating the distribution in the Y-axis direction. In the present embodiment, in which the fixed ends 30a and 30b of the deformable portion 30 face the X-axis directions, the displacement ΔZ of the deformable portion 30 takes the maximum value at the center plane C between the fixed ends 30a and 30b, where the center plane C is defined as a plane perpendicular to the X-axis and equally distant from the fixed ends 30a and 30b. Accordingly, when the deformable base plate 12 is bent, a layer coupled with the upper surface 12b of the deformable base plate 12 is placed into a state in which the layer mixedly includes a portion to which a compressive stress is applied and portions to which a tensile stress is applied, as illustrated in FIG. 9A. In other words, two states with opposite signs of the stress appear in the layer coupled with the upper surface 12b of the deformable base plate 12.

If the spin device element 14 is arranged to be plane-symmetric with respect to the center plane C under such situation, this would undesirably result in that the recording layer 23 of the spin device element 14 mixedly includes a portion to which a compressive stress is applied and a portion to which a tensile stress is applied. Accordingly, a plane-symmetric arrangement of the spin device element 14 with respect to the center plane C undesirably deteriorates the effect of generating a strain through applying a stress to the recording layer 23, and this arrangement is undesirable in view of the operation principle of the magnetic memory 1 of the present embodiment.

In contrast, as illustrated in FIG. 9B, no reversal of the sign of the stress occurs in the Y-axis direction between the free ends 30c and 30d, and in an ideal state, the stress is substantially zero near the center plane C. Although the stress does not become zero in an actual implementation, a reversal of the sign of the stress does not occur between the free ends 30c and 30d at least. Accordingly, if the spin device element 14 is arranged to cover the deformable portion 30 entirely between the free ends 30c and 30d, this does not cause the problem of the reversal of the sign of the stress; rather, such arrangement effectively enhances the magnetostrictive effect.

On the basis of the considerations described above, in the magnetic memory 1 of the present embodiment illustrated in FIG. 1B, the spin device element 14 is arranged so that the center plane D of the spin device element 14 is displaced in the +X or −X direction with respect to the center plane C between the fixed ends 30a and 30b, where the center plane D of the spin device element 14 is defined as a plane perpendicular to the X-axis direction and equally distant from the end 14a facing the −X direction of the spin device element 14 and the end 14b facing the +X direction. This allows applying a stress to the recording layer 23 so that only either a compressive or tensile stress is dominant over the recording layer 23.

In the magnetic memory 1 illustrated in FIGS. 1A and 1B, the spin device element 14 is arranged to meet the above-described requirements. In detail, as illustrated in FIG. 1B, the end 14a facing the −X direction of the spin device element 14 is displaced in the −X direction with respect to the center plane C between the fixed ends 30a and 30b, while the end 14b facing the +X direction of the spin device element 14 is displaced in the +X direction with respect to the center plane C. The distance of the end 14a of the spin device element 14 from the center plane C is closer than that of the end 14b from the center plane C. As a result, the center plane D of the spin device element 14 is displaced in the +X direction with respect to the center plane C between the fixed ends 30a and 30b.

Although the spin device element 14 is structured so that the positions of the reference layer 21 and the recording layer 23 are aligned in the X-axis direction in the present embodiment, a structure in which this is not the case (for example, the reference layer 21 is larger than the recording layer 23) may be used. In this case, the above discussion still applies to the center plane of the recording layer 23 (the plane perpendicular to the X-axis direction and equally distant from the ends respectively facing the −X and +X directions of the recording layer 23) in place of the center plane D of the spin device element. It is preferable that the spin device element 14 is arranged so that the center plane of the recording layer 23 is displaced in the +X or −X direction with respect to the center plane C between the fixed ends 30a and 30b.

Figure 9C:
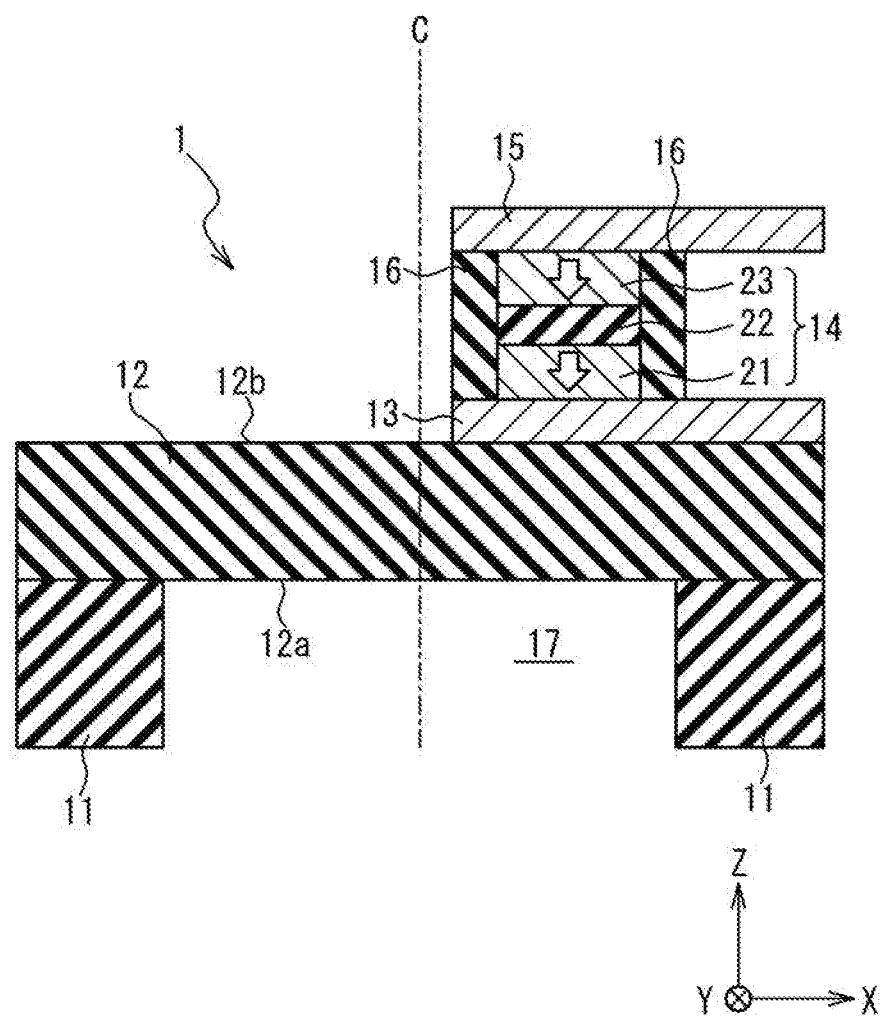
FIG. 9C is a cross-sectional view illustrating a preferred arrangement of a spin device element in the magnetic memory in the present embodiment.
Figure 9D:
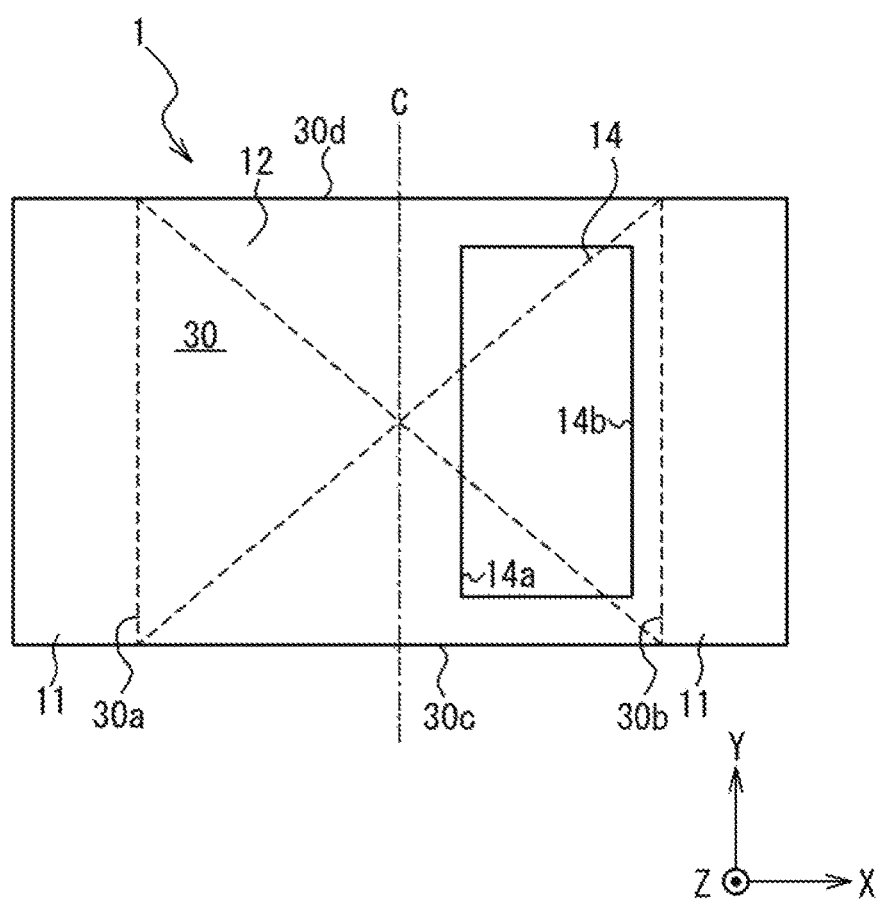
FIG. 9D is a plan view illustrating the preferred arrangement of the spin device element in the magnetic memory in the present embodiment.

To further increase the strain generated in the recording layer 23, it is preferable that the whole of the spin device element 14 (or the whole of the recording layer 23) is displaced in the −X or +X direction from the center plane C. Such arrangement allows generating a stress in the recording layer 23 so that only either a compressive or tensile stress is dominant, and effectively achieves a large magnetostrictive effect. In this case, the area of the spin device element 14 is smaller than a half of that of the deformable portion 30 in the in-plane layout. FIGS. 9C and 9D illustrate one example of the structure of the magnetic memory 1 in the case when the spin device element 14 is arranged in the above-described arrangement. In the structure illustrated in FIGS. 9C and 9D, the end 14a facing the −X direction of the spin device element 14 (that is, the end facing the −X direction of the recording layer 23) is displaced in the +X direction from the center plane C between the fixed ends 30a and 30b (especially refer to FIG. 9D).

As is understood from the above description, the deformable base plate 12 is bent in data writing with a certain bending mechanism in the magnetic memory 1 of the present embodiment. Discussed in the following are specific mechanisms used to bend the deformable base plate 12.

It is preferable that a voltage-driven mechanism, that is, a mechanism which is driven with a drive voltage without generating a current therethrough (other than a leakage current and a charging current which is temporarily generated) is used to bend the deformable base plate 12. The use of a voltage-driven mechanism as the mechanism that bends the deformable base plate 12 is useful for reducing the data write power (the power consumed in a write operation).

Figure 10:
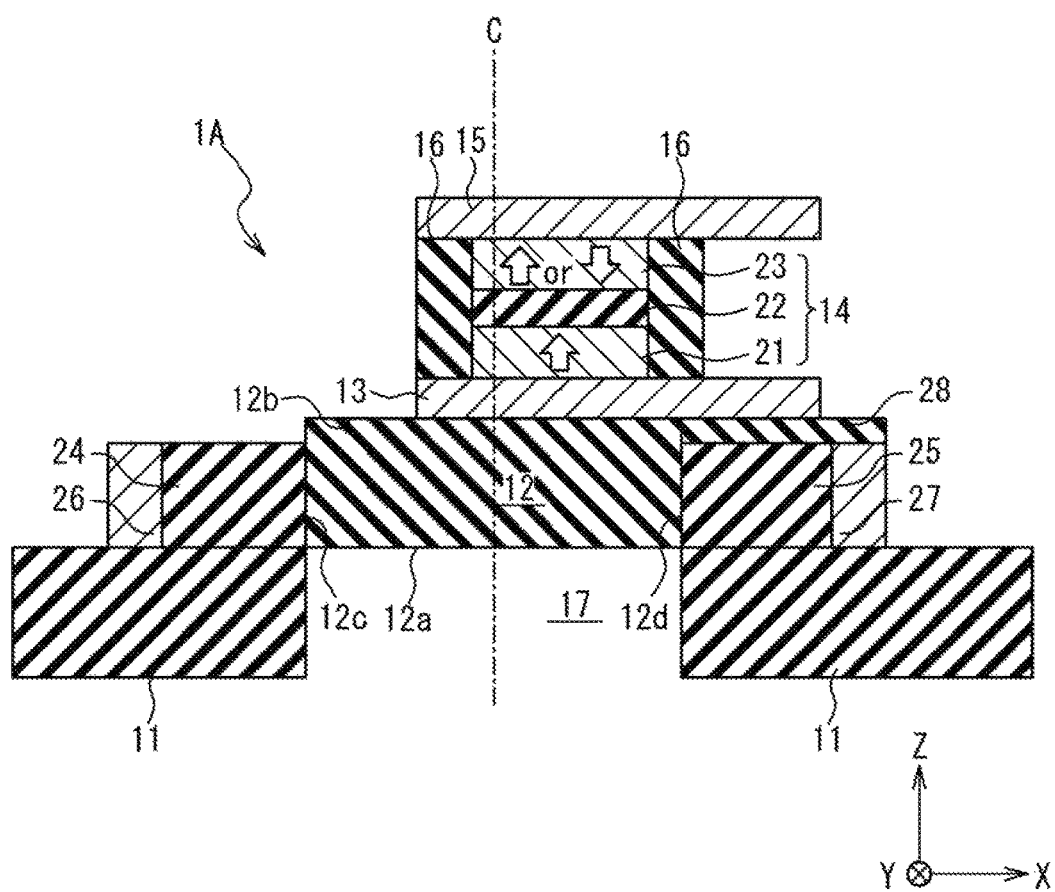
FIG. 10 is a cross-sectional view conceptually illustrating one example of the structure of a magnetic memory including a mechanism which uses a piezoelectric effect to bend a deformable base plate in the present embodiment.

In one preferred embodiment, a deformable base plate is bent with a mechanism which uses a piezoelectric effect. FIG. 10 is a cross-sectional view conceptually illustrating one example of the structure of a magnetic memory incorporating a mechanism which uses a piezoelectric effect to bend a deformable base plate.

The magnetic memory illustrated in FIG. 10, which is denoted by numeral 1A, includes a deformable base plate 12. The deformable base plate 12 faces a space 17 which is not filled with solid substance, on the lower surface. A lower electrode 13 is formed on the upper surface of the deformable base plate 12 and a spin device element 14 is formed on the upper surface of the lower electrode 13. The structure of the spin device element 14 is as described above with reference to FIG. 1A; the spin device element 14 includes a reference layer 21, a spacer layer 22 and a recording layer 23, which are stacked in series to form a stack structure. An upper electrode 15 is formed on the upper surface of the recording layer 23 of the spin device element 14. A dielectric layer 16 is formed on the side of the spin device element 14 to protect the spin device element 14. The dielectric layer 16 covers the side of the stack structure in which the reference layer 21, the spacer layer 22 and the recording layer 23 are stacked.

Although not illustrated in FIG. 10 for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

Also, although not illustrated in FIG. 10, a capping layer may be inserted between the recording layer 23 and the upper electrode 15 (or between the reference layer 21 and the upper electrode 15 when the reference layer 21 is positioned above the recording layer 23.)

Additionally, piezoelectric layers 24 and 25 are coupled with the side surfaces 12c and 12d of the deformable base plate 12, respectively. Although FIG. 10 illustrates such a structure that the piezoelectric layers 24 and 25 are directly coupled with the side surfaces 12c and 12d of the deformable base plate 12, the piezoelectric layers 24 and 25 may be coupled with the side surfaces 12c and 12d of the deformable base plate 12 via any kind of layer. The piezoelectric layers 24 and 25 are formed of piezoelectric material, such as aluminum nitride (AlN), lead zirconate titanate (PZT), and zirconium oxide. The piezoelectric layers 24 and 25 are fixedly coupled with the upper surface of a fixture base 11. In an exemplary embodiment, the thicknesses of the piezoelectric layers 24 and 25 preferably range from 100 nm to 5 μm.

An electrode layer 26 is coupled with the piezoelectric layer 24 on the surface of the piezoelectric layer 24 opposite to the surface coupled with the side surface 12c of the deformable base plate 12. An additional electrode layer (not illustrated) may be coupled with the piezoelectric layer 24, on which a potential difference is generated with respect to the electrode layer 26. Additionally, an electrode layer 27 is coupled with the piezoelectric layer 25 on the surface of the piezoelectric layer 25 opposite to the surface coupled with the side surface 12d of the deformable base plate 12. An additional electrode layer (not illustrated) may be coupled with the piezoelectric layer 25, on which a potential difference is generated with respect to the electrode layer 27. The deformable base plate 12 is disposed between the piezoelectric layers 24 and 25. The piezoelectric layer 24, the deformable base plate 12 and the piezoelectric layer 25 are arrayed in this order between the electrode layers 26 and 27; in other words, the electrode layers 26 and 27 are opposed to each other across the piezoelectric layer 24, the deformable base plate 12 and the piezoelectric layer 25. A dielectric layer 28 is formed on the upper surfaces of the piezoelectric layer 25 and the electrode layer 27, and the lower electrode 13 is electrically isolated from the electrode layer 27 by the dielectric layer 28. Although the additional electrode layers on which potential differences are to be generated with respect to the electrode layers 26 and 27 are not illustrated, the lower electrode 13, which is coupled with the spin device element 14, may be also used as any of the additional electrode layers.

In the magnetic memory 1A thus structured, the deformable base plate 12 can be bent by applying electric fields to the piezoelectric layers 24 and 25 with electrode layers coupled with the piezoelectric layers 24 and 25 (the electrode layers 26 and 27 and/or the additional electrode layers (not illustrated)). More specifically, when electric fields are applied to the piezoelectric layers 24 and 25, strains are generated in the piezoelectric layers 24 and 25 due to the piezoelectric effect. A force is applied to the deformable base plate 12 due to the strains of the piezoelectric layers 24 and 25, and thereby the deformable base plate 12 is bent.

It should be noted here that, in the structure of the magnetic memory 1A illustrated in FIG. 10, a part of the lower surface of the deformable base plate 12 faces the space 17 which is not filled with solid substance. The structure in which the surface of the deformable base plate 12 opposed to the surface on which the spin device element 14 is formed faces the space 17 which is not filled with solid substance effectively enlarges the displacement (that is, the amount of bending) of the deformable base plate 12.

It should be also noted that substantially no current is generated (other than a leakage current and a temporary charging current) to bend the deformable base plate 12 in the structure of the magnetic memory 1A illustrated in FIG. 10. The structure illustrated in FIG. 10 eliminates the need for generating a current to bend the deformable base plate 12, since the deformable base plate 12 is bent with a piezoelectric effect. This effectively reduces the data write power (that is, the power consumed in a write operation).

Figure 11:
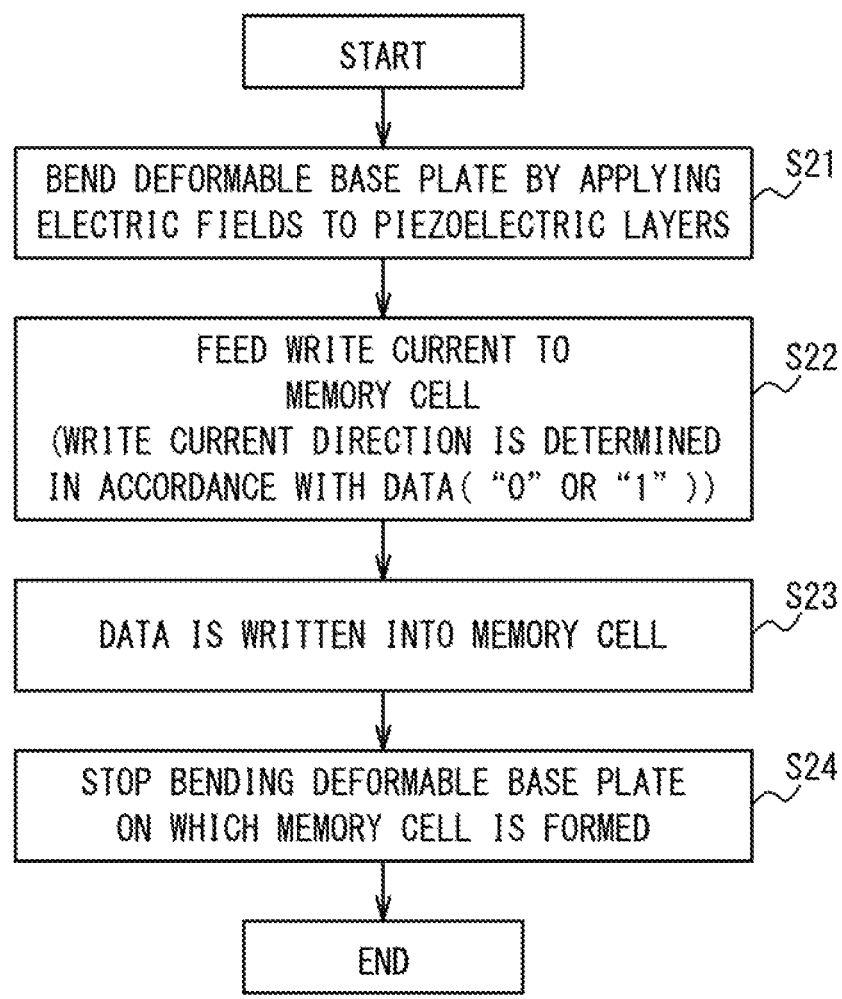
FIG. 11 is a flowchart illustrating a method of data writing into the magnetic memory illustrated in FIG. 10.

FIG. 11 is a flowchart illustrating an exemplary procedure of data writing into the spin device element 14 (memory cell) of the magnetic memory 1 illustrated in FIG. 10. In writing a data into the spin device element 14, electric fields are applied to the piezoelectric layers 24 and 25 to bend the deformable base plate 12 (at step S21). When the deformable base plate 12 is bent, a strain is applied to the spin device element 14 and the recording layer 23 is thereby placed into the above-described "half-select" state due to the magnetostrictive effect.

Furthermore, a write current is generated which flows through the spin device element 14 (memory cell) (at step S22). The write current is generated to pass through the reference layer 21 and the recording layer 23, which are both magnetic layers, and thereby a spin transfer torque is applied to the magnetization of the recording layer 23. The direction of the write current is selected in accordance with the direction into which the magnetization of the recording layer 23 is to be directed, that is, data to be written into the spin device element 14.

A desired data is written into the spin device element 14 (memory cell) by causing the write current to pass through the spin device element 14 with the deformable base plate 12 bent (at step S23).

This is followed by stopping bending the deformable base plate 12 (at step S24). This completes the data writing. The conflict between the data stability and the data write power is effectively relieved by generating a write current through the spin device element 14 with the deformable base plate 12 bent, where the spin device element 14 is formed on the deformable base plate 12.

It should be noted that a current-induced magnetic field may be used to write a data into the spin device element 14 (memory cell) in place of the write current generated through the spin device element 14. In this case, as illustrated in FIGS. 6A, 6B, 7A and 7B, for example, a write current line is disposed in the vicinity of the spin device element 14 and a current-induced magnetic field for data writing is generated by applying a write current through the write current line.

Although the flowchart of FIG. 11 illustrates the procedure in which the operation of bending the deformable base plate 12 (at step S21) is started before the operation of generating the write current through the spin device element 14 for writing a desired data (at step S22), the order of these two operations may be reversed. It should be noted, however, that such procedure undesirably lengthens the time duration during which the write current is generated, compared with the procedure illustrated in FIG. 11. Accordingly, the procedure illustrated in FIG. 11, in which the operation of bending the deformable base plate 12 (this operation requires only a reduced power) is first performed and a write signal is then fed to the spin device element 14, is rather preferred.

Figure 12:
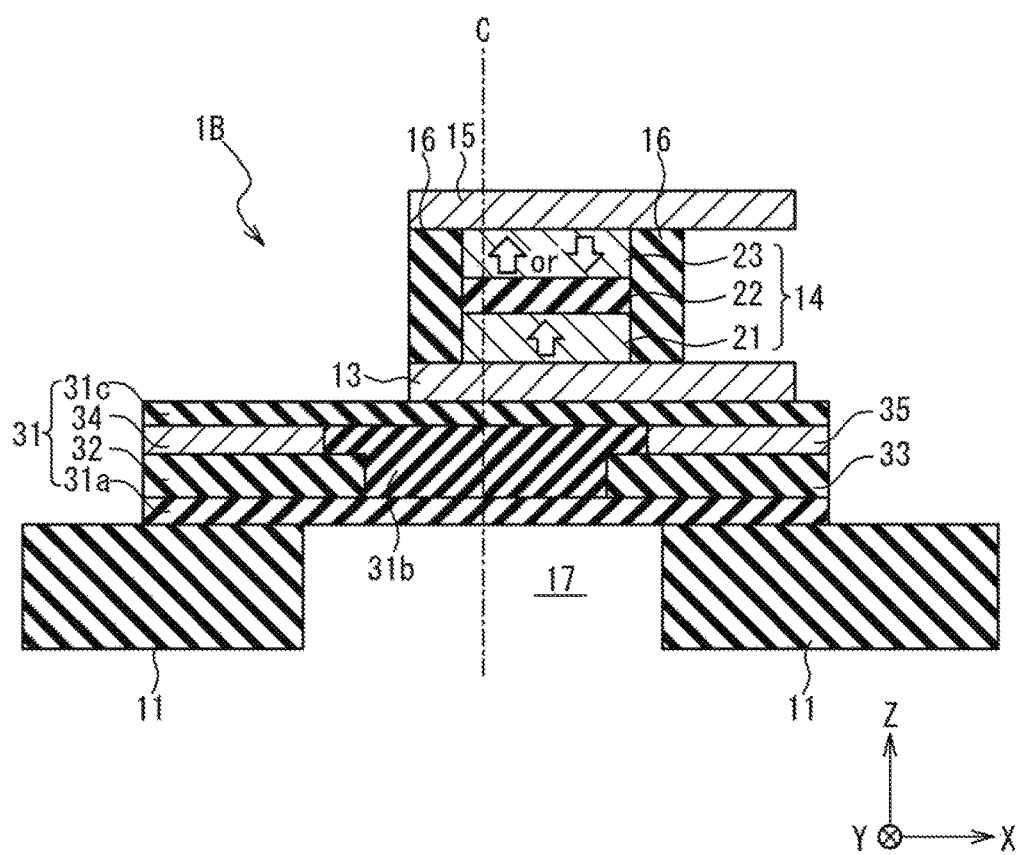
FIG. 12 is a cross-sectional view conceptually illustrating another example of the structure of a magnetic memory including a mechanism which uses a piezoelectric effect to bend a deformable base plate in the present embodiment.

FIG. 12 is a cross-sectional view conceptually illustrating another example of the configuration of a magnetic memory 1B incorporating a mechanism which uses a piezoelectric effect to bend a deformable base plate. The magnetic memory 1B includes a fixture base 11, and a deformable base plate 31 is coupled with the upper surface of the fixture base 11. The deformable base plate 31 faces a space 17 which is not filled with solid substance, on the lower surface thereof. A lower electrode 13 is formed on the upper surface of the deformable base plate 31, and a spin device element 14 is formed on the upper surface of the lower electrode 13. The structure of the spin device element 14 is as described above with reference to FIG. 1A; the spin device element 14 includes a reference layer 21, a spacer layer 22 and a recording layer 23, which are stacked in series to form a stack structure. Although not illustrated in FIG. 12 for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

The deformable base plate 31 includes a dielectric layer 31a, a core layer 31b, piezoelectric layers 32, 33, electrode layers 34, 35 and a dielectric layer 31c. The dielectric layer 31a is formed on the upper surface of the fixture base 11. The piezoelectric layers 32, 33 and the core layer 31b are formed on the upper surface of the dielectric layer 31a, and the electrode layers 34 and 35 are formed on the upper surfaces of the piezoelectric layers 32 and 33, respectively. An additional electrode layer (not illustrated) on which a potential difference is generated with respect to the electrode layer 34 may be further coupled with the piezoelectric layer 32. Similarly, an additional electrode layer (not illustrated) on which a potential difference is generated with respect to the electrode layer 35 may be further coupled with the piezoelectric layer 33. The lower electrode 13 coupled with the spin device element 14 may be also used as any of the additional electrode layers (not illustrated) coupled with the piezoelectric layers 32 and 33, on which potential differences are generated with respect to the electrode layers 34 and 35. The core layer 31b may be formed of silicon, silicon oxide, silicon nitride, silicon oxynitride or the like. The dielectric layer 31c is formed to cover the upper surfaces of the core layer 31b and the electrode layers 34 and 35. The stack of the piezoelectric layer 32 and the electrode layer 34 and the stack of the piezoelectric layer 33 and the electrode layer 35 are arranged opposed to each other across the core layer 31b.

An upper electrode 15 is formed on the upper surface of the recording layer 23 of the spin device element 14. Although not illustrated in FIG. 12, a capping layer may be inserted between the recording layer 23 and the upper electrode 15 (or between the reference layer 21 and the upper electrode 15 when the reference layer 21 is positioned above the recording layer 23.) A dielectric layer 16 is formed on the side of the spin device element 14 to protect the spin device element 14. The dielectric layer 16 covers the side of the stack structure in which the reference layer 21, the spacer layer 22 and the recording layer 23 are laminated.

In the magnetic memory 1B thus structured, the deformable base plate 31 can be bent by applying electric fields to the piezoelectric layers 32 and 33 with electrode layers coupled with the piezoelectric layers 32 and 33 (the electrode layers 34 and 35 and/or the additional electrode layers (not illustrated)). More specifically, when electric fields are applied to the piezoelectric layers 32 and 33, strains are generated in the piezoelectric layers 32 and 33 due to the piezoelectric effect. A force is applied to the deformable base plate 31 due to the strains of the piezoelectric layers 32 and 33, and thereby the deformable base plate 31 is bent.

It should be noted here that, in the structure of the magnetic memory 1B illustrated in FIG. 12, a part of the lower surface of the deformable base plate 31 faces the space 17 which is not filled with solid substance. The structure in which the surface of the deformable base plate 31 opposed to the surface on which the spin device element 14 is formed faces the space 17 which is not filled with solid substance effectively enlarges the displacement (that is, the amount of bending) of the deformable base plate 31.

It should be noted that, also in the structure illustrated in FIG. 12, substantially no current is generated (other than a leakage current and a temporary charging current) in bending the deformable base plate 31. The structure illustrated in FIG. 12 eliminates the need for generating a current to bend the deformable base plate 31, since the deformable base plate 31 is bent with a piezoelectric effect. This effectively reduces the data write power (that is, the power consumed in a write operation).

Data writing into the magnetic memory 1B illustrated in FIG. 12 may be achieved through a similar procedure to that into the magnetic memory 1A illustrated in FIG. 10, except for that electric fields are applied to the piezoelectric layers 32 and 33 in place of the piezoelectric layers 24 and 25.

Figure 13:
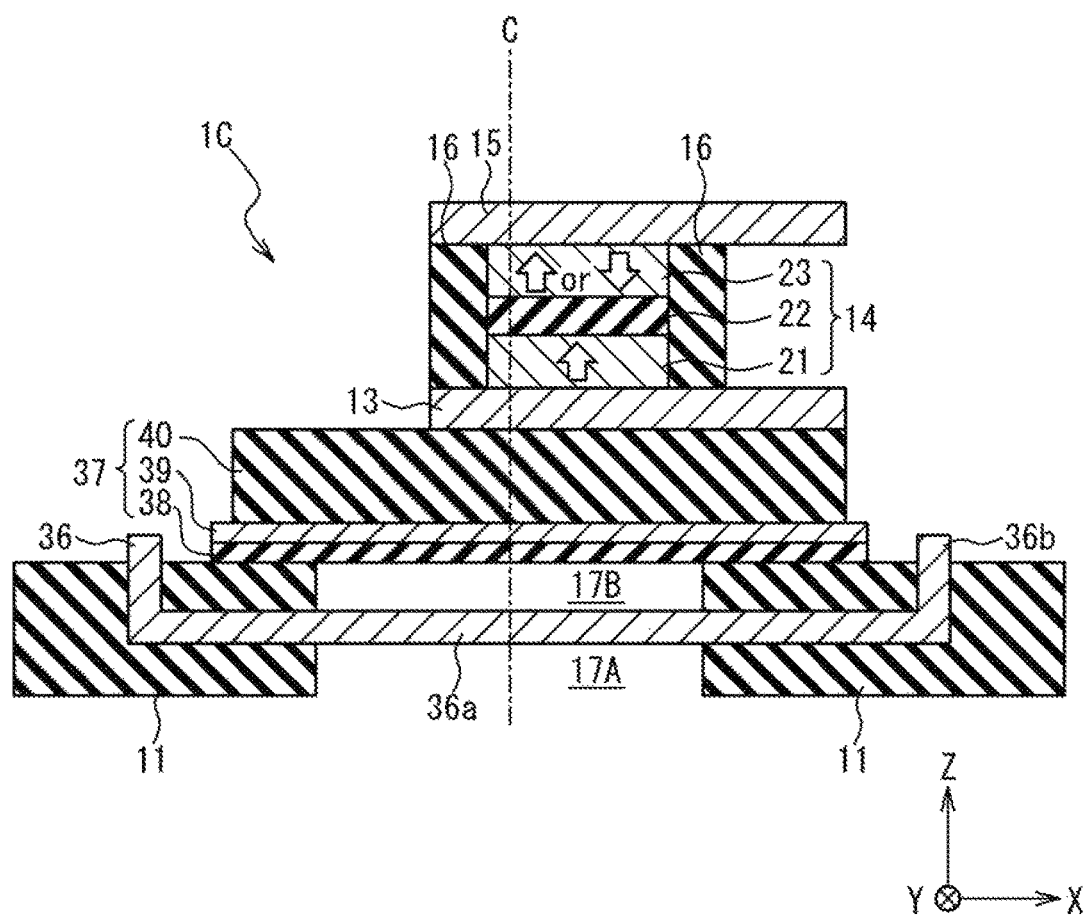
FIG. 13 is a cross-sectional view conceptually illustrating one example of the structure of a magnetic memory including a mechanism which uses a force exerted between capacitor electrodes to bend a deformable base plate in the present embodiment.

In another preferred embodiment, a deformable base plate may be bent with a force exerted between a pair of capacitor electrodes. FIG. 13 is a cross-sectional view conceptually illustrating one example of the structure of a magnetic memory 1C which includes a mechanism bending a deformable base plate with a force exerted between a pair of capacitor electrodes.

The magnetic memory 1C includes a fixture base 11 and a capacitor electrode 36 is partially embedded in the fixture base 11. The capacitor electrode 36 includes a flat plate section 36a and contact sections 36b. The lower surface of the flat plate section 36a faces a space 17A which is not filled with solid substance.

A deformable base plate 37 is coupled with the upper surface of the fixture base 11. The deformable base plate 37 is opposed to the capacitor electrode 36 across a space 17B which is not filled with solid substance. This implies that the lower surface of the deformable base plate 37 faces the space 17B which is not filled with solid substance.

The deformable base plate 37 includes a dielectric layer 38, a capacitor electrode layer 39 and a main body 40. The dielectric layer 38 is coupled with the upper surface of the fixture base 11, and the capacitor electrode layer 39 is coupled with the upper surface of the dielectric layer 38. The main body 40 coupled with the upper surface of the capacitor electrode layer 39. The capacitor electrode layer 39 is opposed to the flat plate section 36a of the capacitor electrode 36 across the dielectric layer 38 and the space 17B which is not filled with solid substance. A capacitor is formed with the capacitor electrode layer 39 and the capacitor electrode 36.

A lower electrode 13 is formed on the upper surface of the deformable base plate 37 (the upper surface of the main body 40) and a spin device element 14 is formed on the upper surface of the lower electrode 13. The structure of the spin device element 14 is as described above with reference to FIG. 1A; the spin device element 14 includes a reference layer 21, a spacer layer 22 and a recording layer 23, which are stacked in series to form a stack structure.

An upper electrode 15 is formed on the upper surface of the recording layer 23 of the spin device element 14. A dielectric layer 16 is formed on the side of the spin device element 14 to protect the spin device element 14. The dielectric layer 16 covers the side of the stack structure in which the reference layer 21, the spacer layer 22 and the recording layer 23 are stacked.

Although not illustrated in FIG. 13 for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

Also, although not illustrated in FIG. 13, a capping layer may be inserted between the recording layer 23 and the upper electrode 15 (or between the reference layer 21 and the upper electrode 15 when the reference layer 21 is positioned above the recording layer 23.)

In the magnetic memory 1C thus structured, the deformable base plate 37 can be bent by applying a voltage between the capacitor electrode 36 and the capacitor electrode layer 39. In detail, when a voltage is applied between the capacitor electrode 36 and the capacitor electrode layer 39, an electric field is generated between the capacitor electrode 36 and the capacitor electrode layer 39, and this electric field works on charges generated on the surface of the capacitor electrode layer 39 to generate an attracting force which pulls the capacitor electrode layer 39 towards the capacitor electrode 36, that is, an attracting force which pulls the deformable base plate 37 towards the capacitor electrode 36. Since the lower surface of the deformable base plate 37 is only partially coupled with the fixture base 11 and faces the space 17B which is not filled with solid substance, the deformable base plate 37 is bent by the force attracting the deformable base plate 37 towards the capacitor electrode 36.

It should be noted here that, in the structure of the magnetic memory 1C illustrated in FIG. 13, a part of the lower surface of the deformable base plate 37 faces the space 17B which is not filled with solid substance. The structure in which the surface of the deformable base plate 37 opposed to the surface on which the spin device element 14 is formed faces the space 17B which is not filled with solid substance effectively enlarges the displacement of the deformable base plate 37.

It should be noted that substantially no current is generated (other than a leakage current and a temporary charging current) to bend the deformable base plate 37 also in the structure of the magnetic memory 1A illustrated in FIG. 13. The structure illustrated in FIG. 13 eliminates the need for generating a current to bend the deformable base plate 37, since the deformable base plate 37 is bent with a force exerted between capacitor electrodes. This effectively reduces the data write power (that is, the power consumed in a write operation).

Figure 14:
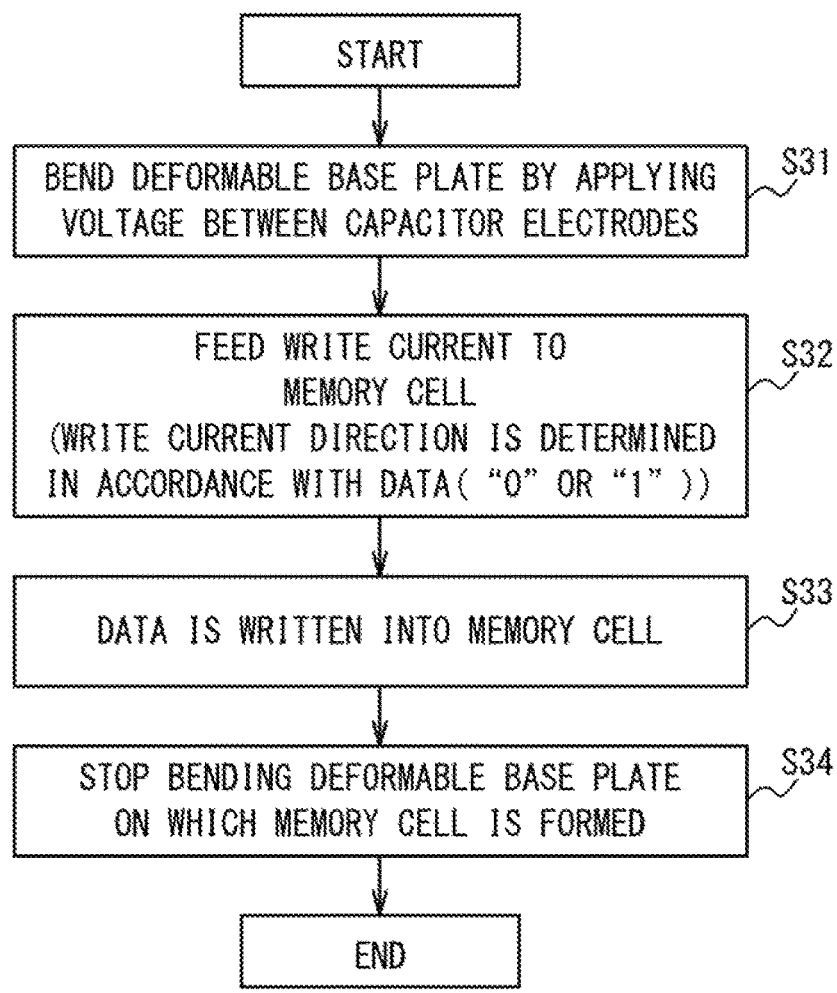
FIG. 14 is a flowchart illustrating a method of data writing into the magnetic memory illustrated in FIG. 13.

FIG. 14 is a flowchart illustrating an exemplary procedure of data writing into the spin device element 14 (memory cell) of the magnetic memory 1C illustrated in FIG. 13. In data writing into the spin device element 14, a voltage is applied between the capacitor electrode 36 and the capacitor electrode layer 39 to bend the deformable base plate 37 (at step S31). When the deformable base plate 37 is bent, a strain is applied to the spin device element 14 and the recording layer 23 is placed into the above-described "half-select" state due to the magnetostrictive effect.

Furthermore, a write current is generated which flows through the spin device element 14 (at step S32). The write current is generated to pass through the reference layer 21 and the recording layer 23, which are both magnetic layers, and thereby a spin transfer torque is applied to the magnetization of the recording layer 23. The direction of the write current is selected in accordance with the direction into which the magnetization of the recording layer 23 is to be directed, that is, the data to be written into the spin device element 14.

The desired data is written into the spin device element 14 by causing the write current to pass through the spin device element 14 with the deformable base plate 37 bent (at step S33).

This is followed by stopping bending the deformable base plate 37 (at step S34). This completes the data writing. The conflict between the data stability and the data write power is effectively relieved by generating a write current through the spin device element 14 with the deformable base plate 37 bent, where the spin device element 14 is formed on the deformable base plate 37.

It should be noted that a current-induced magnetic field is used to write a data into the spin device element 14 (memory cell) in place of generating the write current through the spin device element 14. In this case, as illustrated in FIGS. 6A, 6B, 7A and 7B, for example, a write current line is disposed in the vicinity of the spin device element 14 and a current-induced magnetic field for data writing is generated by applying a write current through the write current line.

Although the flowchart of FIG. 14 illustrates the procedure in which the operation of bending the deformable base plate 37 (at step S31) is started before the operation of generating the write current through the spin device element 14 for writing a desired data (at step S32), the order of these two operations may be reversed.

The spin device element of each memory cell may be connected with a transistor, depending on the configuration of the magnetic memory. When each memory cell includes a spin device element and a selection transistor, for example, the spin device element is connected with the selection transistor.

In the following, a description is given of an exemplary structure of a magnetic memory in which the spin device element in each memory cell is connected with a transistor.

Figure 15A:
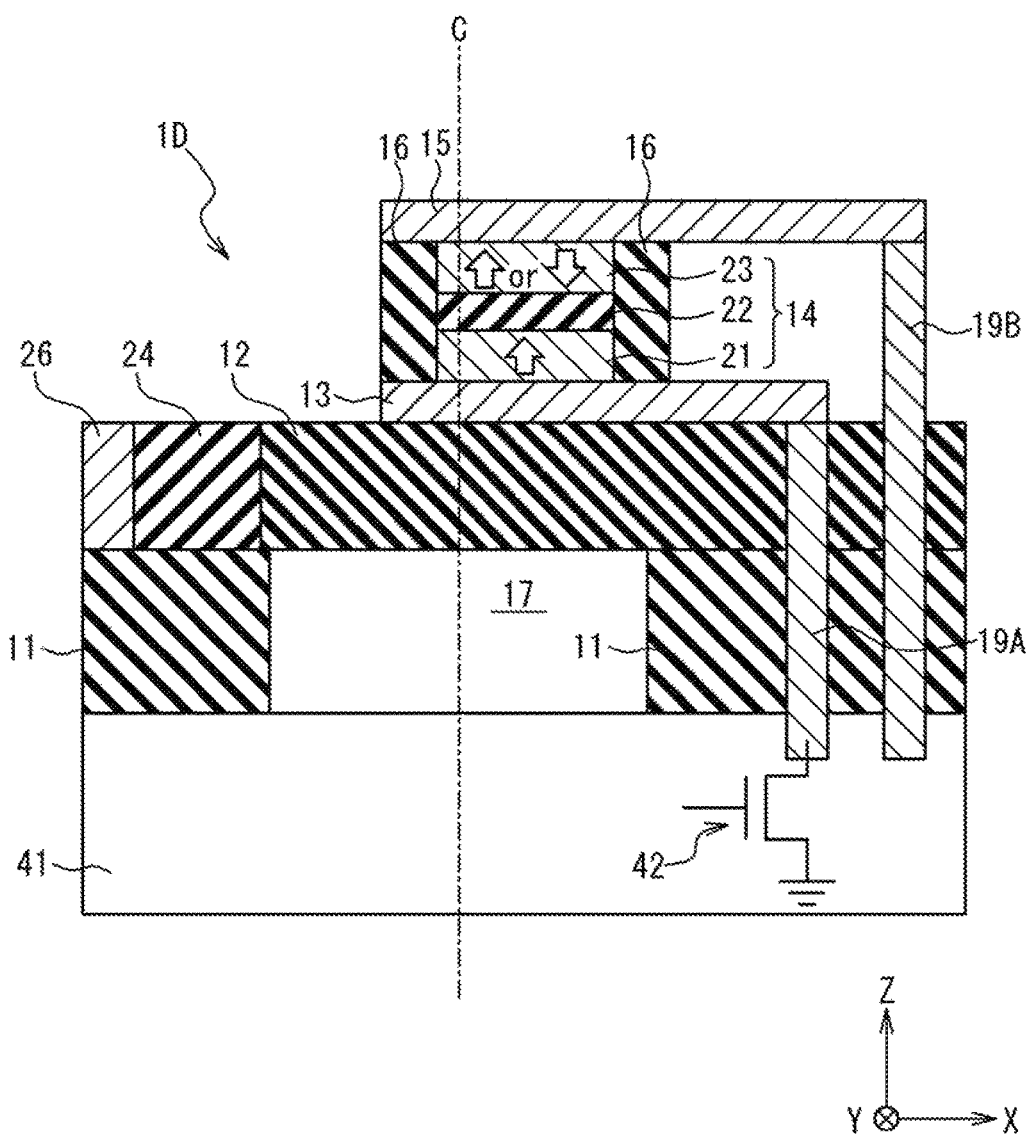
FIG. 15A is a cross-sectional view conceptually illustrating one example of the structure of a magnetic memory in which the spin device element of each memory cell is connected with a transistor.
Figure 15B:
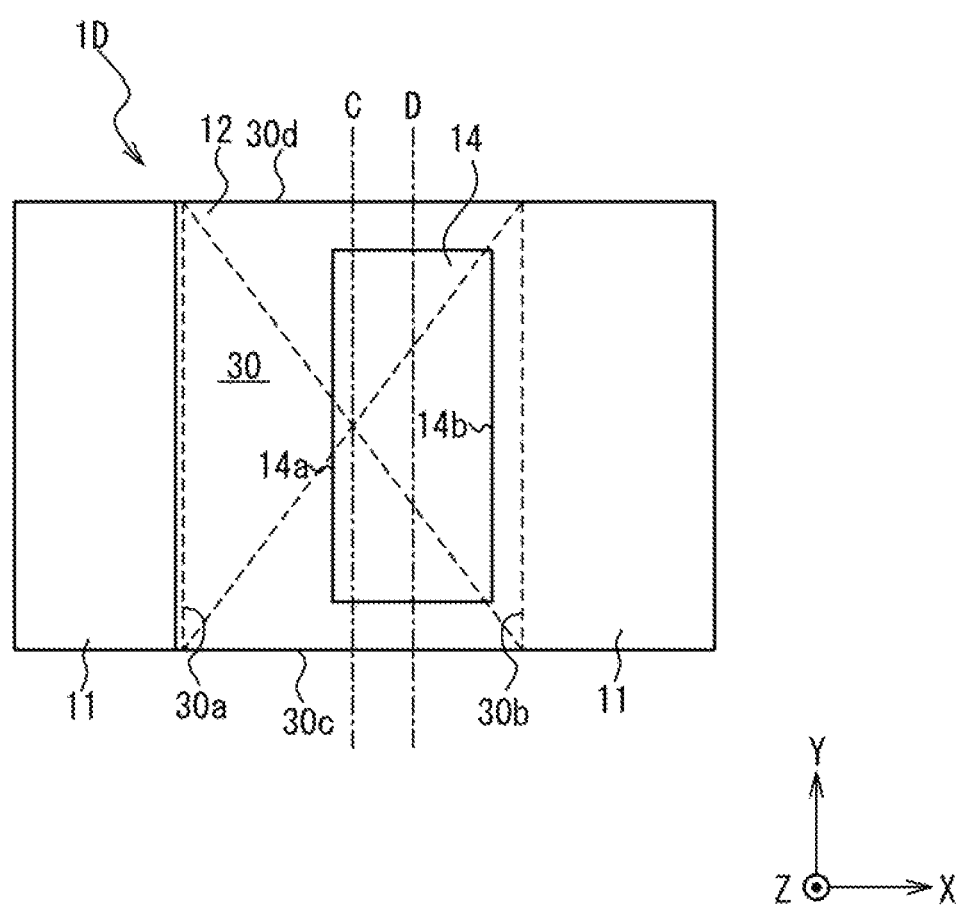
FIG. 15B is a plan view illustrating the structure of the magnetic memory of FIG. 15A.

FIG. 15A is a cross-sectional view conceptually illustrating one example of the structure of a magnetic memory in which the spin device element of each memory cell is connected with a transistor, and FIG. 15B is a plan view illustrating the structure of the magnetic memory of FIG. 15A. The magnetic memory illustrated in FIGS. 15A and 15B, which is denoted by numeral 1D, is configured to bend a deformable base plate with a piezoelectric effect similarly to the magnetic memory 1A illustrated in FIG. 10.

In detail, the magnetic memory 1D includes a semiconductor substrate 41 in which a transistor circuit is integrated. A transistor 42 integrated in the semiconductor substrate 41 is illustrated in FIG. 15A. The semiconductor substrate 41 may include metal interconnection layers and interlayer dielectric films which provide electrical isolation among the metal interconnection layers, although details are not illustrated in FIG. 15A.

A fixture base 11 is formed on the semiconductor substrate 41 and a deformable base plate 12 is coupled with the upper surface of the upper surface of the fixture base 11. A lower electrode 13 is formed on the upper surface of the deformable base plate 12 and a spin device element 14 is formed on the upper surface of the lower electrode 13. The structure of the spin device element 14 is as described above with reference to FIG. 1A; the spin device element 14 includes a reference layer 21, a spacer layer 22 and a recording layer 23, which are stacked in series to form a stack structure. Although not illustrated in FIG. 15A for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

Additionally, a piezoelectric layer 24 is coupled with the side surface of the deformable base plate 12. The piezoelectric layer 24 is formed of piezoelectric material, such as aluminum nitride (AlN), lead zirconate titanate (PZT), and zirconium oxide. The piezoelectric layer 24 is fixedly coupled with the upper surface of the fixture base 11. An electrode layer 26 is coupled with the piezoelectric layer 24 on the surface of the piezoelectric layer 24 opposite to the surface coupled with the side surface 12c of the deformable base plate 12. An additional electrode layer (not illustrated) may be coupled with the piezoelectric layer 24, on which a potential difference is generated with respect to the electrode layer 26. Although the additional electrode layer on which a potential difference is to be generated with respect to the electrode layer 26 is not illustrated, the lower electrode 13, which is coupled with the spin device element 14, may be also used as the additional electrode layer.

An upper electrode 15 is formed on the upper surface of the recording layer 23 of the spin device element 14. Although not illustrated in FIG. 15A, a capping layer may be inserted between the recording layer 23 and the upper electrode 15 (or between the reference layer 21 and the upper electrode 15 when the reference layer 21 is positioned above the recording layer 23.) A dielectric layer 16 is formed on the side of the spin device element 14 to protect the spin device element 14. The dielectric layer 16 covers the side of the stack structure in which the reference layer 21, the spacer layer 22 and the recording layer 23 are stacked. The lower electrode 13 is connected with the transistor 42, which is integrated in the semiconductor substrate 41, via a contact 19A, while the upper electrode 15 is connected with an interconnection and/or an element integrated in the semiconductor substrate 41 via a contact 19B.

In the magnetic memory 1D thus structured, the deformable base plate 12 can be bent by applying an electric field to the piezoelectric layer 24 with electrode layers coupled with the piezoelectric layer 24 (the electrode layer 26 and the additional electrode layer (not illustrated)). More specifically, when an electric field is applied to the piezoelectric layer 24, a strain is generated in the piezoelectric layer 24 due to the piezoelectric effect. A force is applied to the deformable base plate 12 due to the strain of the piezoelectric layer 24, and thereby the deformable base plate 12 is bent. As described above, the conflict between the data stability and data write power is effectively relieved by feeding to the spin device element 14 a write signal corresponding to a desired data (for example, a spin-polarized current or a current-induced magnetic field) in the state in which the deformable base plate 12 is bent.

It should be noted here that, in the structure of the magnetic memory illustrated in FIGS. 15A and 15B, a part of the lower surface of the deformable base plate 12 faces the space 17 which is not filled with solid substance. The structure in which the surface of the deformable base plate 12 opposed to the surface on which the spin device element 14 is formed faces the space 17 which is not filled with solid substance effectively enlarges the displacement of the deformable base plate 12.

It should be also noted that substantially no current is generated (other than a leakage current and a temporary charging current) to bend the deformable base plate 12 in the structure of the magnetic memory 1D illustrated in FIGS. 15A and 15B. The structure illustrated in FIGS. 15A and 15B eliminates the need for generating a current to bend the deformable base plate 12, since the deformable base plate 12 is bent with a piezoelectric effect. This effectively reduces the data write power (that is, the power consumed in a write operation).

Data writing into the magnetic memory 1D illustrated in FIGS. 15A and 15B may be achieved by a similar procedure to that into the magnetic memory 1A illustrated in FIG. 10, except for that an electric field is applied to the piezoelectric layer 24 in place of the piezoelectric layers 24 and 25.

Also in the structure of the magnetic memory 1D illustrated in FIGS. 15A and 15B, the strain $\in$ generated in the recording layer 23 of the spin device element 14 depends on the arrangement of the spin device element 14. On the basis of this consideration, also in the magnetic memory 1D illustrated in FIGS. 15A and 15B, the spin device element 14 is arranged so that the center plane D of the spin device element 14 is displaced in the +X or −X direction with respect to the center plane C between the fixed ends 30$a$ and 30$b$. This allows applying a stress to the recording layer 23 so that only either a compressive or tensile stress is dominant over the recording layer 23. In detail, in the magnetic memory 1D illustrated in FIGS. 15A and 15B, the end 14$a$ facing the −X direction of the spin device element 14 is displaced in the −X direction with respect to the center plane C between the fixed ends 30$a$ and 30$b$, while the end 14$b$ facing the +X direction of the spin device element 14 is displaced in the +X direction with respect to the center plane C. The distance of the end 14$a$ of the spin device element 14 from the center plane C is closer than that of the end 14$b$ from the center plane C. As a result, the center plane D of the spin device element 14 is displaced in the +X direction with respect to the center plane C between the fixed ends 30$a$ and 30$b$.

Figure 15C:
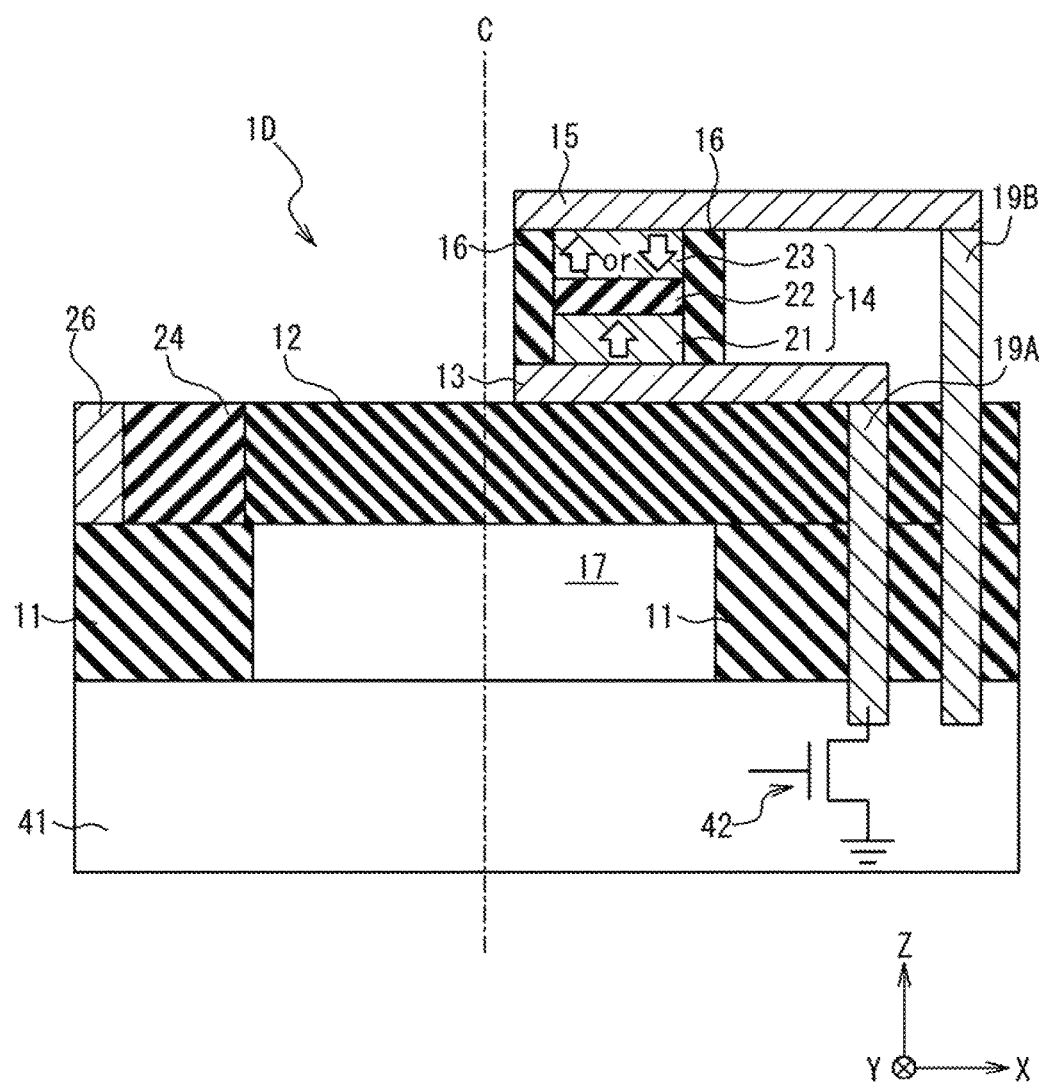
FIG. 15C is a cross-sectional view illustrating a preferred arrangement of the spin device element in the magnetic memory of the present embodiment.
Figure 15D:
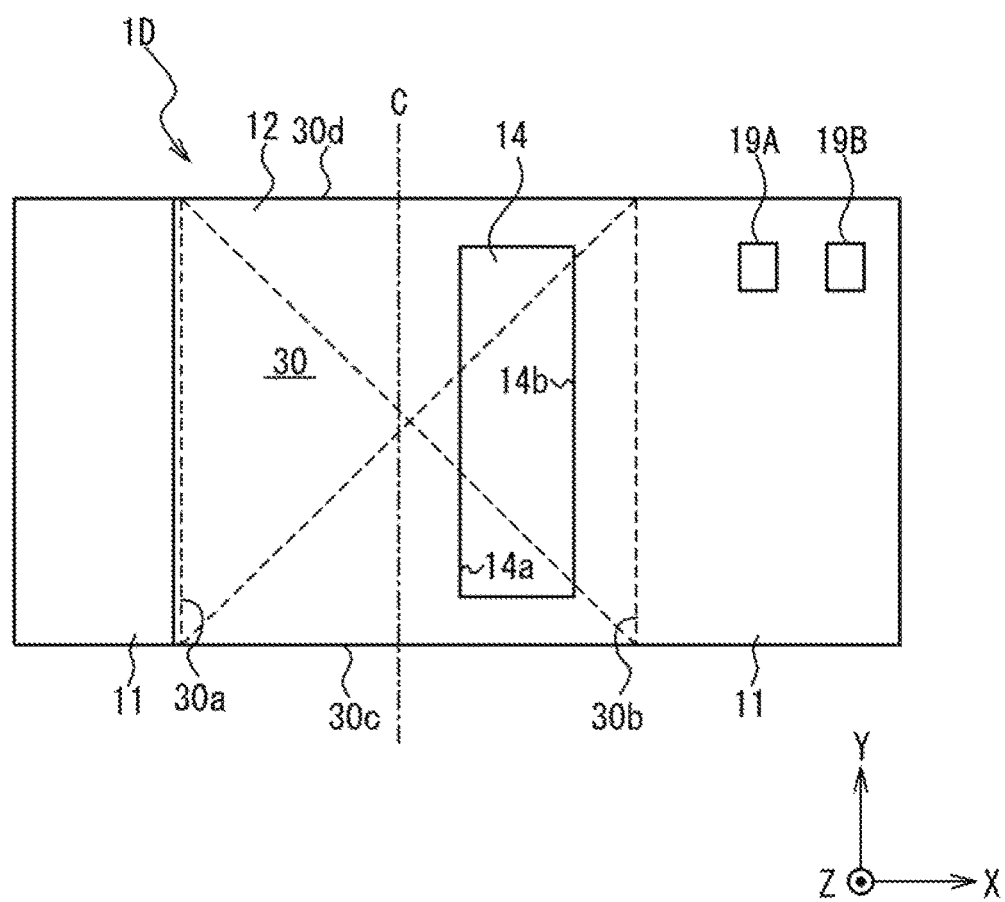
FIG. 15D is a plan view illustrating the preferred arrangement of the spin device element in the magnetic memory of the present embodiment.

To further increase the strain generated in the recording layer 23, it is preferable that the whole of the spin device element 14 (or the whole of the recording layer 23) is displaced in the −X or +X direction from the center plane C. FIGS. 15C and 15D illustrate one example of the structure of the magnetic memory 1D in the case when the spin device element 14 is arranged in the above-described arrangement. In the structure illustrated in FIGS. 15C and 15D, the end 14$a$ facing the −X direction of the spin device element 14 (that is, the end facing the −X direction of the recording layer 23) is displaced in the +X direction from the center plane C between the fixed ends 30$a$ and 30$b$ (especially refer to FIG. 15D).

Figure 16A:
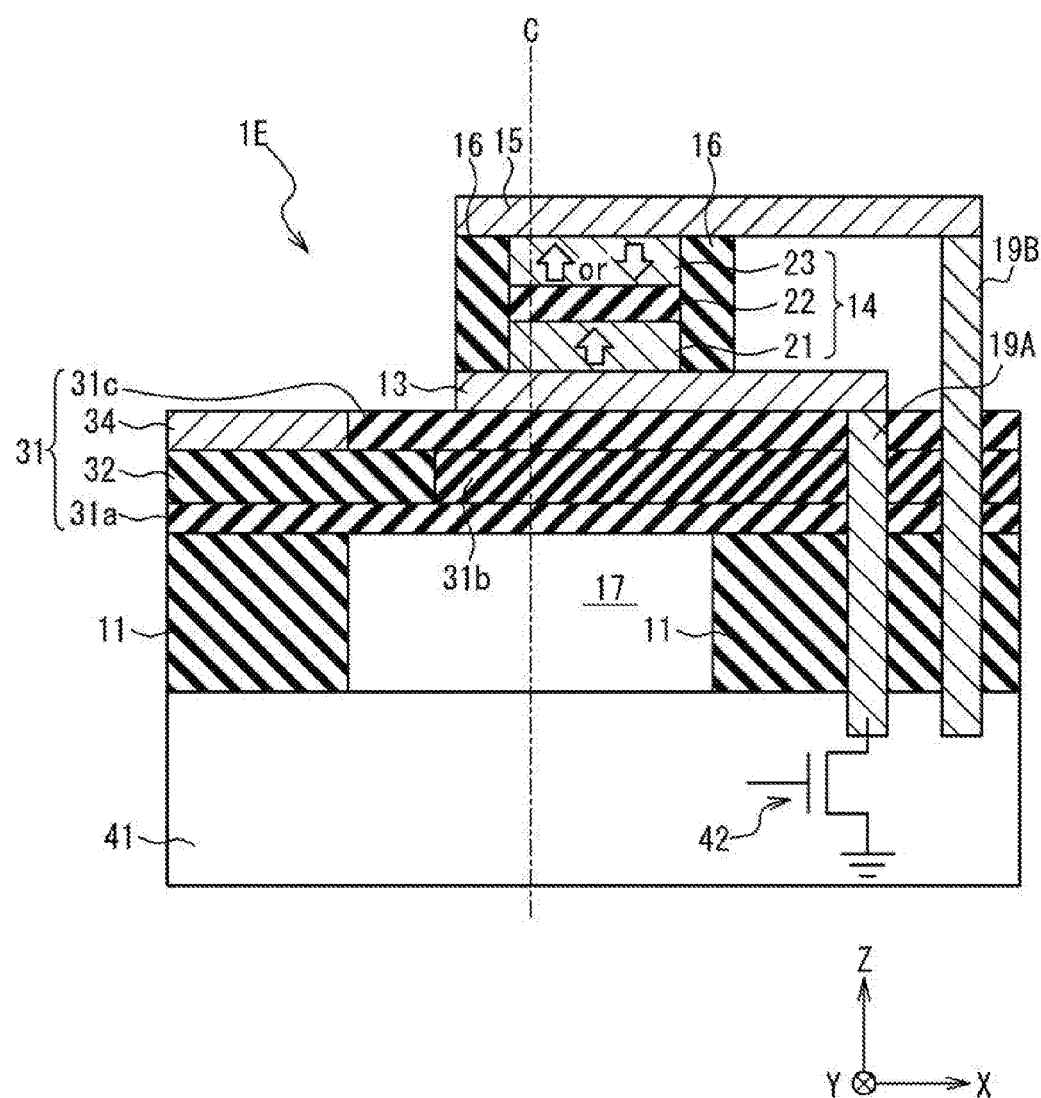
FIG. 16A is a cross-sectional view conceptually illustrating another example of the structure of a magnetic memory in which the spin device element of each memory cell is connected with a transistor.
Figure 16B:
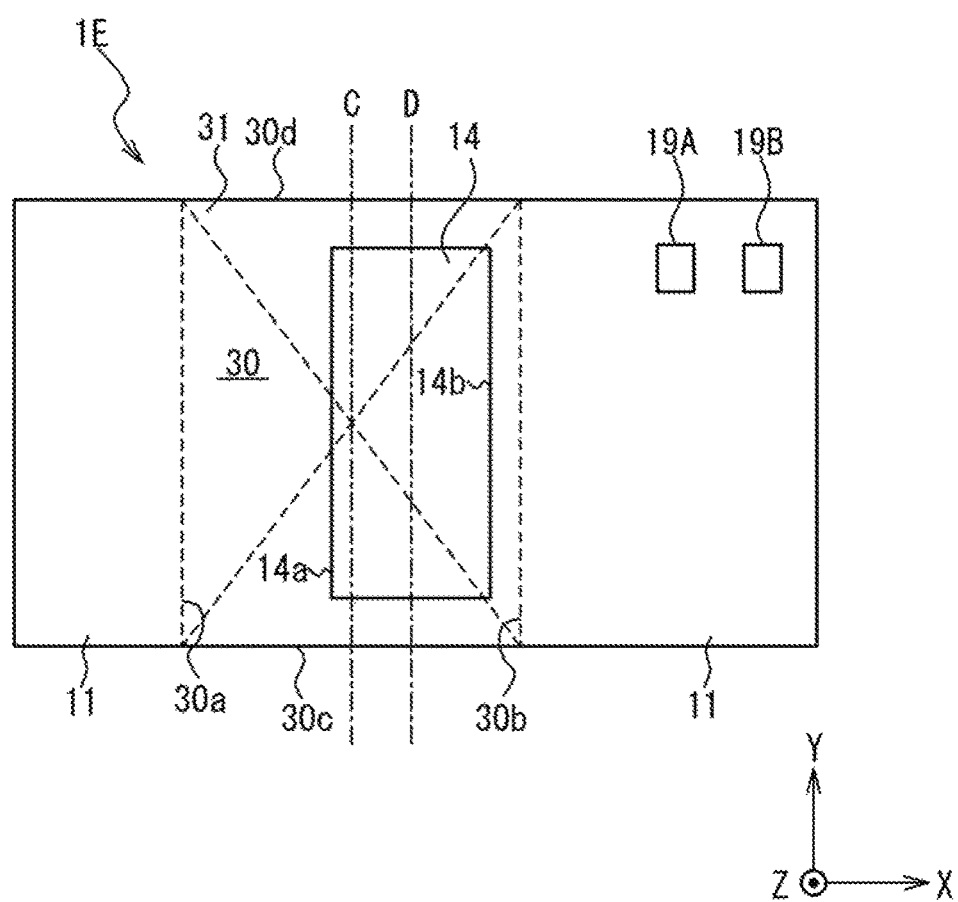
FIG. 16B is a plan view illustrating the structure of the magnetic memory of FIG. 16A.

FIG. 16A is a cross-sectional view conceptually illustrating another example of the structure of a magnetic memory in which the spin device element of each memory cell is connected with a transistor, and FIG. 16B is a plan view illustrating the structure of the magnetic memory of FIG. 16A. The magnetic memory illustrated in FIGS. 16A and 16B, which is denoted by numeral 1E, is configured to bend a deformable base plate with a piezoelectric effect similarly to the magnetic memory 1B illustrated in FIG. 12.

In detail, the magnetic memory 1E includes a semiconductor substrate 41 in which a transistor circuit is integrated. A transistor 42 integrated in the semiconductor substrate 41 is illustrated in FIG. 16A. The semiconductor substrate 41 may include metal interconnection layers and interlayer dielectric films which provide electrical isolation among the metal interconnection layers, although details are not illustrated in FIG. 16A. A fixture base 11 is formed on the semiconductor substrate 41 and a deformable base plate 31 is coupled with the upper surface of the upper surface of the fixture base 11. The lower surface of the deformable base plate 31 faces a space 17 which is not filled with solid substance. A lower electrode 13 is formed on the upper surface of the deformable base plate 31 and a spin device element 14 is formed on the upper surface of the lower electrode 13. The structure of the spin device element 14 is as described above with reference to FIG. 1A; the spin device element 14 includes a reference layer 21, a spacer layer 22 and a recording layer 23, which are stacked in series to form a stack structure. Although not illustrated in FIG. 16A for simplicity, an underlayer may be inserted between the lower electrode 13 and the reference layer 21 (or between the lower electrode 13 and the recording layer 23 when the recording layer 23 is positioned below the reference layer 21) to control the crystal orientations of the reference layer 21, the spacer layer 22 and the recording layer 23.

The deformable base plate 31 includes a dielectric layer 31$a$, a core layer 31$b$, a piezoelectric layer 32, an electrode layer 34 and a dielectric layer 31$c$. The dielectric layer 31$a$ is formed on the upper surface of the fixture base 11. The piezoelectric layer 32 and the core layer 31$b$ are formed on the upper surface of the dielectric layer 31$a$, and the electrode layer 34 is formed on the upper surface of the piezoelectric layer 32. An additional electrode layer (not illustrated) on which a potential difference is generated with respect to the electrode layer 34 may be further coupled with the piezoelectric layer 32. The lower electrode 13 coupled with the spin device element 14 may be also used as the additional electrode layer (not illustrated) coupled with the piezoelectric layer 32, on which potential differences are generated with respect to the electrode layer 34. The core layer 31$b$ may be formed of silicon, silicon oxide, silicon nitride, silicon oxynitride or the like. The dielectric layer 31$c$ is formed to cover the upper surfaces of the core layer 31$b$ and the piezoelectric layer 32.

An upper electrode 15 is formed on the upper surface of the recording layer 23 of the spin device element 14. Although not illustrated in FIG. 16A, a capping layer may be inserted between the recording layer 23 and the upper electrode 15 (or between the reference layer 21 and the upper electrode 15 when the reference layer 21 is positioned above the recording layer 23.) A dielectric layer 16 is formed on the side of the spin device element 14 to protect the spin device element 14. The dielectric layer 16 covers the side of the stack structure in which the reference layer 21, the spacer layer 22 and the recording layer 23 are stacked. The lower electrode 13 is connected with the transistor 42, which is integrated in the semiconductor substrate 41, via a contact 19A, while the upper electrode 15 is connected with an interconnection and/or an element integrated in the semiconductor substrate 41 via a contact 19B.

In the magnetic memory 1E thus structured, the deformable base plate 31 can be bent by applying an electric field to the piezoelectric layer 32 with electrode layers coupled with the piezoelectric layer 32 (the electrode layer 34 and the additional electrode layer (not illustrated)). More specifically, when an electric field is applied to the piezoelectric layer 32, a strain is generated in the piezoelectric layer 32 due to the piezoelectric effect. A force is applied to the deformable base plate 31 due to the strain of the piezoelectric layer 32, and thereby the deformable base plate 31 is bent.

It should be noted that substantially no current is generated (other than a leakage current and a temporary charging current) to bend the deformable base plate 31 also in the structure illustrated in FIGS. 16A and 16B. The structure illustrated in FIGS. 16A and 16B eliminates the need for generating a current to bend the deformable base plate 31, since the deformable base plate 31 is bent with a piezoelectric effect. This effectively reduces the data write power (that is, the power consumed in a write operation).

Data writing into the magnetic memory 1E illustrated in FIGS. 16A and 16B may be achieved by a similar procedure to that into the magnetic memory 1B illustrated in FIG. 12, except for that an electric field is applied to the piezoelectric layer 32 in place of the piezoelectric layers 32 and 33.

Also in the structure of the magnetic memory 1E illustrated in FIGS. 16A and 16B, the strain $\in$ generated in the recording layer 23 of the spin device element 14 depends on the arrangement of the spin device element 14. On the basis of this consideration, also in the magnetic memory 1E illustrated in FIGS. 16A and 16B, the spin device element 14 is arranged so that the center plane D of the spin device element 14 is displaced in the +X or −X direction with respect to the center plane C between the fixed ends 30a and 30b. This allows applying a stress to the recording layer 23 so that only either a compressive or tensile stress is dominant over the recording layer 23. In detail, in the magnetic memory 1E illustrated in FIGS. 16A and 16B, the end 14a facing the −X direction of the spin device element 14 is displaced in the −X direction with respect to the center plane C between the fixed ends 30a and 30b, while the end 14b facing the +X direction of the spin device element 14 is displaced in the +X direction with respect to the center plane C. The distance of the end 14a of the spin device element 14 from the center plane C is closer than that of the end 14b from the center plane C. As a result, the center plane D of the spin device element 14 is displaced in the +X direction with respect to the center plane C between the fixed ends 30a and 30b.

To further increase the strain generated in the recording layer 23, it is preferable that the whole of the spin device element 14 (or the whole of the recording layer 23) is displaced in the −X or +X direction from the center plane C.

Figure 17A:
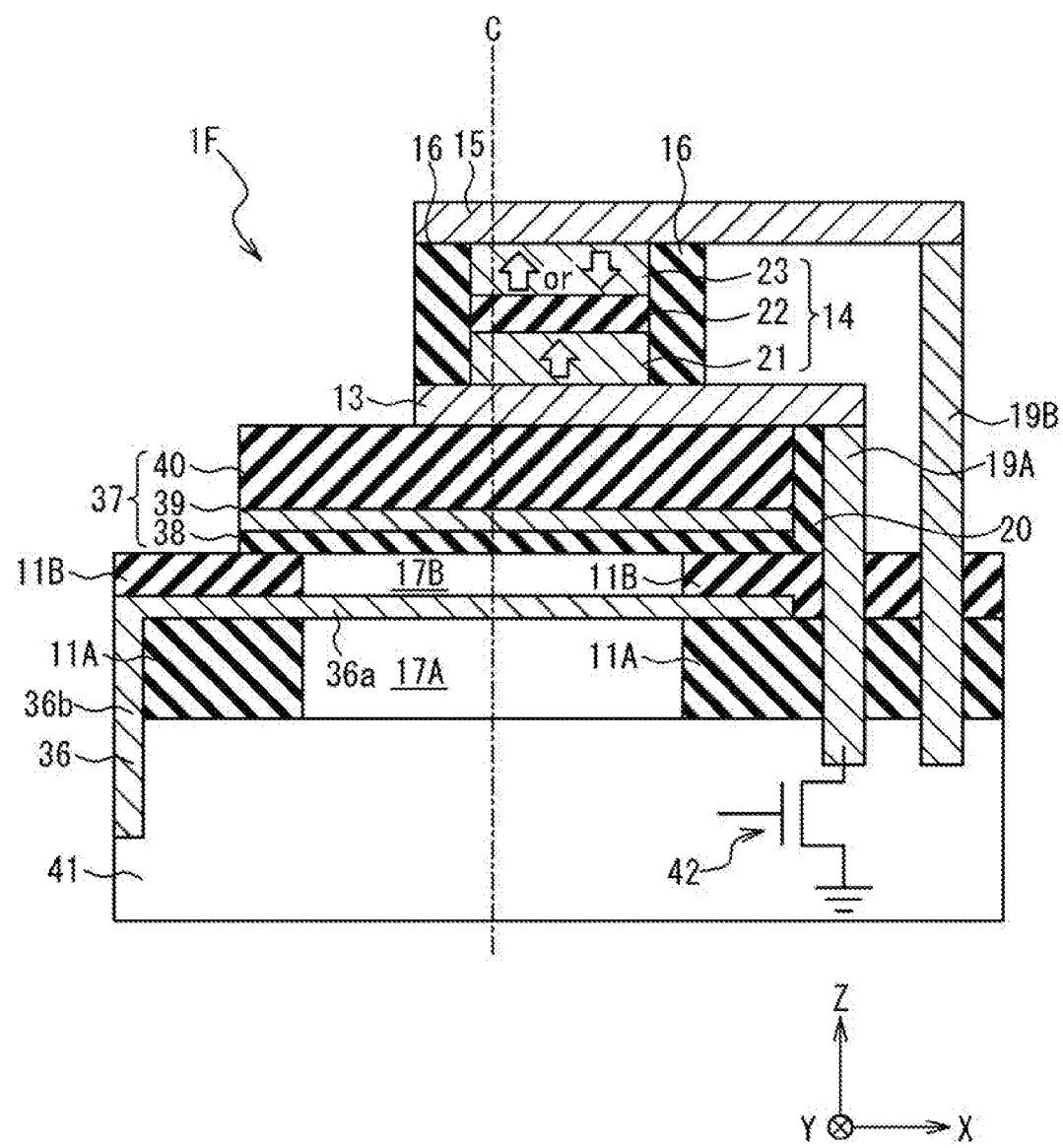
FIG. 17A is a cross-sectional view conceptually illustrating still another example of the structure of a magnetic memory in which the spin device element of each memory cell is connected with a transistor.
Figure 17B:
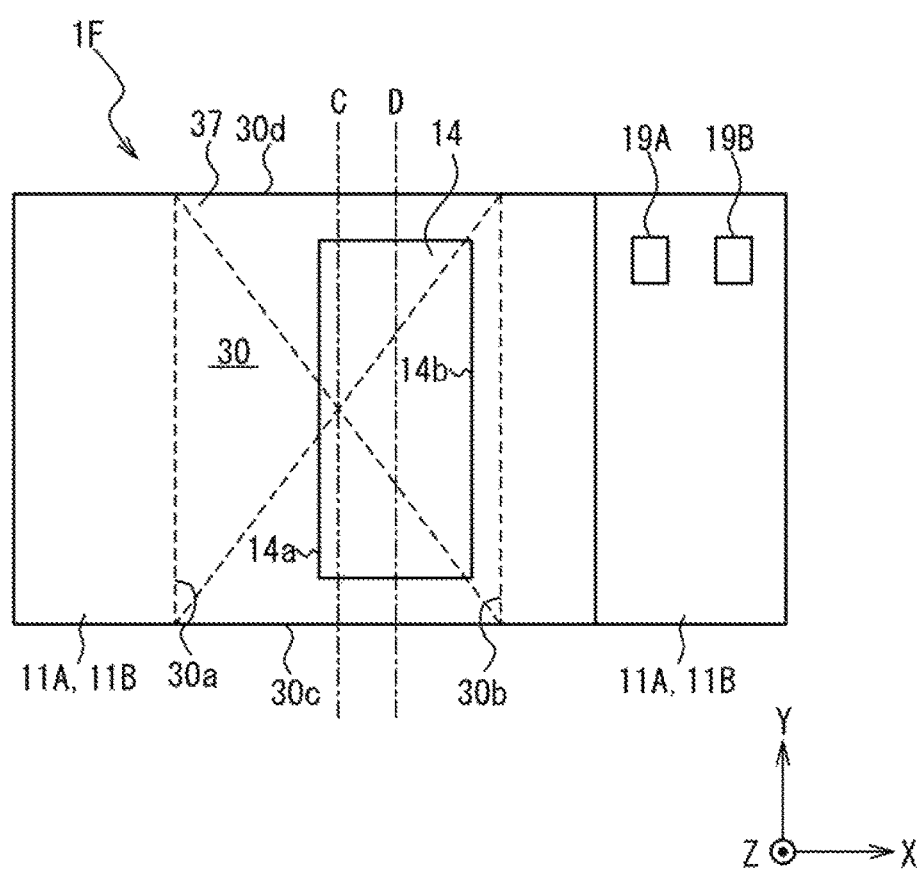
FIG. 17B is a plan view illustrating the structure of the magnetic memory of FIG. 17A.

FIG. 17A is a cross-sectional view conceptually illustrating still another example of the structure of a magnetic memory in which the spin device element of each memory cell is connected with a transistor, and FIG. 17B is a plan view illustrating the structure of the magnetic memory of FIG. 17A. The magnetic memory illustrated in FIGS. 17A and 17B, which is denoted by numeral 1F, is configured to bend a deformable base plate with a force exerted between capacitor electrodes similarly to the magnetic memory 1C illustrated in FIG. 13.

In detail, the magnetic memory 1F includes a semiconductor substrate 41 in which a transistor circuit is integrated. A transistor 42 integrated in the semiconductor substrate 41 is illustrated in FIG. 17A. The semiconductor substrate 41 may include metal interconnection layers and interlayer dielectric films which provide electrical isolation among the metal interconnection layers, although details are not illustrated in FIG. 17A. A fixture base 11A is formed on the semiconductor substrate 41.

A capacitor electrode 36 is formed on the upper surface of the fixture base 11A. The capacitor electrode 36 includes a flat plate section 36a and a contact section 36b. The lower surface of the flat plate section 36a faces a space 17A which is not filled with solid substance. The contact section 36b is connected with an interconnections and/or element integrated in the semiconductor substrate 41.

A fixture base 11B is formed on the upper surface of the capacitor electrode 36 and on the portion of the upper surface of the fixture base 11A which is not covered with the capacitor electrode 36. Furthermore, a deformable base plate 37 is coupled with the upper surface of the fixture base 11B. The deformable base plate 37 is opposed to the capacitor electrode 36 across a space 17B which is not filled with solid substance. In other words, the lower surface of the deformable base plate 37 faces the space 17B which is not filled with solid substance.

The deformable base plate 37 includes a dielectric layer 38, a capacitor electrode layer 39 and a main body 40. The dielectric layer 38 is coupled with the upper surface of the fixture base 11B and the capacitor electrode layer 39 is coupled with the upper surface of the dielectric layer 38. The main body 40 is coupled with the upper surface of the capacitor electrode layer 39. The capacitor electrode layer 39 is opposed to the flat plate section 36a of the capacitor electrode 36 across the dielectric layer 38 and the space 17B which is not filled with solid substance, and a capacitor is formed with the capacitor electrode layer 39 and the capacitor electrode 36.

A lower electrode 13 is formed on the upper surface of the deformable base plate 37 (the upper surface of the main body 40) and a spin device element 14 is formed on the upper surface of the lower electrode 13. The structure of the spin device element 14 is as described above with reference to FIG. 1A. An upper electrode 15 is formed on the upper surface of the recording layer 23 of the spin device element 14. A dielectric layer 16 is formed on the side of the spin device element 14 to protect the spin device element 14. The dielectric layer 16 covers the side of the stack structure in which the reference layer 21, the spacer layer 22 and the recording layer 23 are stacked. Furthermore, the side surface of the deformable base plate 37 is covered with a dielectric layer 20. The dielectric layer 20 electrically isolates the lower electrode 13 from the capacitor electrode 36 and the capacitor electrode layer 39 of the deformable base plate 37. The lower electrode 13 is connected with the transistor 42, which is integrated in the semiconductor substrate 41, via a contact 19A, while the upper electrode 15 is connected with an interconnection and/or an element integrated in the semiconductor substrate 41 via a contact 19B.

In the magnetic memory 1F thus structured, the deformable base plate 37 can be bent by applying a voltage between the capacitor electrode 36 and the capacitor electrode layer 39. In detail, when a voltage is applied between the capacitor electrode 36 and the capacitor electrode layer 39, an electric field is generated between the capacitor electrode 36 and the capacitor electrode layer 39, and this electric field works on charges generated on the surface of the capacitor electrode layer 39 to generate an attracting force which pulls the capacitor electrode layer 39 towards the capacitor electrode 36, that is, an attracting force which pulls the deformable base plate 37 towards the capacitor electrode 36. Since the lower surface of the deformable base plate 37 is only partially coupled with the fixture base 11B and faces the space 17B which is not filled with solid substance, the deformable base plate 37 is bent by the force attracting the deformable base plate 37 towards the capacitor electrode 36.

It should be noted here that, in the structure of the magnetic memory 1F illustrated in FIGS. 17A and 17B, a part of the lower surface of the deformable base plate 37 faces the space 17B which is not filled with solid substance. The structure in which the surface of the deformable base plate 37 opposed to the surface on which the spin device element 14 is formed faces the space 17B which is not filled with solid substance effectively enlarges the displacement of the deformable base plate 37.

It should be noted that substantially no current is generated (other than a leakage current and a temporary charging current) to bend the deformable base plate 37 also in the structure illustrated in FIGS. 17A and 17B. The structure illustrated in FIGS. 17A and 17B eliminates the need for generating a current to bend the deformable base plate 37, since the deformable base plate 37 is bent with a force exerted between capacitor electrodes. This effectively reduces the data write power (that is, the power consumed in a write operation).

Also in the structure of the magnetic memory 1E illustrated in FIGS. 17A and 17B, the strain ∈ generated in the recording layer 23 of the spin device element 14 depends on the arrangement of the spin device element 14. On the basis of this consideration, also in the magnetic memory 1F illustrated in FIGS. 17A and 17B, the spin device element 14 is arranged so that the center plane D of the spin device element 14 is displaced in the +X or −X direction with respect to the center plane C between the fixed ends 30a and 30b. This allows applying a stress to the recording layer 23 so that only either a compressive or tensile stress is dominant over the recording layer 23. In detail, in the magnetic memory 1F illustrated in FIGS. 17A and 17B, the end 14a facing the −X direction of the spin device element 14 is displaced in the −X direction with respect to the center plane C between the fixed ends 30a and 30b, while the end 14b facing the +X direction of the spin device element 14 is displaced in the +X direction with respect to the center plane C. The distance of the end 14a of the spin device element 14 from the center plane C is closer than that of the end 14b from the center plane C. As a result, the center plane D of the spin device element 14 is displaced in the +X direction with respect to the center plane C between the fixed ends 30a and 30b.

To further increase the strain generated in the recording layer 23, it is preferable that the whole of the spin device element 14 (or the whole of the recording layer 23) is displaced in the −X or +X direction from the center plane C.

(Manufacture Method of Magnetic Memory)

Figure 18:
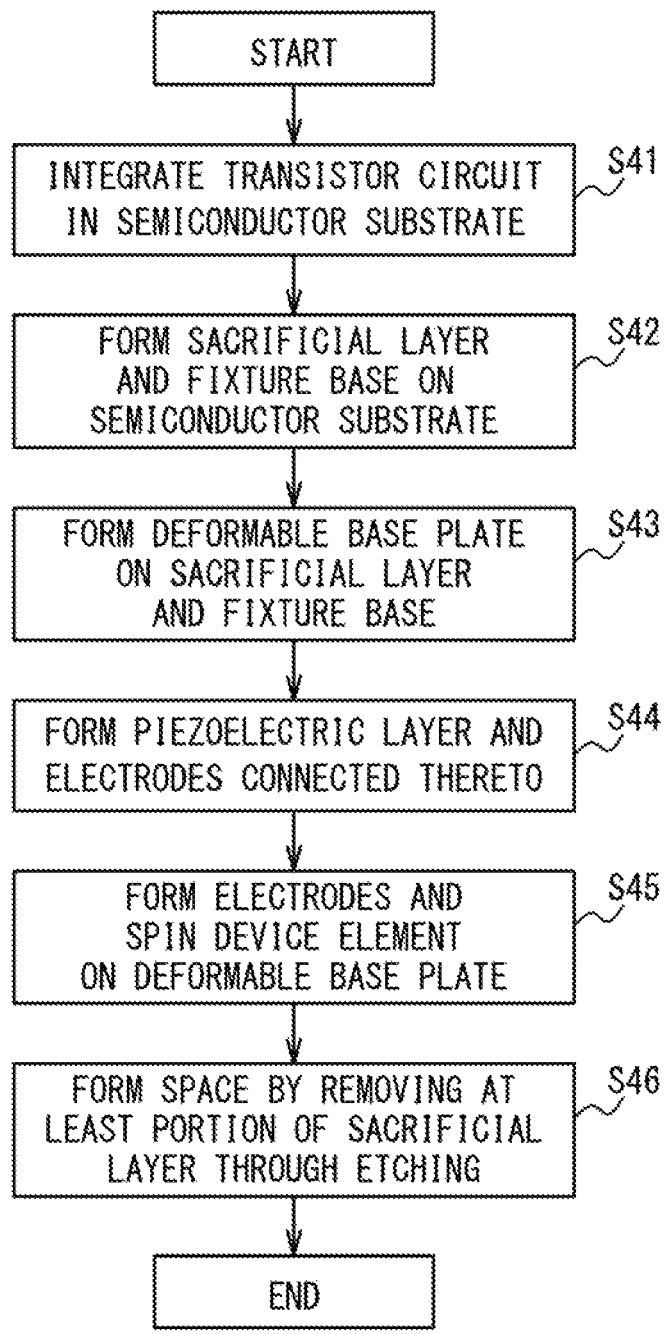
FIG. 18 is a flowchart illustrating an exemplary method of manufacturing the magnetic memory 1D illustrated in FIGS. 15A and 15B in one embodiment.

FIG. 18 is a flowchart illustrating an exemplary method of manufacturing the magnetic memory 1D illustrated in FIGS. 15A and 15B in one embodiment, and FIGS. 19A to 19E are cross-sectional views illustrating the method of manufacturing the magnetic memory 1D.

Figure 19A:
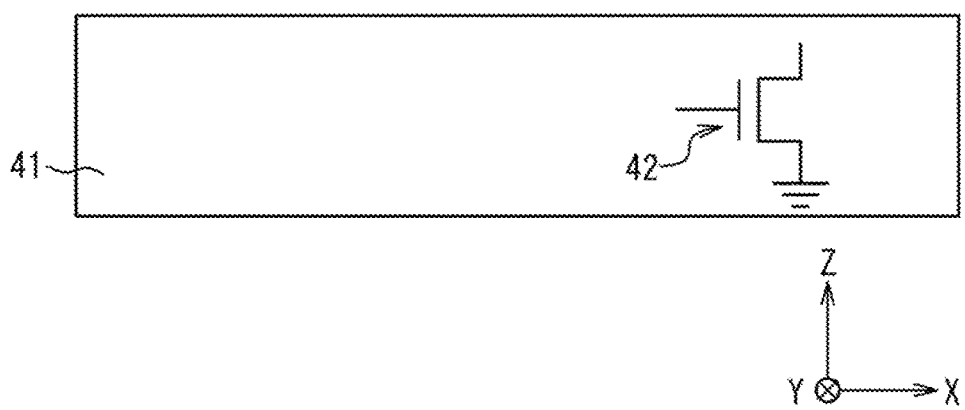
FIGS. 19A to 19E are cross-sectional views illustrating the method of manufacturing the magnetic memory illustrated in FIGS. 15A and 15B in one embodiment.

In the manufacture of the magnetic memory 1D, as illustrated in FIG. 19A, a transistor circuit is integrated into a semiconductor substrate 41 (at step S41). Although FIG. 19A only illustrates a transistor 42 integrated in the semiconductor substrate 41, a person skilled in the art would appreciate that a large number of transistors of the transistor circuit may be integrated in the semiconductor substrate 41 in an actual implementation.

Figure 19B:
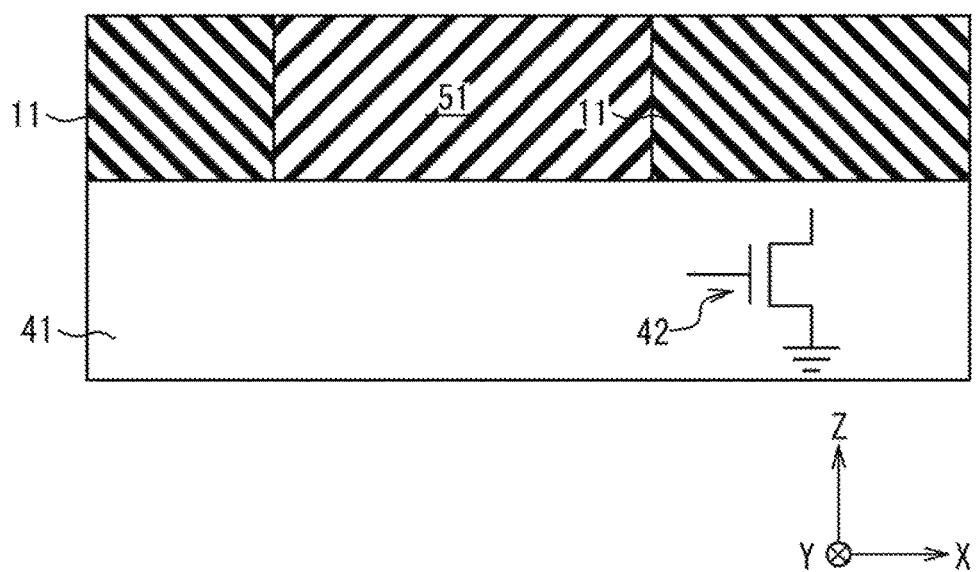

As illustrated in FIG. 19B, a fixture base 11 and a sacrificial layer 51 are formed on the semiconductor substrate 41 (at step S42). As described later, the sacrificial layer 51 is removed in a later process to form a space 17 which is not filled with solid substance.

Figure 19C:
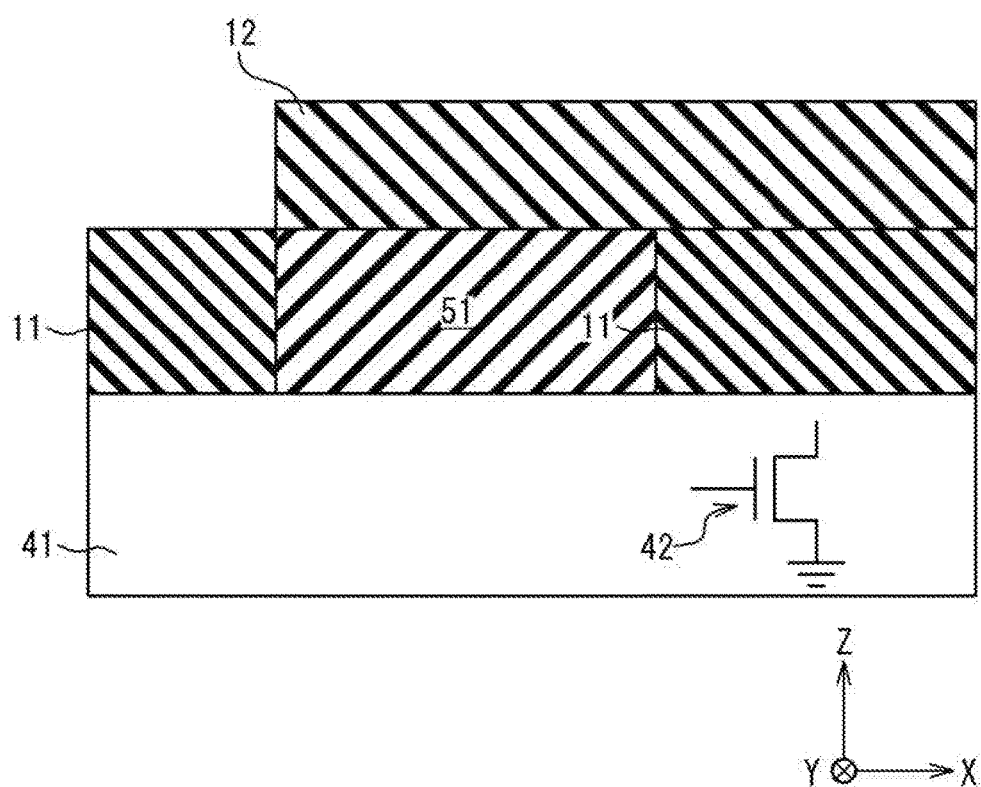

A deformable base plate 12 is then formed on the upper surfaces of the fixture base 11 and the sacrificial layer 51 as illustrated in FIG. 19C (at step S43). The deformable base plate 12 may be coupled with the upper surfaces of the fixture base 11 and the sacrificial layer 51 with a substrate bonding technique.

Figure 19D:
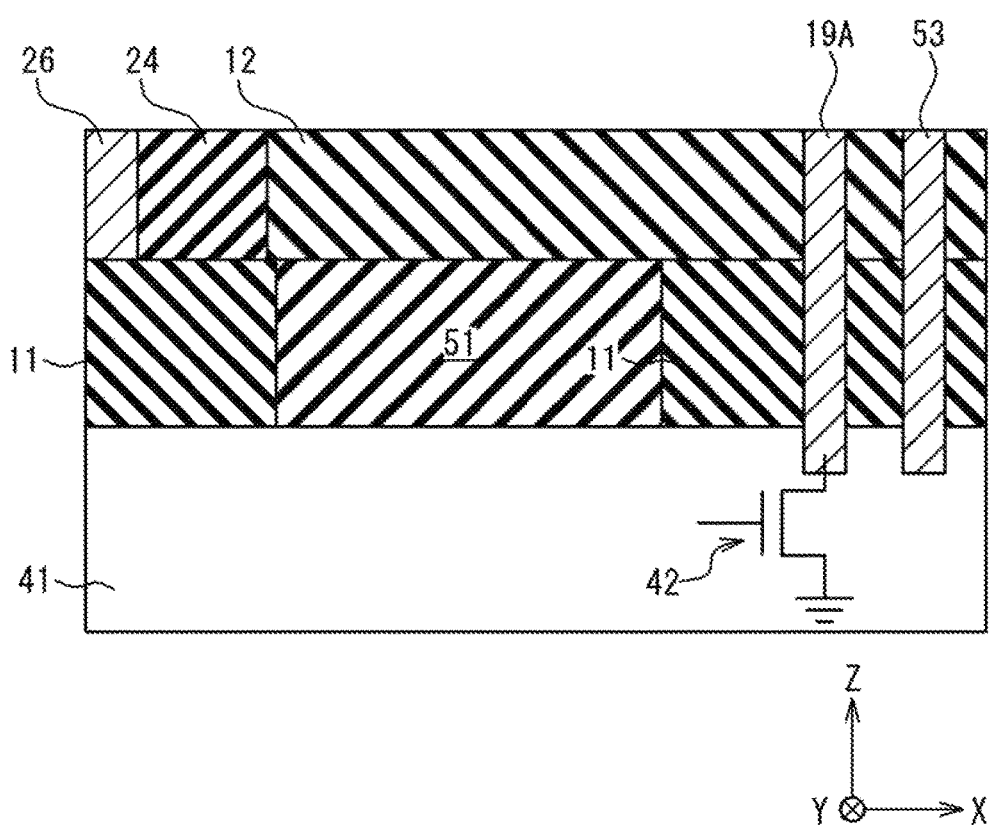

This is followed by forming a piezoelectric layer 24 on the upper surface of the fixture base 11 and further forming an electrode layer 26 (at step S44) as illustrated in FIG. 19D. The piezoelectric layer 24 is formed in contact with the side surface of the deformable base plate 12. The electrode layer 26 is formed in contact with the surface of the piezoelectric layer 24 opposite to the surface which is in contact with the side surface of the deformable base plate 12. It should be noted that an additional electrode layer (not illustrated) coupled with the piezoelectric layer 24, on which a potential difference is generated with respect to the electrode layer 26, may be formed in this process.

A contact 19A and a contact 53 are then formed to penetrate the deformable base plate 12 and the fixture base 11. As described above, the contact 19A is used for connecting a lower electrode 13, which is formed in a later process, with the transistor 42 integrated in the semiconductor substrate 41. The contact 53 is, on the other hand, used for connecting an upper electrode 15, which is formed in a later process, with an interconnection and/or element integrated in the semiconductor substrate 41.

Figure 19E:
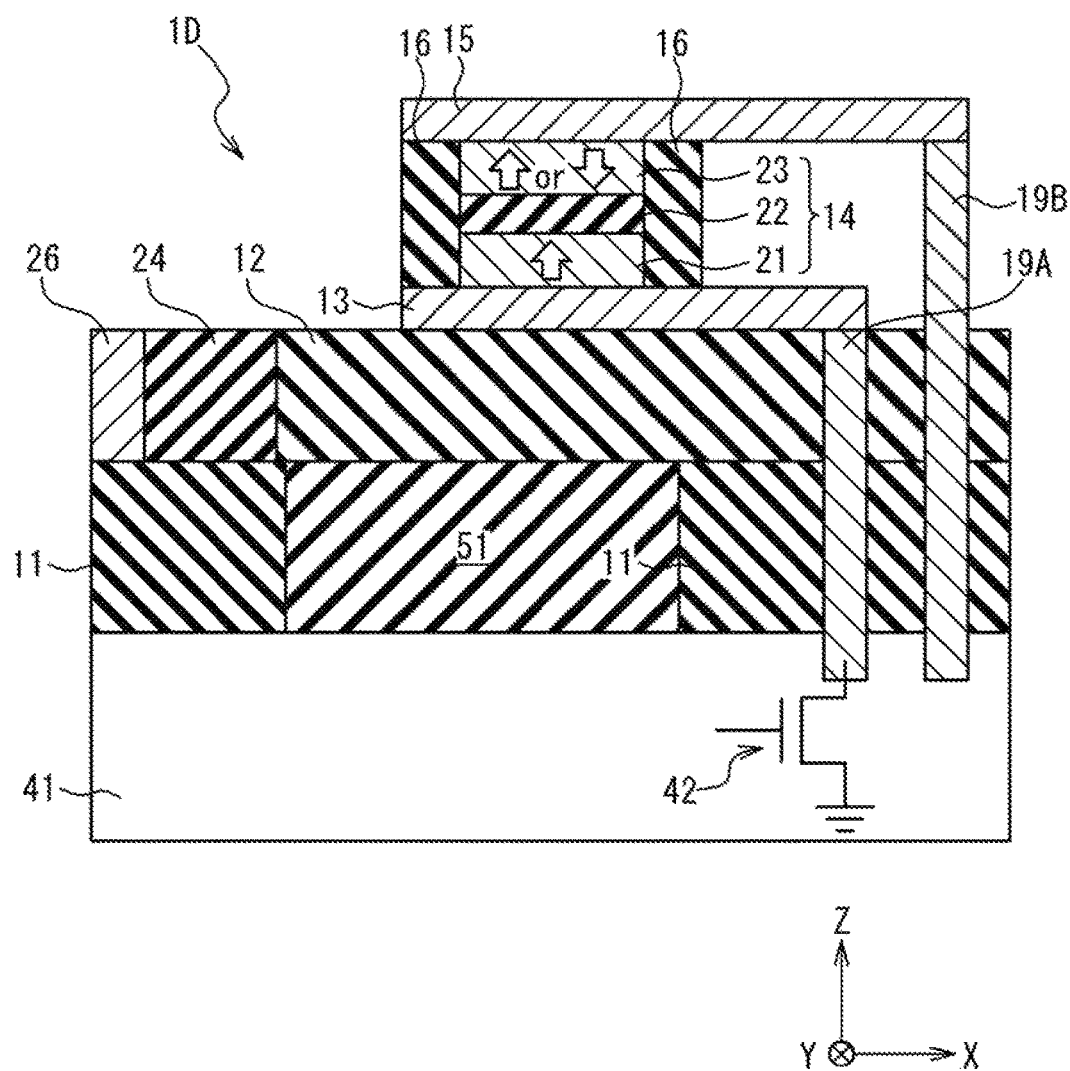

As illustrated in FIG. 19E, this is followed by forming a lower electrode 13 on the upper surface of the deformable base plate 12 and forming a spin device element 14 on the upper surface of the lower electrode 13 (at step S45). The lower electrode 13 is formed in contact with the contact 19A and thereby electrically connected with the transistor 42 integrated in the semiconductor substrate 41 via the contact 19A.

In forming the spin device element 14, a reference layer 21, a spacer layer 22 and a recording layer 23 are sequentially formed and a dielectric layer 16 is formed on the side of the spin device element 14 to protect the spin device element 14. Although not illustrated in FIG. 19E for simplicity, an underlayer may be inserted between the lower electrode 13 and the reference layer 21 as described above.

An upper electrode 15 is then formed on the upper surface of the recording layer 23 of the spin device element 14. Although not illustrated in FIG. 19E for simplicity, a capping layer may be inserted between the recording layer 23 and the upper electrode 15. In this process, a contact is formed to connect the upper electrode 15 with the contact 53, which is formed in the previous process, and thereby a contact 19B is formed to connect the upper electrode 15 with an interconnection and/or element integrated in the semiconductor substrate 41.

This is followed by removing at least a portion of the sacrificial layer 51 to form a space 17 which is not filled with solid substance (at step S46). The space 17 can be formed by selectively removing the sacrificial layer 51 through etching via an opening which communicates with the region at which the space 17 is to be formed. The etching of the sacrificial layer 51 may be achieved by a wet etching technique using a solution or by a dry etching technique using a plasma gas. The above-described procedure completes the magnetic memory 1D illustrated in FIGS. 15A and 15B.

As described above, in the present embodiment, the formation of the space 17 (which is not filled with solid substance) in contact with the lower surface of the deformable base plate 12 is achieved through a process in which the sacrificial layer 51 is first formed and removed later by etching.

Figure 20:
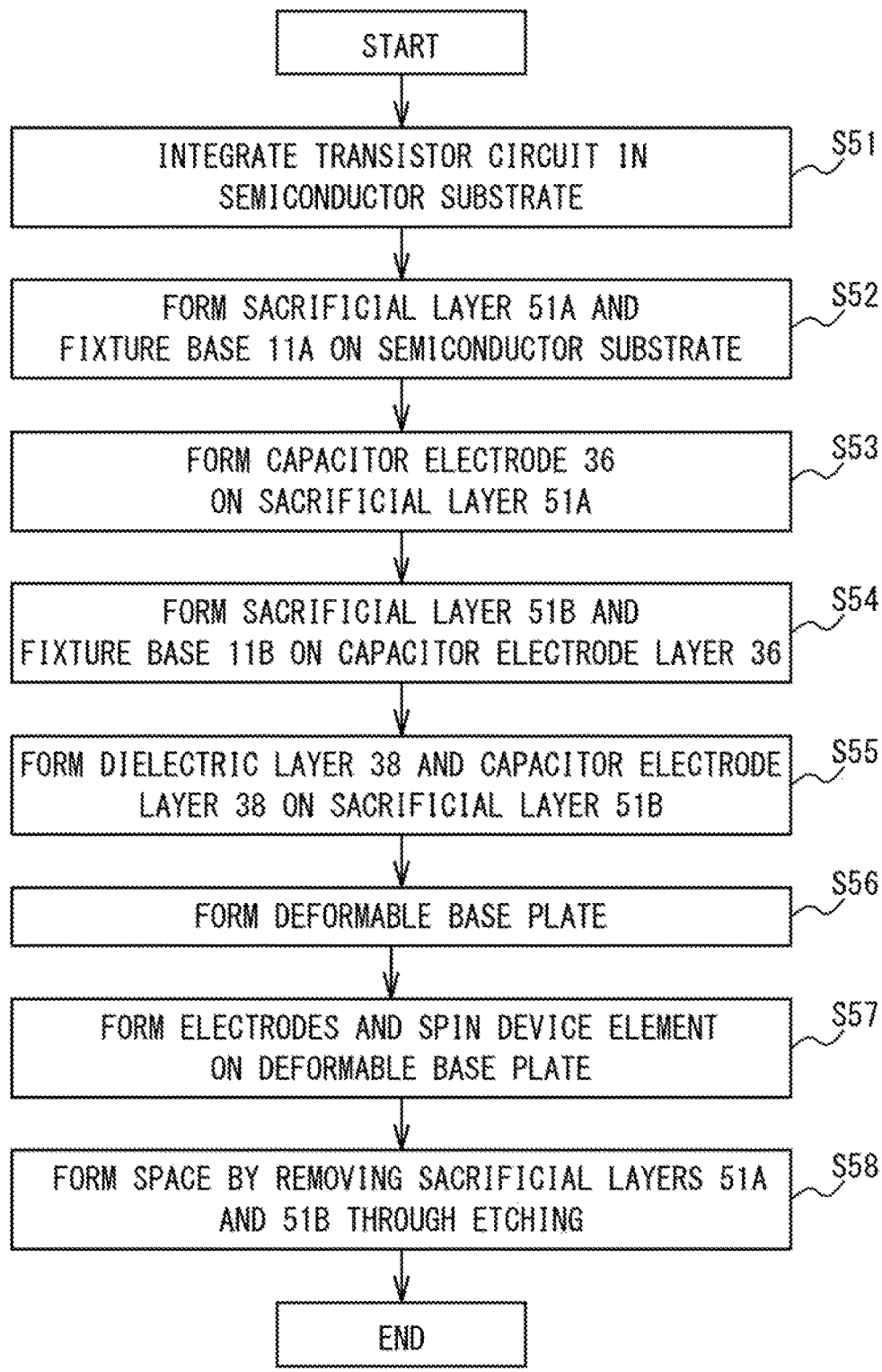
FIG. 20 is a flowchart illustrating an exemplary method of manufacturing the magnetic memory illustrated in FIGS. 17A and 17B in one embodiment.

FIG. 20 is a flowchart illustrating an exemplary method of manufacturing the magnetic memory 1F illustrated in FIGS. 17A and 17B in one embodiment, and FIGS. 21A to 21F are cross-sectional views illustrating the method of manufacturing the magnetic memory 1F.

Figure 21A:
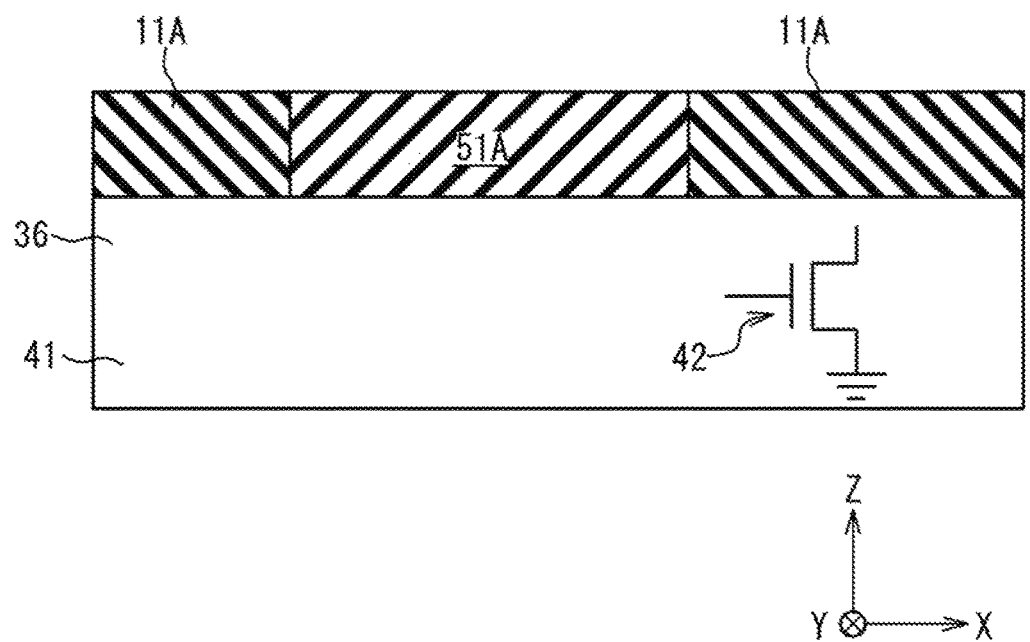
FIGS. 21A to 21F are cross-sectional views illustrating the method of manufacturing the magnetic memory illustrated in FIGS. 17A and 17B in the present embodiment.

In the manufacture of the magnetic memory 1F, as illustrated in FIG. 21A, a transistor circuit is integrated into a semiconductor substrate 41 (at step S51). A fixture base 11A and a sacrificial layer 51A are then formed on the semiconductor substrate 41 (at step S52). As described later, the sacrificial layer 51A is removed in a later process to form a space 17A which is not filled with solid substance.

Figure 21B:
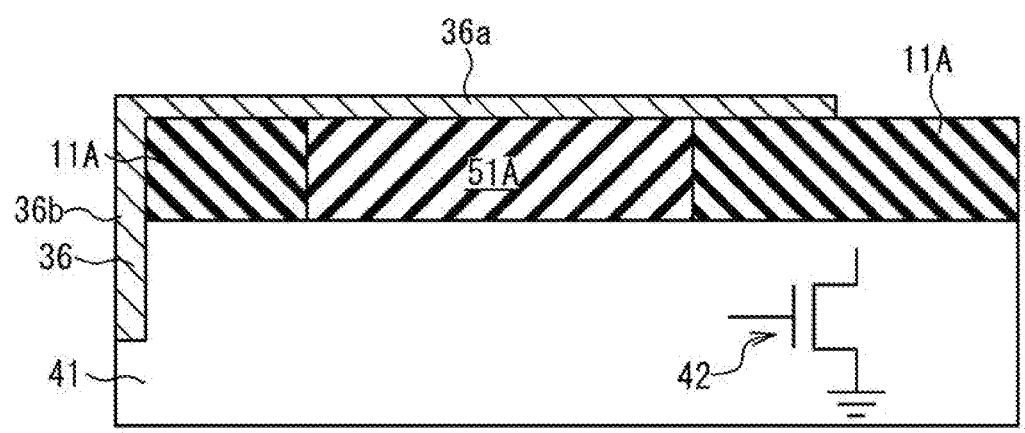

This is followed by forming a capacitor electrode 36 as illustrated in FIG. 21B (at step S53). The flat plate section 36a of the capacitor electrode 36 is formed to cover the fixture base 11A and the sacrificial layer 51A, and the contact section 36b is formed to achieve an electrical connection of the flat plate section 36a with an interconnection and/or element integrated in the semiconductor substrate 41.

Figure 21C:
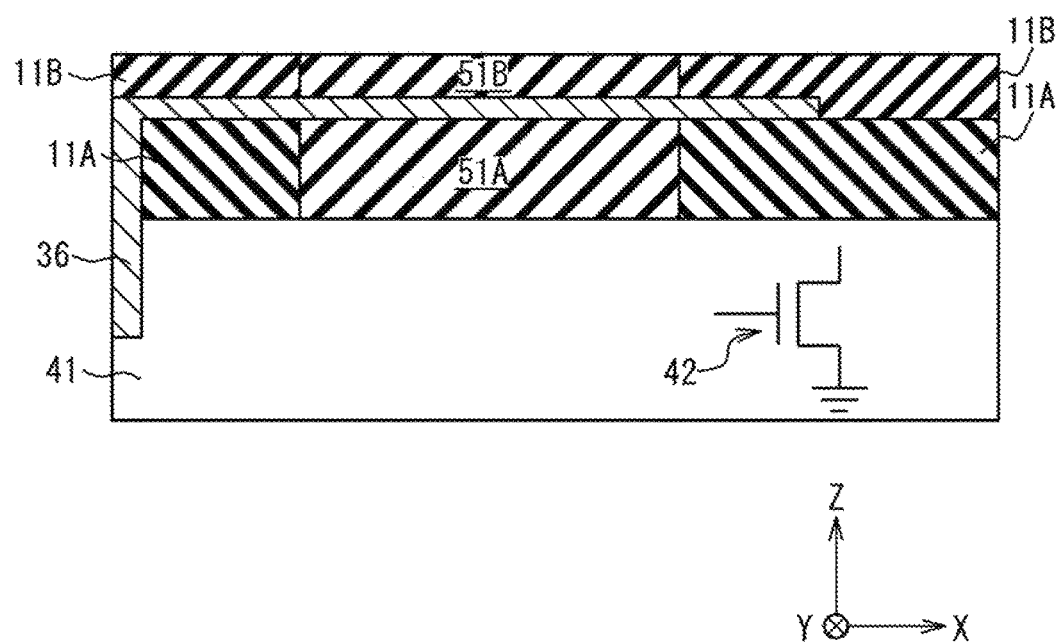

As illustrated in FIG. 21C, a fixture base 11B and a sacrificial layer 51B are then formed on the upper surface of the capacitor electrode 36 and a portion of the upper surface of the fixture base 11 which is not covered with the capacitor electrode 36 (at step S54). As described later, the sacrificial layer 51B is removed in a later process to form a space 17B which is not filled with solid substance.

Figure 21D:
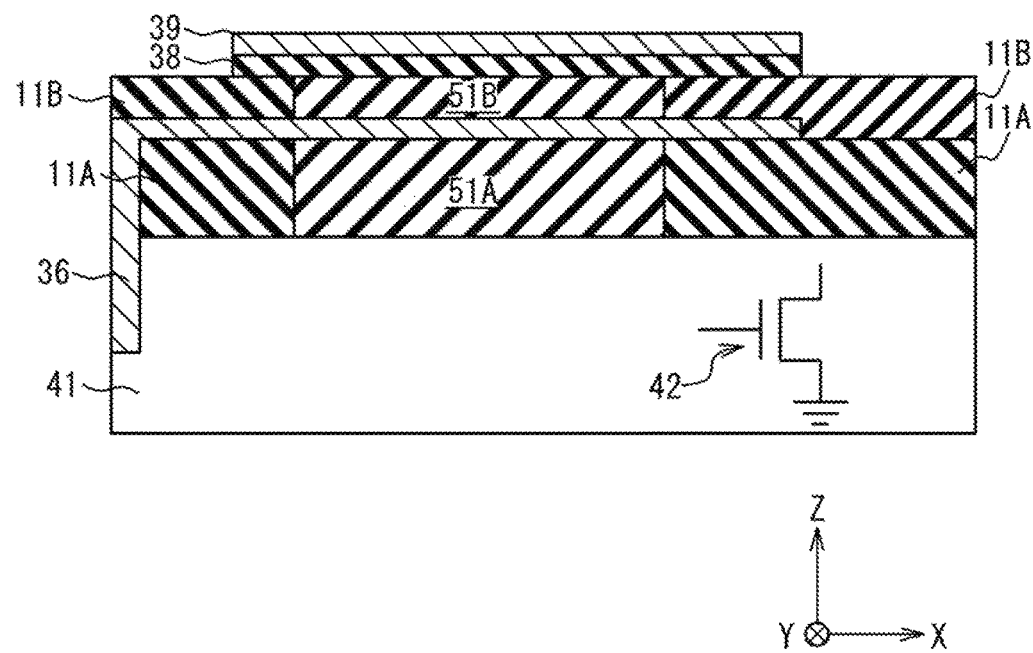

As illustrated in FIG. 21D, this is followed by forming a dielectric layer 38 on the upper surfaces of the fixture base 11B and the sacrificial layer 51B and further forming a capacitor electrode layer 39 on the upper surface of the dielectric layer 38 (at step S55). The capacitor electrode layer 39 is formed to be opposed to the capacitor electrode 36 across the dielectric layer 38 and the sacrificial layer 51B.

Figure 21E:
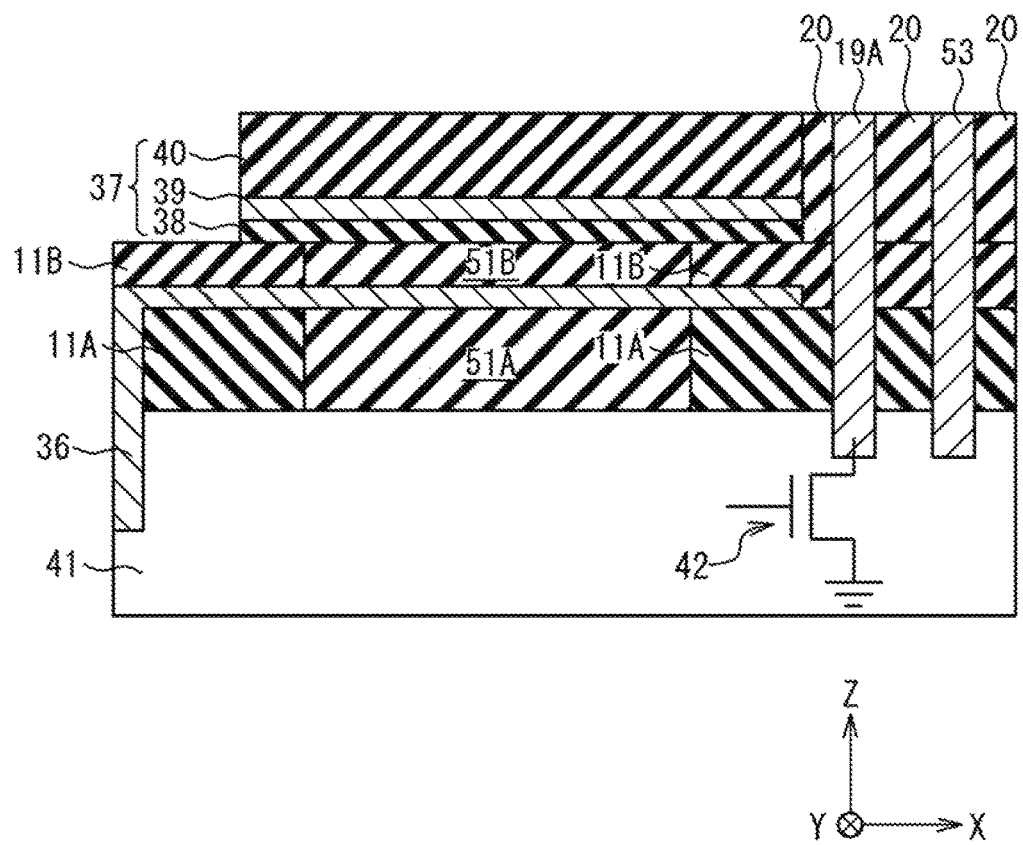

A main body 40 is then formed on the upper surface of the capacitor electrode layer 39, and this completes a deformable base plate 37 as illustrated in FIG. 21E (at step S56).

A dielectric layer 20 is then formed to cover the side surface of the deformable base plate 37 and a contact 19A and a contact 53 are formed to penetrate the fixture bases 11A, 11B and the dielectric layer 20.

As described above, the contact 19A is used for connecting a lower electrode 13, which is formed in a later process, with the transistor 42 integrated in the semiconductor substrate 41. The contact 53 is, on the other hand, used for connecting an upper electrode 15, which is formed in a later process, with an interconnection and/or element integrated in the semiconductor substrate 41.

Figure 21F:
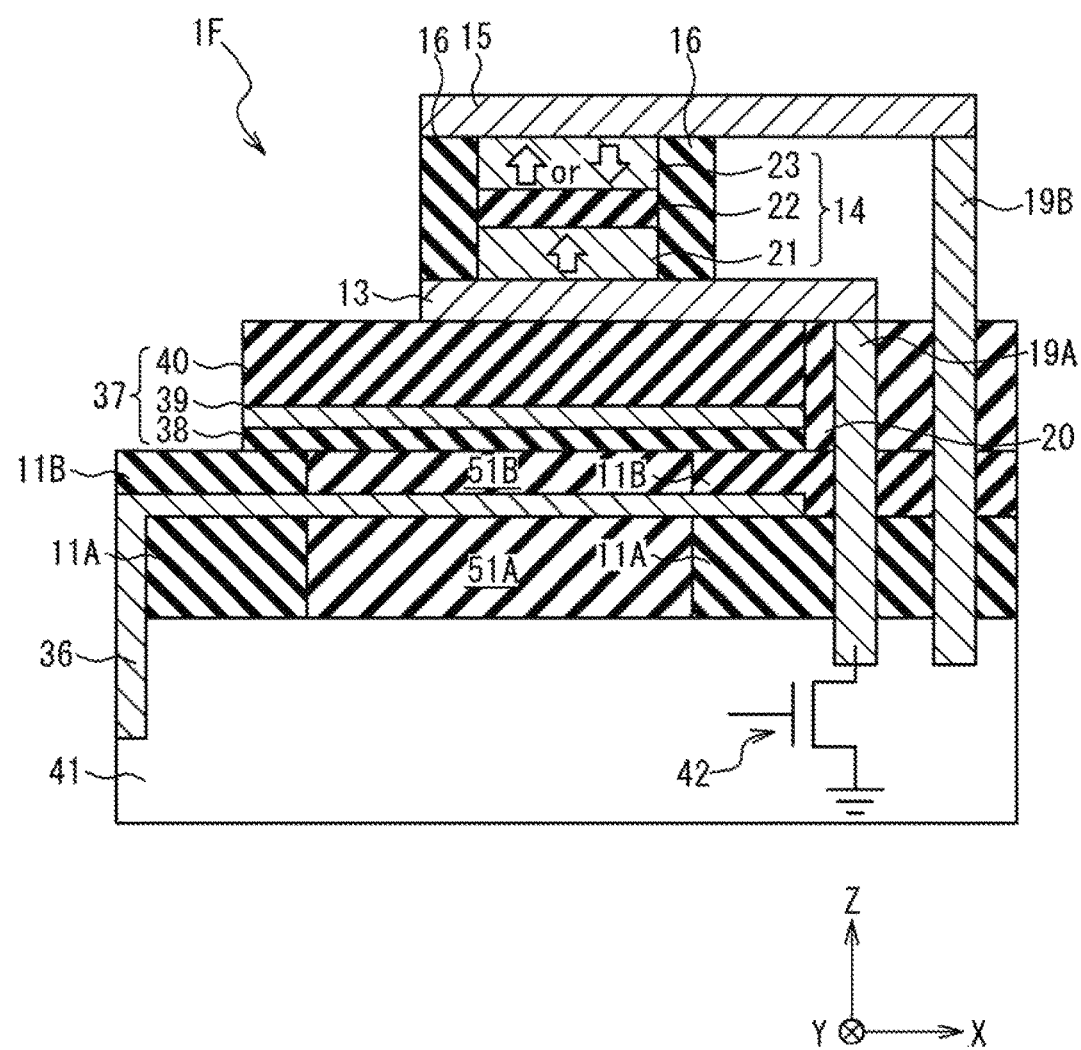

As illustrated in FIG. 21F, this is followed by forming a lower electrode 13 on the upper surface of the deformable base plate 37 and forming a spin device element 14 on the upper surface of the lower electrode 13 (at step S57). The lower electrode 13 is formed in contact with the contact 19A and thereby electrically connected with the transistor 42 integrated in the semiconductor substrate 41 via the contact 19A.

In forming the spin device element 14, a reference layer 21, a spacer layer 22 and a recording layer 23 are sequentially formed and a dielectric layer 16 is further formed on the side of the spin device element 14 to protect the spin device element 14. Although not illustrated in FIG. 19E for simplicity, an underlayer may be inserted between the lower electrode 13 and the reference layer 21 as described above.

An upper electrode 15 is then formed on the upper surface of the recording layer 23 of the spin device element 14. Although not illustrated in FIG. 19E for simplicity, a capping layer may be inserted between the recording layer 23 and the upper electrode 15. In this process, a contact is formed to connect the upper electrode 15 with the contact 53, which is formed in the previous process, and thereby a contact 19B is formed to connect the upper electrode 15 with an interconnection and/or element integrated in the semiconductor substrate 41.

This is followed by removing at least a portion of the sacrificial layers 51A and 51B to form spaces 17A and 17B which are not filled with solid substance (at step S58). The spaces 17A and 17B can be formed by selectively removing the sacrificial layers 51A and 51B through etching (wet etching or dry etching) via an opening which communicates with the regions at which the spaces 17A and 17B are to be formed. The above-described procedure completes the magnetic memory 1F illustrated in FIGS. 17A and 17B.

As described above, in the present embodiment, the formation of the spaces 17A and 17B (which are not filled with solid substance) in contact with the lower surfaces of the capacitor electrode 36 and the deformable base plate 37, respectively, is achieved through a process in which the sacrificial layers 51A and 51B are first formed and removed later by etching.

Figure 22A:
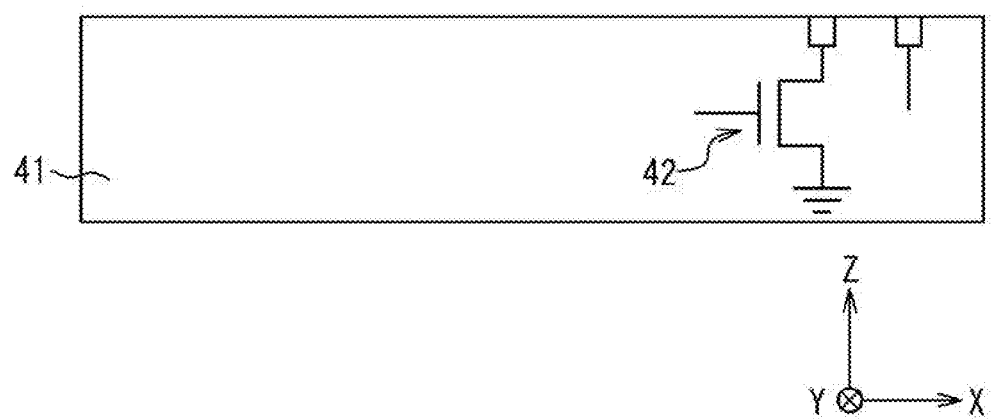
FIGS. 22A to 22C are cross-sectional views illustrating a method of manufacturing a magnetic memory by using a wafer bonding technique in one embodiment.
Figure 22B:
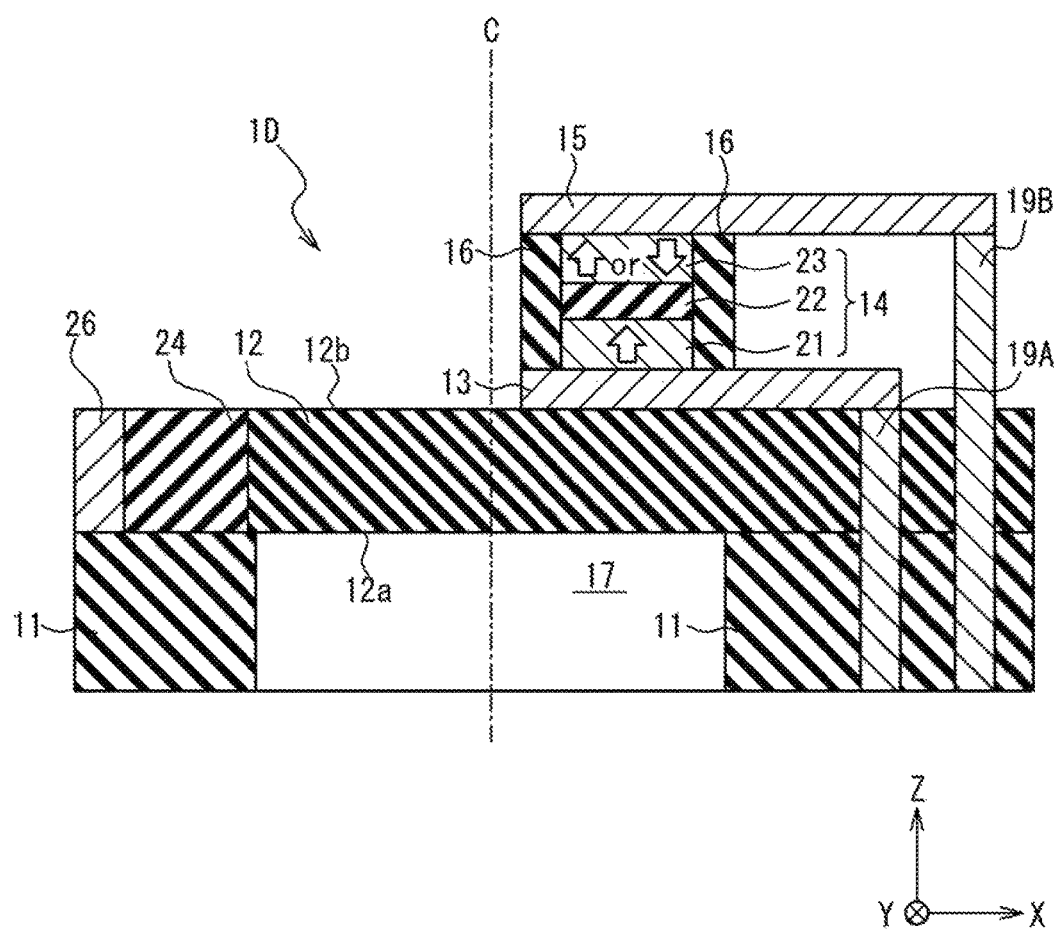
Figure 22C:
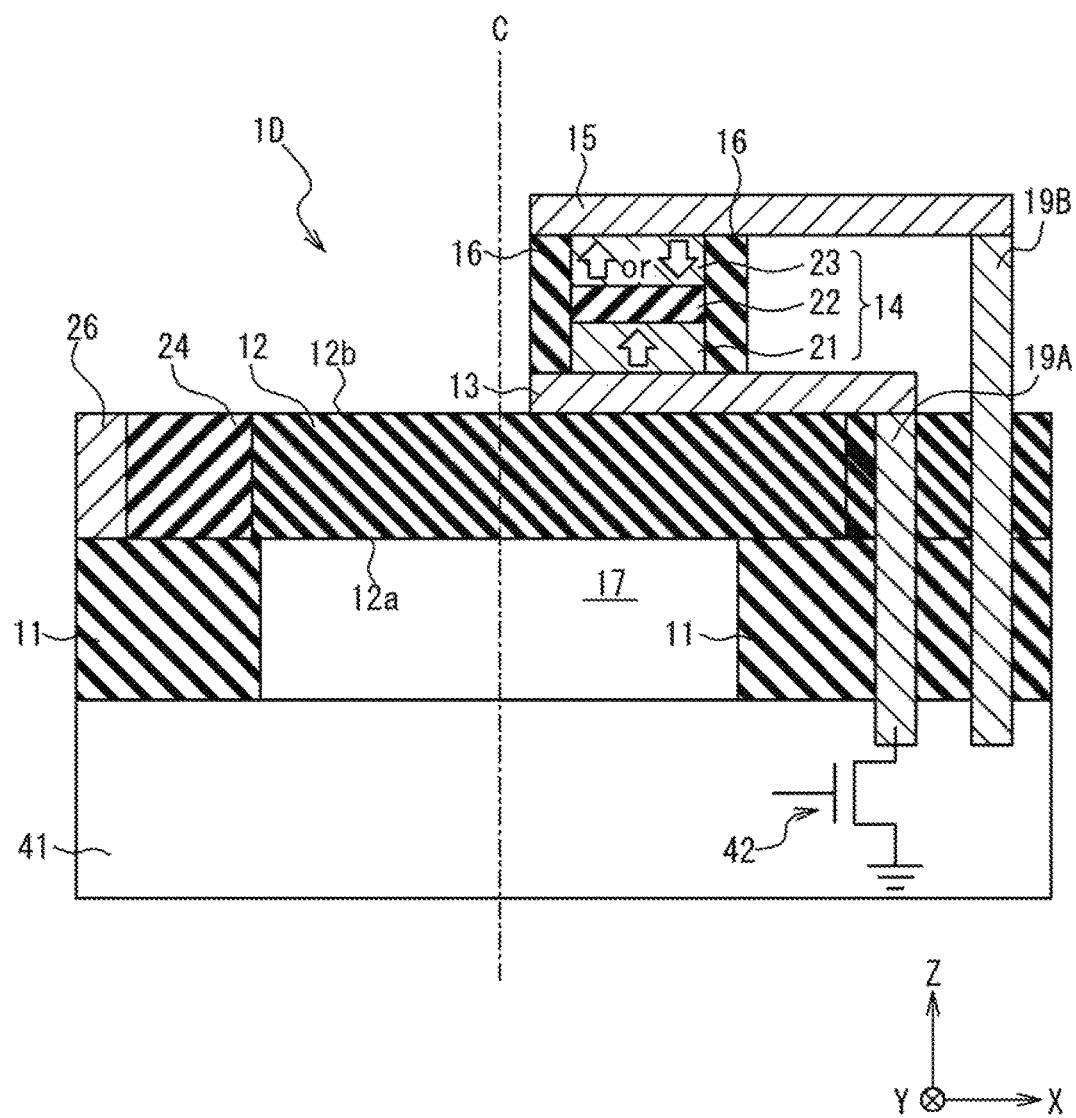

The magnetic memories in the present embodiment may be manufactured by in a manufacture process in which a transistor circuit incorporating transistors and a memory section incorporating spin device elements (memory cells) are first integrated into separate wafers and then bonding these wafers. FIGS. 22A to 22C are cross-sectional views illustrating one example of such a manufacture process. Illustrated in FIGS. 22A to 22C is a manufacture method of the magnetic memory 1D illustrated in FIGS. 15C and 15D.

As illustrated in FIG. 22A, a semiconductor substrate 41 in which a transistor circuit (including a transistor 42) is integrated is prepared and a memory section illustrated in FIG. 22B is separately prepared. In forming the memory section, a deformable base plate 12, a piezoelectric layer 24 and an electrode layer 26 are formed on the upper surface of a fixture base 11, a lower electrode 13 is formed on the deformable base plate 12, a spin device element 14 is formed on the lower electrode 13, and an upper electrode 15 is formed on the spin device element 14. Contacts 19A and 19B are further formed through the fixture base 11. This is followed by bonding the semiconductor substrate 41 illustrated in FIG. 22A with the fixture base 11 of the memory section illustrated in FIG. 22B to complete the magnetic memory 1D illustrated in FIG. 22C.

This process allows forming the space 17 which is not filled with solid substance with a method different from that described above in preparing the memory section illustrated in FIG. 22B. In detail, in preparing the structure illustrated in FIG. 22B, a process can be used which involves first forming a structure member including the structure in which the deformable base plate 12 is formed on the fixture base 11 with a commonly-used wafer process, and then removing an unnecessary portion of the fixture base 11 through a lithography process with dry etching, wet etching or the like. The semiconductor substrate 41 and the fixture base 11 are bonded so that the contacts 19A and 19B are connected with contacts formed in the semiconductor substrate 41 illustrated in FIG. 22A. This achieves an electrical connection of the spin device element 14 with an element integrated in the semiconductor substrate 41 (such as the transistor 42).

(Memory Cell Array Configuration)

As described above, magnetic memories according to the present embodiment is configured to feed a write signal to the spin device element 14 with the deformable base plate bent and this effectively relieves the conflict between data stability and data write power; however, a structure in which a deformable base plate and a mechanism bending the deformable base plate are individually prepared for each spin device element 14 (that is, each memory cell) is not so preferable, because such structure undesirably decreases the integration density of the magnetic memory.

One approach for addressing this problem is to form a plurality of spin device elements 14 (memory cells) on a single deformable base plate. In the following, a plurality of spin device elements 14 (memory cells) formed on the same deformable base plate may be referred to as "block". This structure effectively improves the integration density, although memory cells are placed into the half-select state in units of blocks in this structure. In the following, a description is given of embodiments in which a plurality of spin device elements 14 (memory cells) are formed on each deformable base plate in a memory cell array.

Figure 23A:
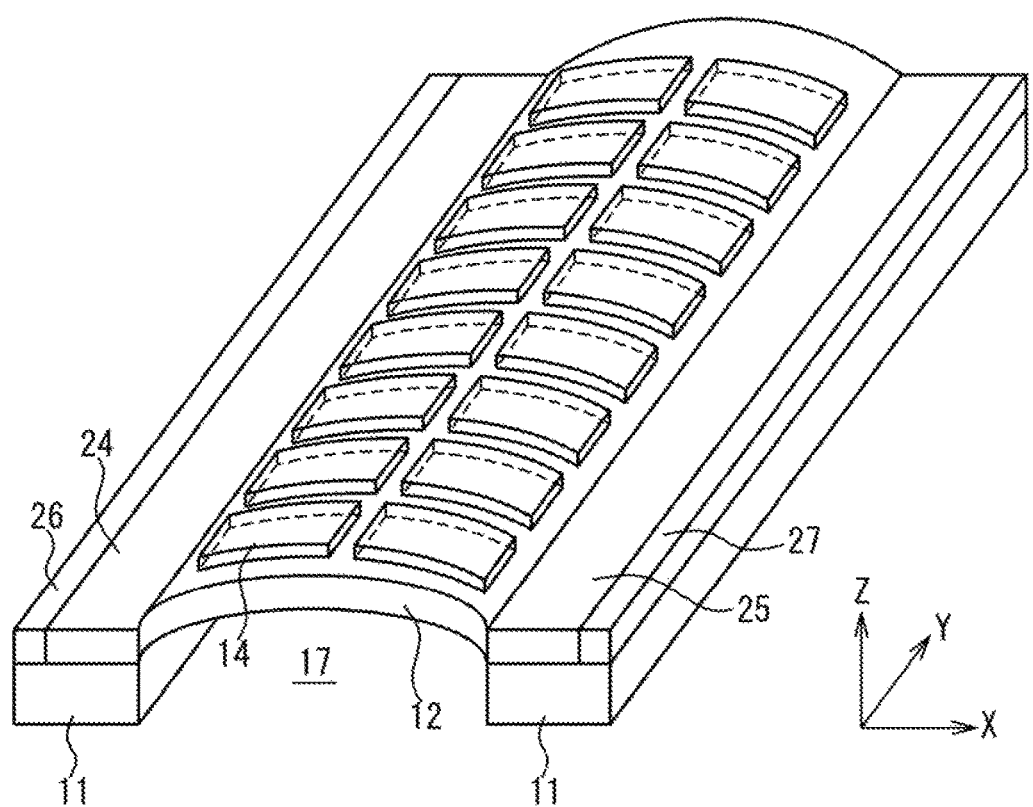
FIG. 23A is a perspective view illustrating one example of the configuration of each block of the memory cell array in one embodiment.

FIG. 23A is a perspective view illustrating one example of the configuration of each block of the memory cell array. Piezoelectric layers 24 and 25 are coupled with the side surfaces facing the X-axis directions of a deformable base plate 12. The piezoelectric layers 24 and 25 are coupled with the upper surface of the fixture base 11 to be supported. An electrode layer 26 is coupled with the surface of the piezoelectric layer 24 opposite to the surface coupled with the deformable base plate 12, and an electrode layer 27 is coupled with the surface of the piezoelectric layer 25 opposite to the surface coupled with the deformable base plate 12. An additional electrode layer (not illustrated) on which a potential difference is generated with respect to the electrode layer 26 may be coupled with the piezoelectric layer 24. Similarly, an additional electrode layer (not illustrated) on which a potential difference is generated with respect to the electrode layer 27 may be coupled with the piezoelectric layer 25. The piezoelectric layers 24, 25 and the electrode layers 26 and 27 are formed to extend in the Y-axis direction. In this structure, the side surfaces facing the X-axis directions of the deformable base plate 12 works as fixed ends. On the other hand, the side surfaces facing the Y-axis directions of the deformable base plate 12 are not coupled with any member. This implies that the side surfaces facing the Y-axis directions of the deformable base plate 12 works as free ends. The structure in which the side surfaces facing the Y-axis directions of the deformable base plate 12 works as free ends advantageously allows increasing the displacement of the deformable base plate 12. The lower surface of the deformable base plate 12 faces a space 17 which is not filled with solid substance.

A plurality of spin device elements 14 are arrayed in rows and columns on the upper surface of the deformable base plate 12. It should be noted that a plurality of spin device elements 14 are formed on a single deformable base plate 12. In the configuration illustrated in FIG. 23A, one block includes spin device elements 14 in eight rows and two columns. It should be also noted that FIG. 23A does not illustrate lower and upper electrodes coupled with each spin device element 14 for simplicity of the figure.

Since the magnitude of the strain in each spin device element 14 is increased as the spin device element 14 is closer to the fixed ends of the deformable base plate 12, it is preferable that the number of the spin device elements 14 arrayed in the direction between the fixed ends (that is, the X-axis direction) is relatively reduced and the number of the spin device elements 14 arrayed in the direction perpendicular to the direction between the fixed ends (that is, the Y-axis direction) is relatively increased. This requirement is satisfied in the structure illustrated in FIG. 23A, in which spin device elements 14 are arrayed in two columns in the X-axis direction and in eight rows in the Y-axis direction.

In the structure illustrated in FIG. 23A, it is possible to bend the deformable base plate 12 to place the spin device elements 14 formed on the deformable base plate 12 into the "half-select" state, by applying electric fields to the piezoelectric layers 24 and 25 with the electrodes coupled with the piezoelectric layers 24 and 25 (the electrode layers 26, 27 and the additional electrode layers (not illustrated)). It is possible to achieve data writing into a selected one of the spin device elements 14 by feeding a write signal to the selected spin device element 14 in the state in which the spin device elements 14 formed on the deformable base plate 12 are placed in the "half-select" state.

Figure 23B:
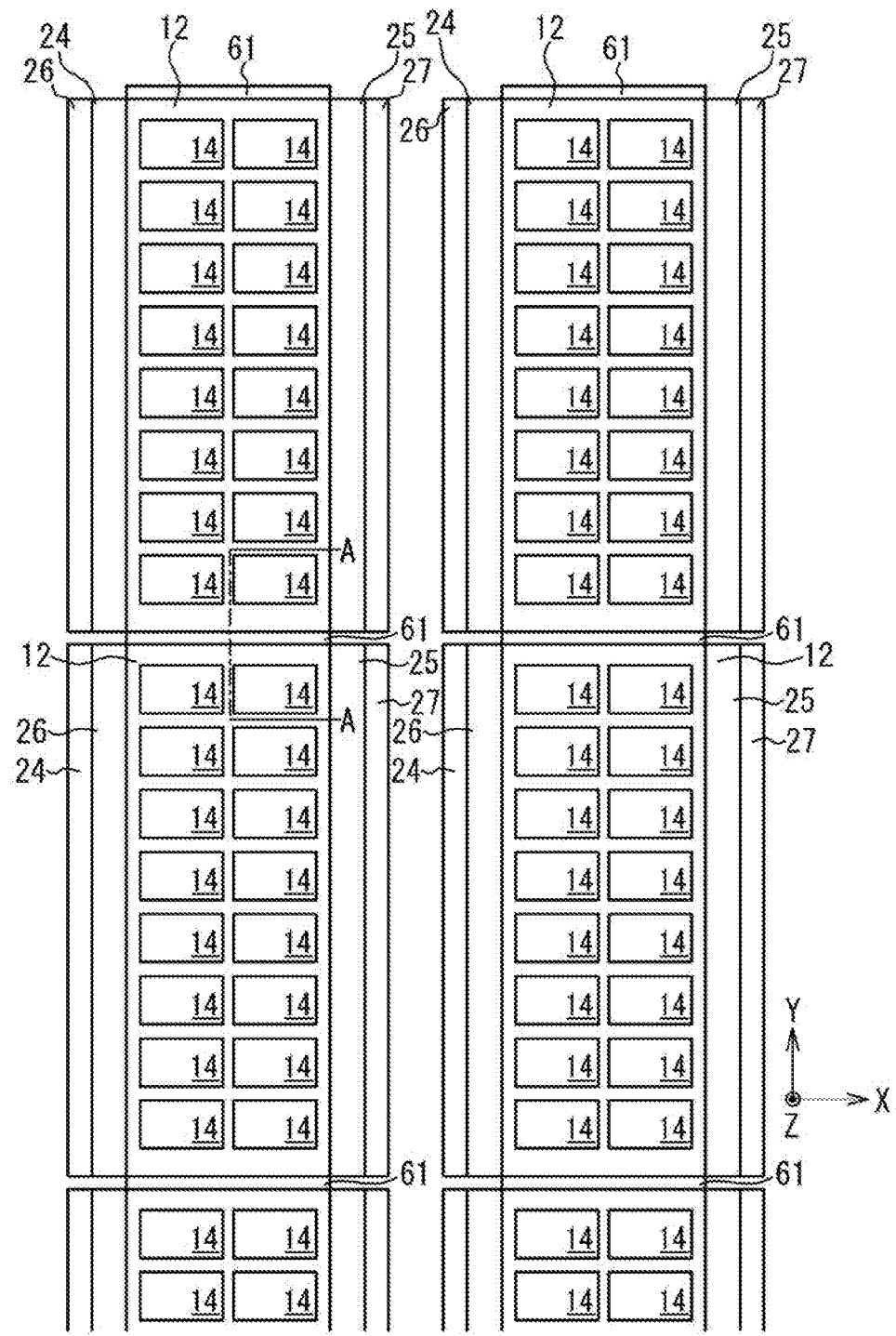
FIG. 23B is a plan view illustrating one example of the structure of a memory cell array incorporating a plurality of blocks each structured as illustrated in FIG. 23A.

FIG. 23B is a plan view illustrating one example of the structure of a memory cell array incorporating a plurality of blocks each structured as illustrated in FIG. 23A, which are arrayed in rows and columns. In this arrangement, the deformable base plates 12, on each of which a plurality of spin device elements 14 are formed, are also arrayed in rows and columns.

Figure 23C:
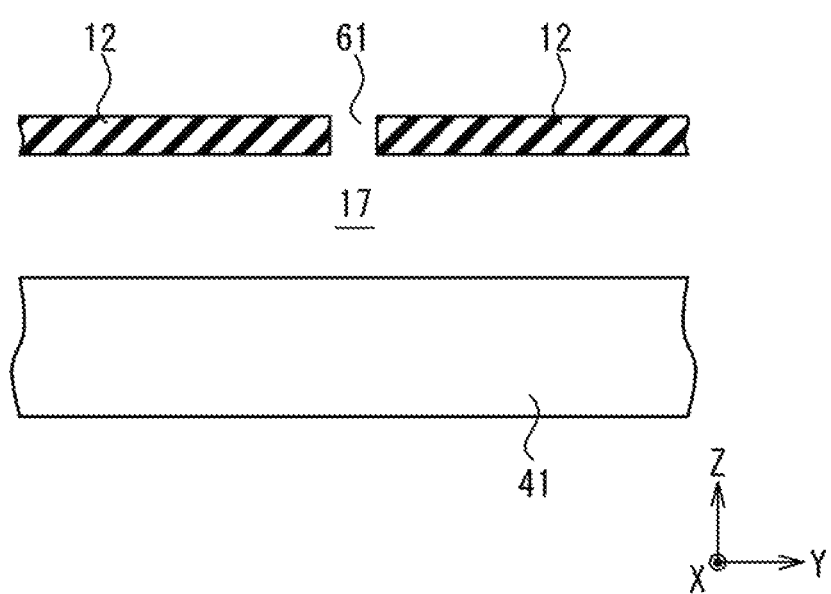
FIG. 23C is a cross-sectional view schematically illustrating the structure of the memory cell array on the section A-A indicated in FIG. 23B.

Every two deformable base plates 12 adjacent to each other in the Y-axis direction are separated by a gap 61. The gap 61 is a space which is not filled with solid substance, as is the case with the space 17. FIG. 23C is a cross-sectional view schematically illustrating the structure on the section A-A indicated in FIG. 23B. Two deformable base plates 12 adjacent to each other in the Y-axis direction are opposed across the gap 61. The gap 61 is formed to communicate with the space 17. In this structure, the side surfaces facing the Y-axis directions of the deformable base plates 12 are structured as free ends. Furthermore, the two deformable base plates 12 adjacent to each other in the Y-axis direction are mechanically separated and this allows separately placing memory cells of two individual blocks adjacent in the Y-axis direction into the half-select state.

One example of dimensions of the respective components of the block illustrated in FIG. 23A is as follows: The length of the deformable base plate 12 (from one fixed end to the other) may measure 30 to 200 nm in the X-axis direction and the length of the deformable base plate 12 (from one free end to the other) may measure 150 nm to 3 μm in the Y-axis direction. It is preferable that the distance between the fixed ends of the deformable base plate 12 is shorter than the distance between the free ends. This is because the sign of the stress may be reversed in the direction between the fixed ends as illustrated in FIG. 9A and this makes it impractical to place a large number of memory cells (spin device elements) between the fixed ends while the change in the stress is reduced in the direction between the free ends and this allows placing a large number of memory cells (spin device elements) between the free ends. It is practical to place one to four, most preferably, two memory cells between the fixed ends while a large number of memory cells, for example, one to a thousand memory cells may be placed between the free ends.

Figure 24:
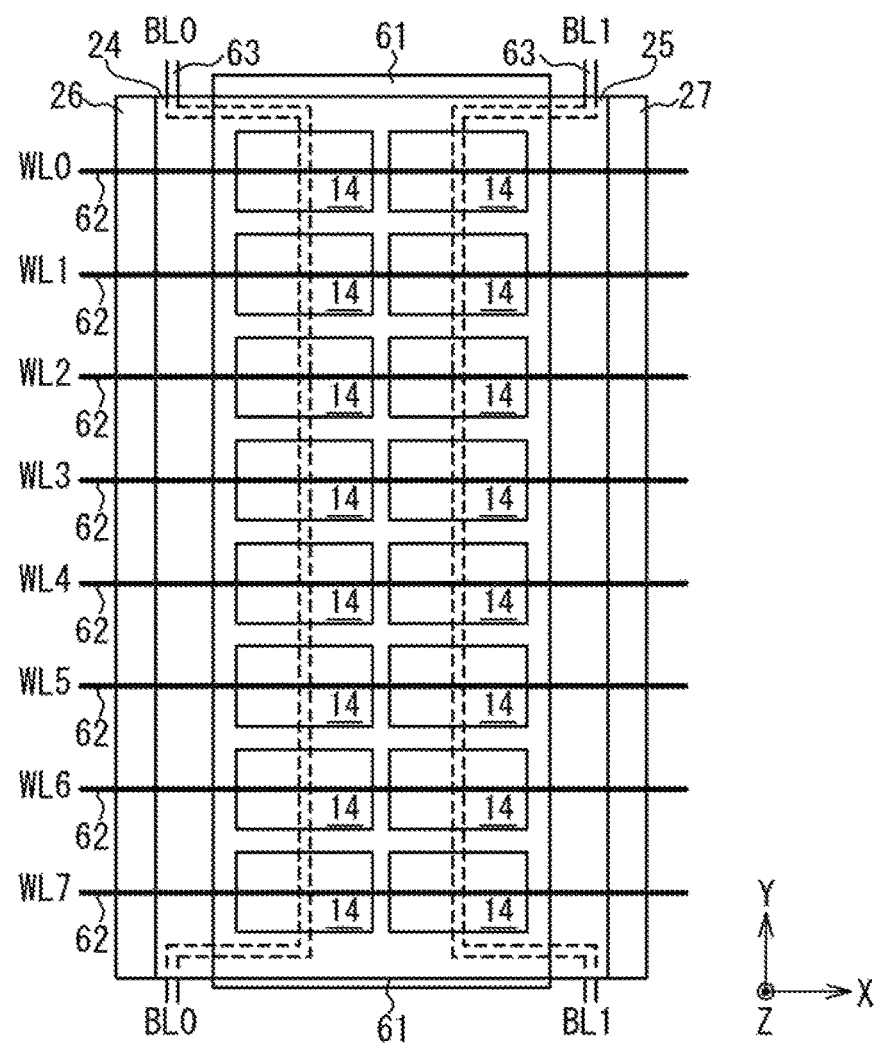
FIG. 24 is a plan view illustrating one example of the interconnection routing in each block of the memory cell array in one embodiment.

In the structure in which two deformable base plates 12 adjacent in the Y-axis direction are separated by a gap 61 as illustrated in FIGS. 23B and 23C, it is preferable to route interconnections connected with the spin device elements 14 so as to bypass the gap 61. FIG. 24 is a plan view illustrating one example of the structure of each block in an arrangement in which interconnections connected with the spin device elements 14 are routed to bypass gaps 61, and FIG. 25 is a plan view illustrating one example of the structure of the memory cell array in which the blocks thus structured are arrayed in rows and columns.

Figure 25:
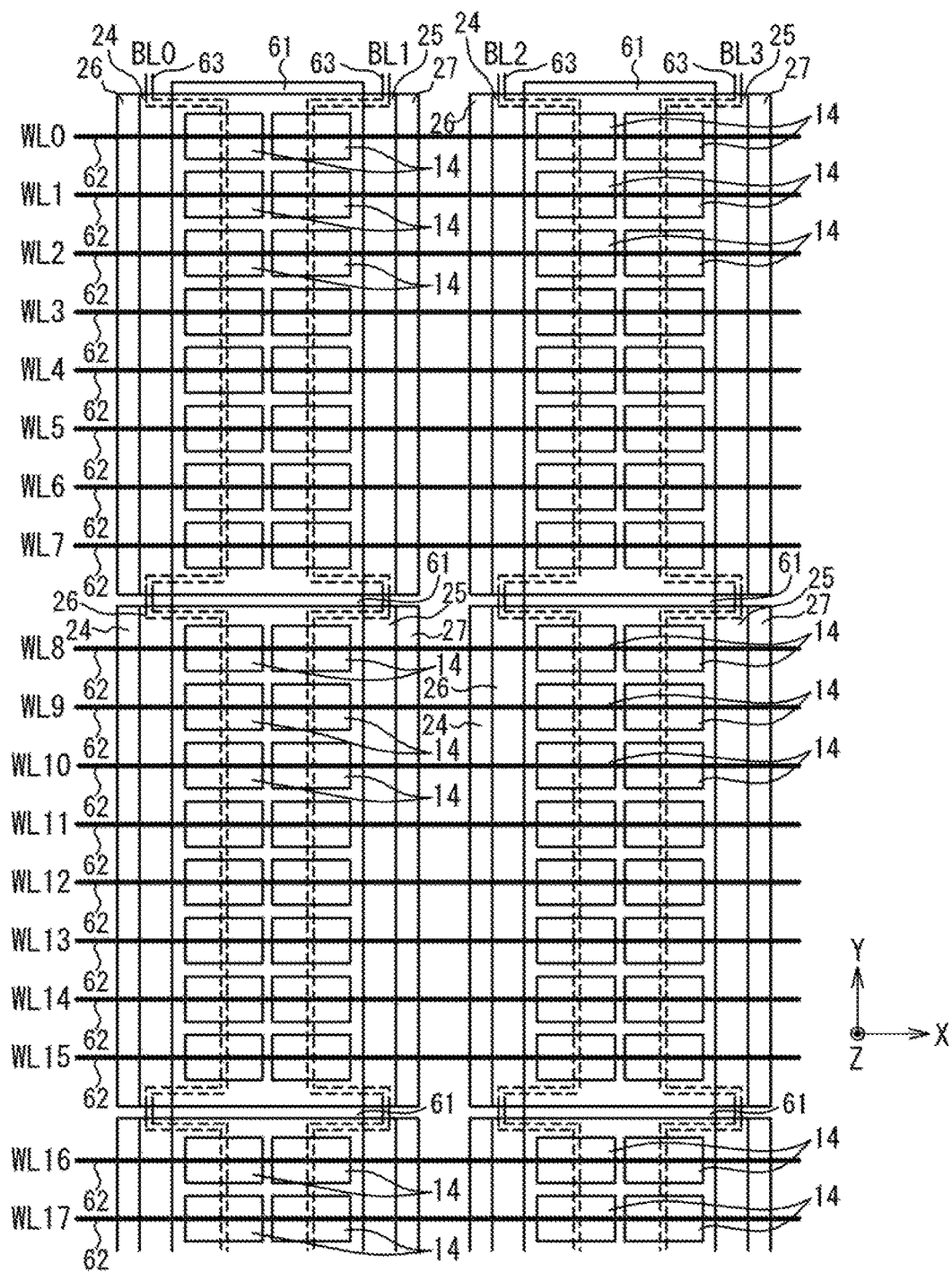
FIG. 25 is a plan view illustrating one example of the interconnection routing in the memory cell array in one embodiment.

Arranged in the memory cell array are word lines 62 and bit lines 63. Each word line 62 is connected with upper electrodes coupled with the upper surfaces of corresponding spin device elements 14 and extended in the X-axis direction. Each word line 62 is located over the corresponding spin device elements 14. Each bit line 63 is, on the other hand, connected with lower electrodes coupled with the lower surfaces of corresponding spin device elements 14 and extended in the Y-axis direction as a whole. Each bit line 63 is located under the corresponding spin device elements 14;

In FIGS. 24 and 25, each bit line 63 is accordingly indicated by a broken line. The bit lines 63 are also routed to bypass the gaps 61. The bit lines 63 may be embedded in the deformable base plates 12 and the piezoelectric layers 24 and 25.

Figure 26:
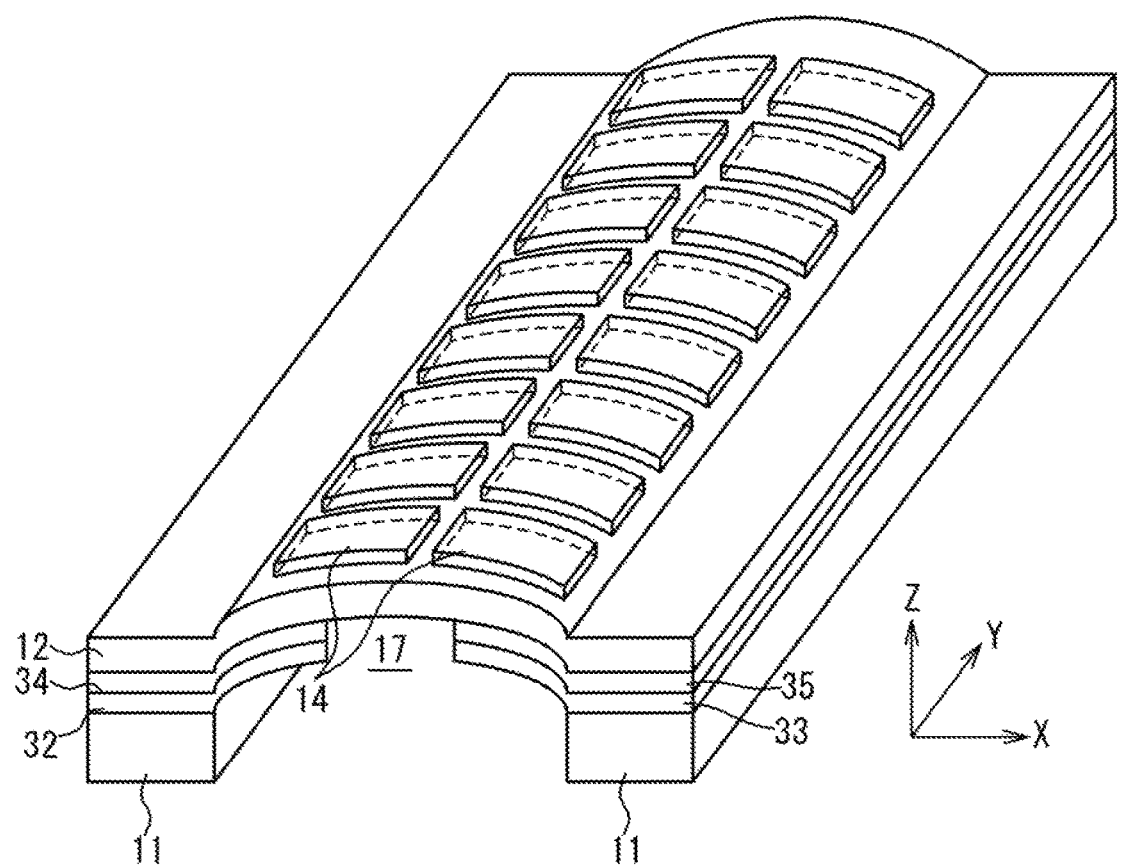
FIG. 26 is a perspective view illustrating another example of the structure of each block in the memory cell array in one embodiment.

FIG. 26 is a perspective view illustrating another example of the structure of each block in the memory cell array. In the structure illustrated in FIG. 26, piezoelectric layers 32 and 33 are coupled with the upper surface of a fixture base 11 and electrode layers 34 and 35 are formed on the upper surfaces of the piezoelectric layers 32 and 33, respectively. An additional electrode layer (not illustrated) may be coupled with the piezoelectric layer 32, on which a potential difference is generated with respect to the electrode layer 34. Correspondingly, an additional electrode layer (not illustrated) may be coupled with the piezoelectric layer 33, on which a potential difference is generated with respect to the electrode layer 35. The piezoelectric layers 32, 33 and the electrode layers 34 and 35 are formed to extend in the Y-axis direction. A deformable base plate 12 is coupled with the upper surfaces of the electrode layers 34 and 35. The stack structure of the piezoelectric layer 32 and the electrode layer 34 and the stack structure of the piezoelectric layer 33 and the electrode layer 35 are separated from each other. A plurality of spin device elements 14 are arrayed in rows and columns on the upper surfaces of the deformable base plate 12. The lower surface of the deformable base plate 12 faces a space 17 which is not filled with solid substance.

One example of dimensions of the respective components of the block illustrated in FIG. 26 is as follows: The length of the deformable base plate 12 (from one fixed end to the other) may measure 30 to 200 nm in the X-axis direction and the length of the deformable base plate 12 (from one free end to the other) may measure 150 nm to 3 μm in the Y-axis direction. It is preferable that the distance between the fixed ends of the deformable base plate 12 is shorter than the distance between the free ends as is the case with the structure illustrated in FIG. 23A. It is practical to place one to four, most preferably, two memory cells between the fixed ends while a large number of memory cells, for example, one to a thousand memory cells may be placed between the free ends.

The structure illustrated in FIG. 26 is configured to bend the deformable base plate 12 and to thereby place the spin device elements 14 formed on the deformable base plate 12 into the "half-select" state, by applying electric fields to the piezoelectric layers 32 and 33 with the electrodes coupled with the piezoelectric layers 32 and 33 (the electrode layers 34, 35 and the additional electrode layers (not illustrated)). It is possible to achieve data writing into a selected one of the spin device elements 14 by feeding a write signal to the selected spin device element 14 in the state in which the spin device elements 14 formed on the deformable base plate 12 are placed in the "half-select" state.

Figure 27:
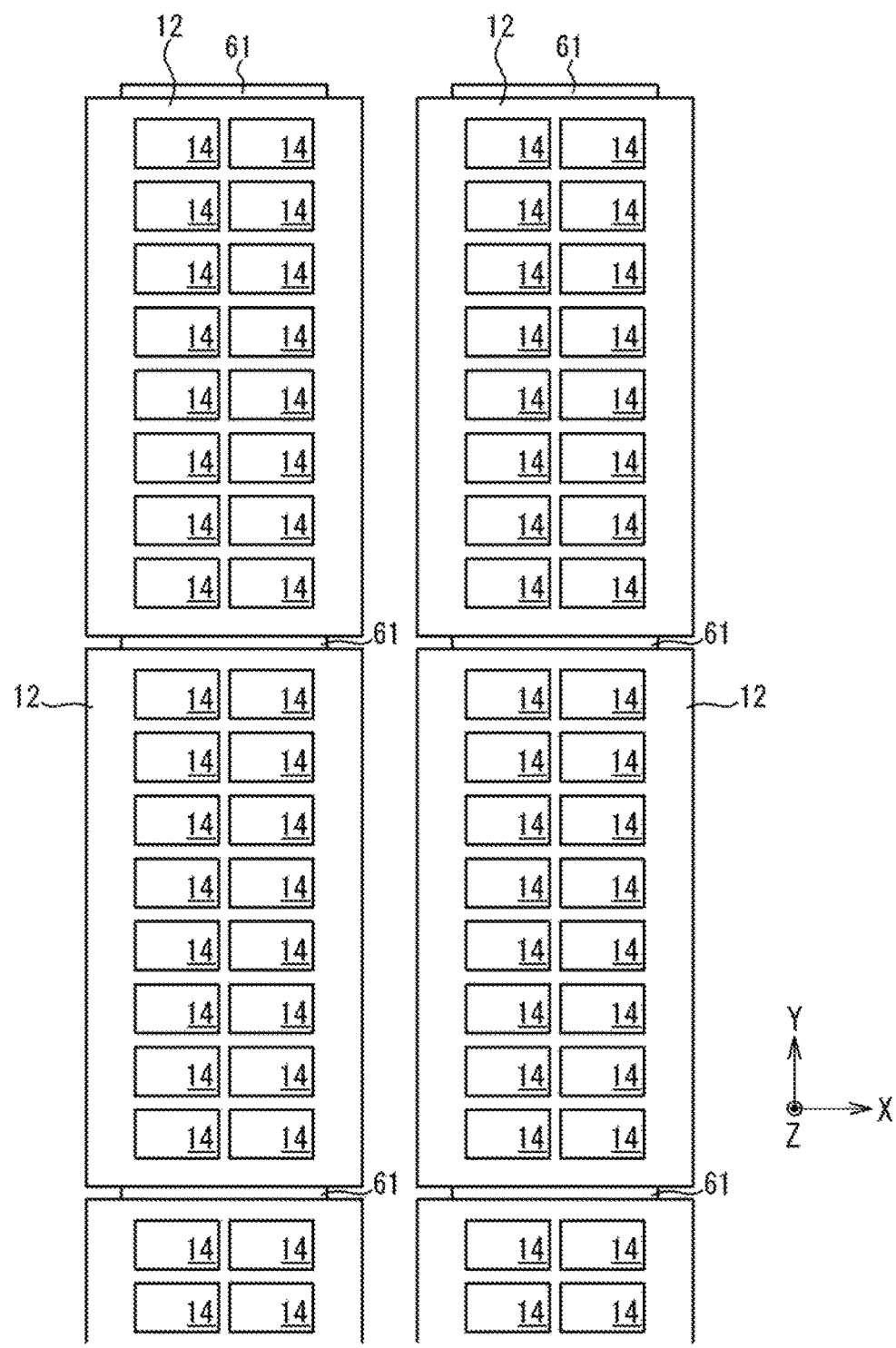
FIG. 27 is a plan view illustrating one example of the structure of a memory cell array incorporating a plurality of blocks each structured as illustrated in FIG. 26 in one embodiment.

FIG. 27 is a plan view illustrating one example of the structure of a memory cell array incorporating a plurality of blocks each structured as illustrated in FIG. 26, which are arrayed in rows and columns. In the structure illustrated in FIG. 27, the blocks each structured as illustrated in FIG. 26 are arrayed in rows and columns. In this arrangement, the deformable base plates 12, on each of which a plurality of spin device elements 14 are formed, are also arrayed in rows and columns.

Every two deformable base plates 12 adjacent to each other in the Y-axis direction are separated by a gap 61. The gap 61, which is a space which is not filled with solid substance as is the case with the space 17, is formed to communicate with the space 17. In this structure, two deformable base plates 12 adjacent to each other in the Y-axis direction are mechanically separated and this allows separately placing memory cells of two individual blocks adjacent in the Y-axis direction into the half-select state.

The structure of the memory cell array illustrated in FIGS. 26 and 27 allows reducing the distance between two deformable base plates 12 adjacent in the X-axis direction, since the piezoelectric layers 32, 33 and the electrode layers 34 and 35 are located below the deformable base plates 12. This effectively improves the integration density of the memory cells.

Figure 28:
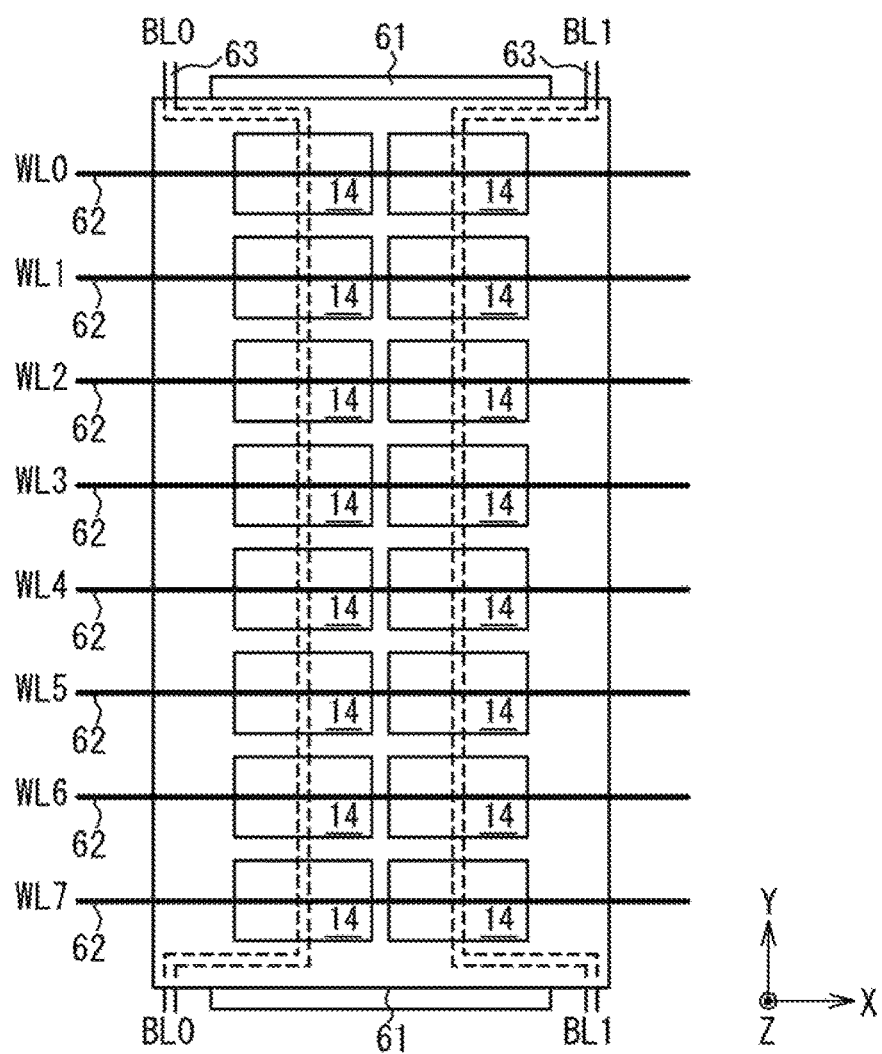
FIG. 28 is a plan view illustrating another example of the interconnection routing in each block of the memory cell array in one embodiment.

Also in the memory cell array structure illustrated in FIGS. 26 and 27, two deformable base plates 12 adjacent in the Y-axis direction are separated by a gap 61 and interconnections connected with the spin device elements 14 are routed to bypass the gap 61. FIG. 28 is a plan view illustrating one example of the structure of each block in the case when the interconnections connected with the spin device elements 14 are formed to bypass the gap 61, and FIG. 29 is a plan view illustrating one example of the structure of the memory cell array in which the blocks thus structured are arrayed in rows and columns.

Figure 29:
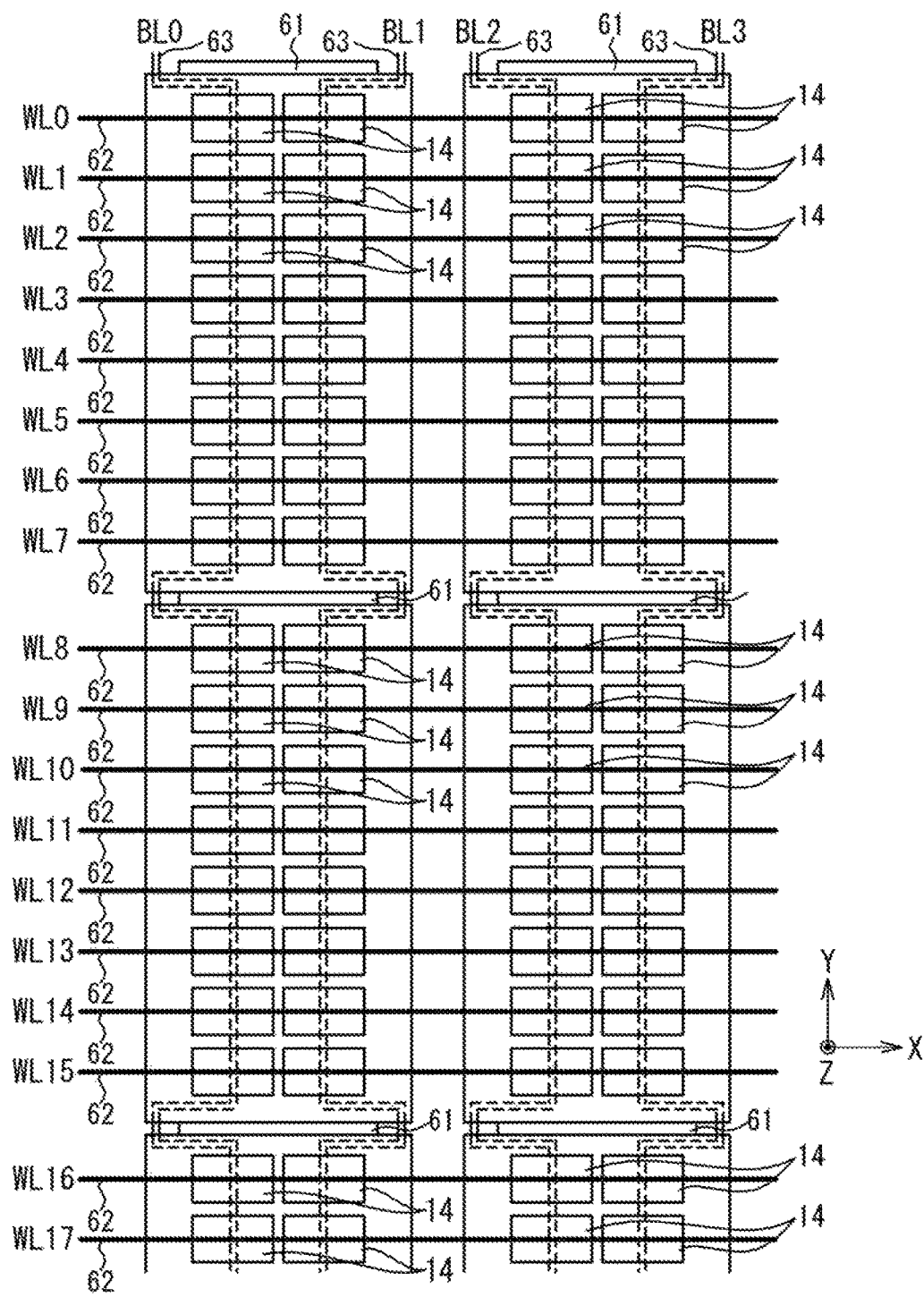
FIG. 29 is a plan view illustrating another example of the interconnection routing in the memory cell array incorporating a plurality of blocks each structured as illustrated in FIG. 28 in one embodiment.

Also in the structure illustrated in FIGS. 28 and 29, each word line 62 is connected with upper electrodes coupled with the upper surfaces of corresponding spin device elements 14 and extended in the X-axis direction. This means that each word line 62 is located over the corresponding spin device elements 14. Each bit line 63 is, on the other hand, connected with lower electrodes coupled with the lower surfaces of corresponding spin device elements 14 and extended in the Y-axis direction as a whole. Each bit line 63 is located under the corresponding spin device elements 14; in FIGS. 28 and 29, each bit line 63 is accordingly indicated by a broken line. The bit lines 63 are routed to bypass the gaps 61. The bit lines 63 may be embedded in the deformable base plates 12.

Figure 30:
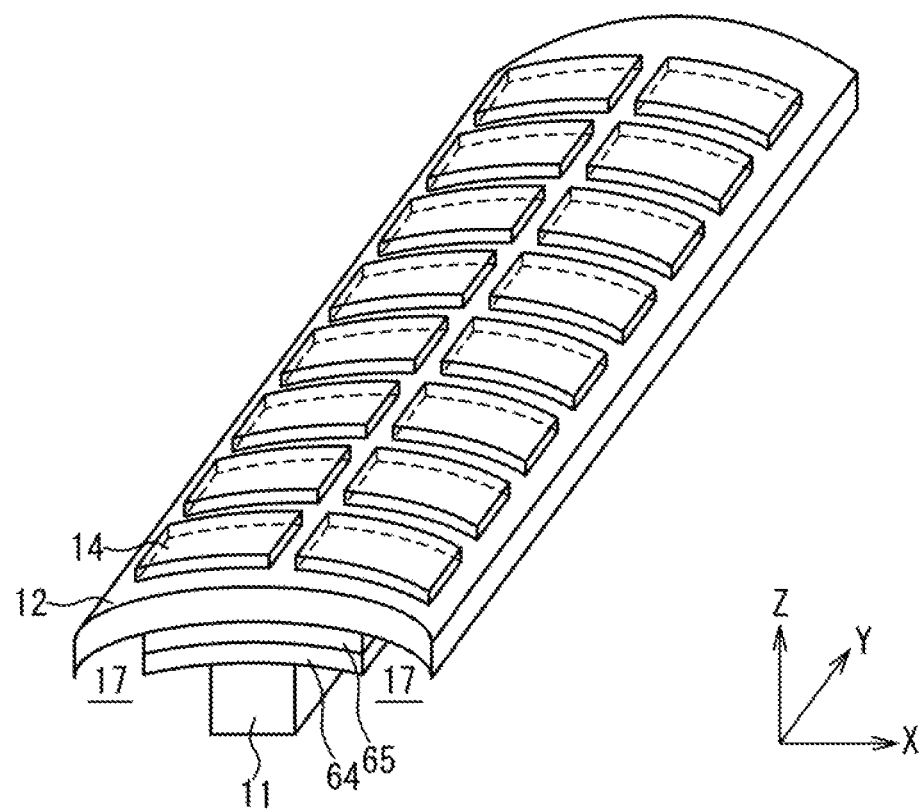
FIG. 30 is a perspective view illustrating still another example of the structure of each block of the memory cell array in one embodiment.

FIG. 30 is a perspective view illustrating still another example of the structure of each block of the memory cell array. In the structure illustrated in FIG. 30, a piezoelectric layer 64 is formed on the upper surface of a fixture base 11 and an electrode layer 65 is formed on the upper surface of the piezoelectric layer 64. An additional electrode layer (not illustrated) may be coupled with the piezoelectric layer 64, on which a potential difference is generated with respect to the electrode layer 65. The piezoelectric layer 64 and the electrode layer 65 are both formed to extend in the Y-axis direction. A deformable base plate 12 is coupled with the upper surface of the electrode layer 65. A plurality of spin device elements 14 are arrayed in rows and columns on the upper surface of the deformable base plate 12.

In the structure illustrated in FIG. 30, the stack structure of the piezoelectric layer 64 and the electrode layer 65 is coupled with the lower surface of the deformable base plate 12 at an intermediate position in the X-axis direction. It should be noted here that the lower surface of the deformable base plate 12 is partially coupled with the stack structure of the piezoelectric layer 64 and the electrode layer 65, and therefore the lower surface of the deformable base plate 12 faces a space 17 which is not filled with solid substance.

When the deformable base plate 12 is bent, a strain is generated in the piezoelectric layer 64 by applying an electric field by using the electrode layer 65 (and the additional electrode layer coupled with the piezoelectric layer 64). It is possible to bend the deformable base plate 12 by using the strain of the piezoelectric layer 64 to place the spin device elements 14 formed on the deformable base plate 12 into the "half-select" state. It is possible to achieve data writing into a selected one of the spin device elements 14 by feeding a write signal to the selected spin device element 14 in the state in which the spin device elements 14 formed on the deformable base plate 12 are placed in the "half-select" state.

It should be note that the fixture base 11, the piezoelectric layer 64, the electrode layer 65 and the deformable base plate 12 forms a cantilever structure in the structure illustrated in FIG. 30. The use of the cantilever structure effectively increases the displacement of the deformable base plate 12, allowing applying a larger strain to the spin device elements 14.

Figure 31:
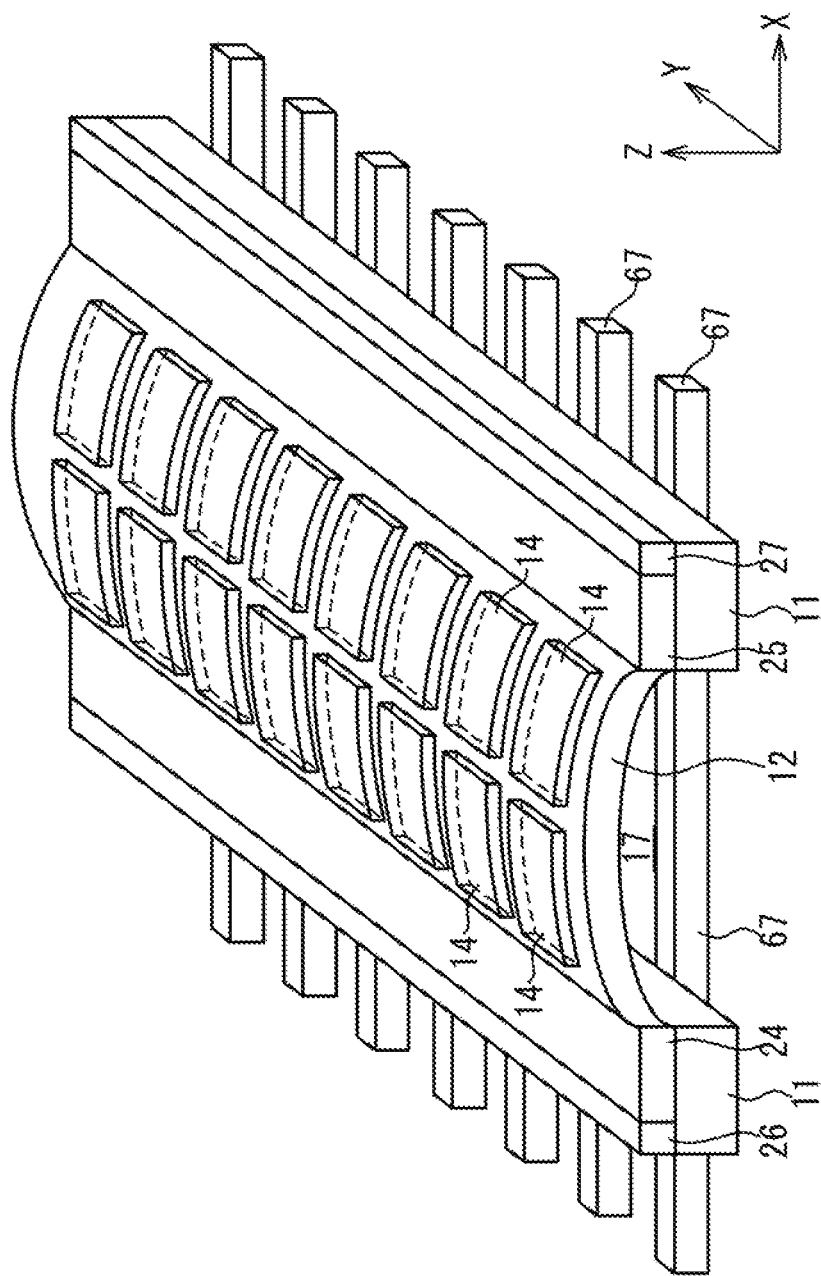
FIG. 31 is a perspective view illustrating still another example of the structure of each block of the memory cell array in one embodiment.

Also in the case when the above-described memory cell array structures are used, data writing into each spin device element 14 (memory cell) may be achieved by using a current-induced magnetic field. In this case, a write current line is disposed in the vicinity of each spin device element 14. FIG. 31 is a perspective view illustrating one example of the structure of each block of the memory cell array in which data writing is achieved by using a current-induced magnetic field, and FIG. 32 is a plan view illustrating the same.

Figure 32:
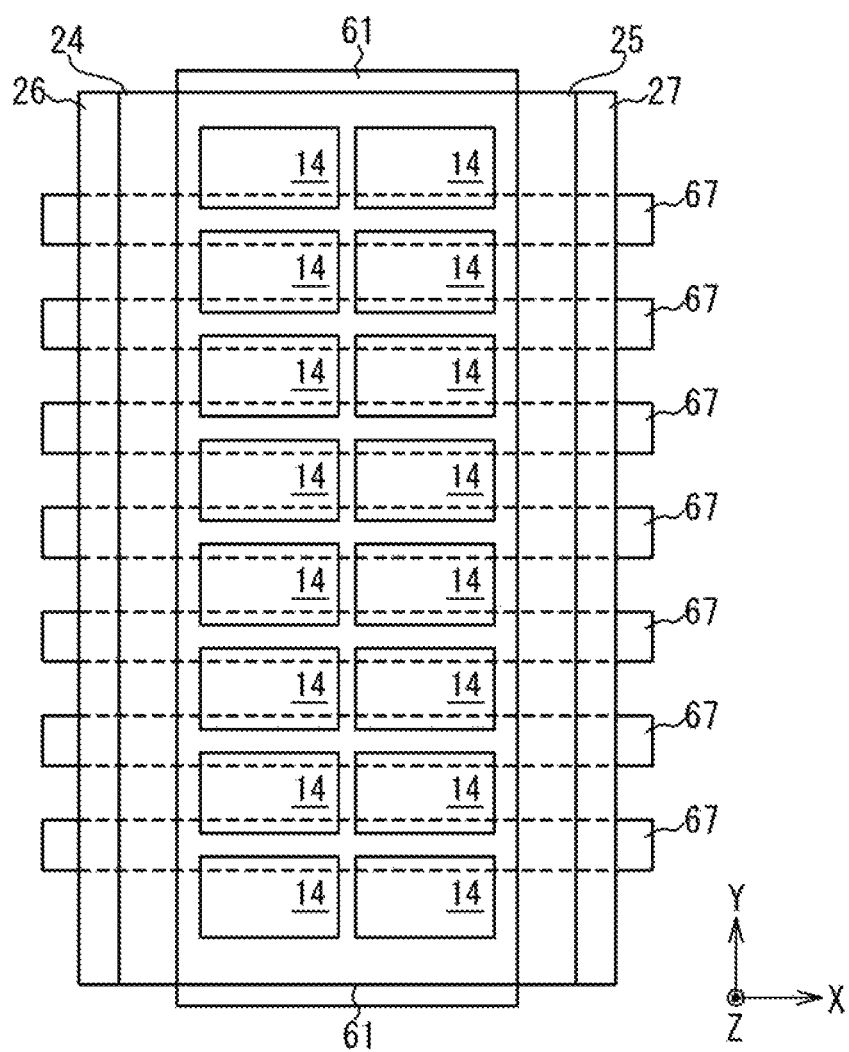
FIG. 32 is a plan view illustrating the structure of each block illustrated in FIG. 31.

The structure of the block illustrated in FIGS. 31 and 32 is almost similar to that illustrated in FIG. 23A. The difference is that write current lines 67 are disposed below the fixture base 11. In the structure illustrated in FIGS. 31 and 32, the write current lines 67 are arrayed in the Y-axis direction. Each write current line 67 is formed to extend in the X-axis direction.

When the structure illustrated in FIGS. 31 and 32 is used, data writing is achieved as follows: In data writing, the deformable base plate 12 is bent by applying an electric field to the piezoelectric layers 24 and 25 to place the spin device elements 14 on the deformable base plate 12 into the "half-select" state. The data writing into a selected spin device element 14 can be achieved by applying a current-induced magnetic field to the selected spin device element 14 through generating a write current through a corresponding one of the write current lines 67 close to the selected spin device element 14, in the state in which the spin device elements 14 formed on the deformable base plate 12 are placed in the "half-select" state.

Figure 33:
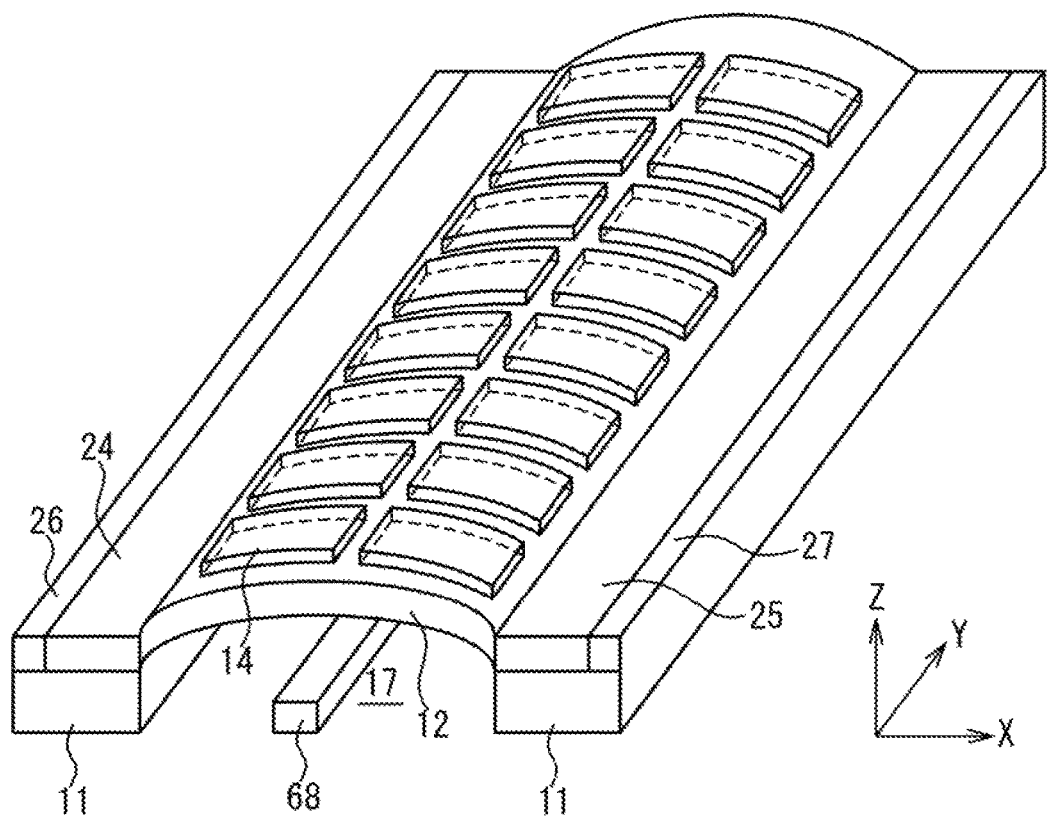
FIG. 33 is a perspective view illustrating still another example of the structure of each block of the memory cell array in one embodiment.

In an alternative embodiment, data erasing may be achieved in units of blocks by disposing a write current line in the vicinity of the spin device elements 14 (memory cells) in each block and applying a current-induced magnetic field to the spin device elements 14 by generating a current through the write current line. FIG. 33 is a perspective view illustrating one example of the structure of each block when data erasing is achieved in units of blocks, and FIG. 34 is a plan view illustrating the same.

Figure 34:
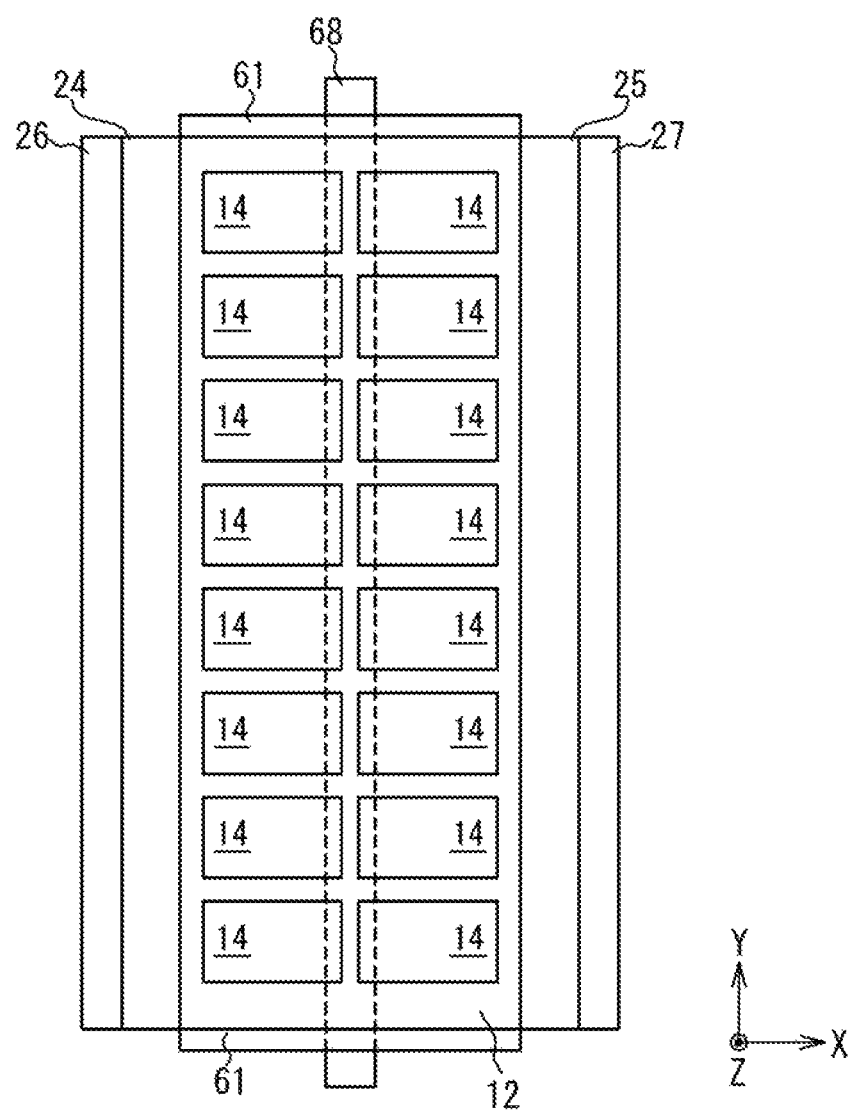
FIG. 34 is a plan view illustrating the structure of each block illustrated in FIG. 33.

The structure of the block illustrated in FIGS. 33 and 34 is almost similar to that illustrated in FIG. 23A. The difference is that a write current line 68 is disposed below the deformable base plate 12. The write current line 68 is disposed to extend in the Y-axis direction. The position of the write current line 68 is adjusted so that a current-induced magnetic field is applied to the spin device elements 14 of the block.

When the structure illustrated in FIGS. 33 and 34 is used, data erasing is achieved in units of blocks through the following procedure: In data erasing, the deformable base plate 12 is bent by applying an electric field to the piezoelectric layers 24 and 25 to place the spin device elements 14 on the deformable base plate 12 into the "half-select" state. The data erasing can be achieved by writing a specific data (data "0", for example) into all the spin device elements 14 on the deformable base plate 12 by generating a current through the write current lines 68 to apply a current-induced magnetic field to the spin device elements 14, in the state in which the spin device elements 14 formed on the deformable base plate 12 are placed in the "half-select" state.

(Packaging of Magnetic Memory)

As discussed above, in order to increase the displacement of the deformable base plate, the magnetic memories of the above-described embodiments are configured so that at least one of the upper and lower surfaces of the deformable base plate faces a space which is not filled with solid substance. Accordingly, the magnetic memories are packaged in a packaging process so that at least one of the upper and lower surfaces of the deformable base plate faces a space which is not filled with solid substance.

Figure 35:
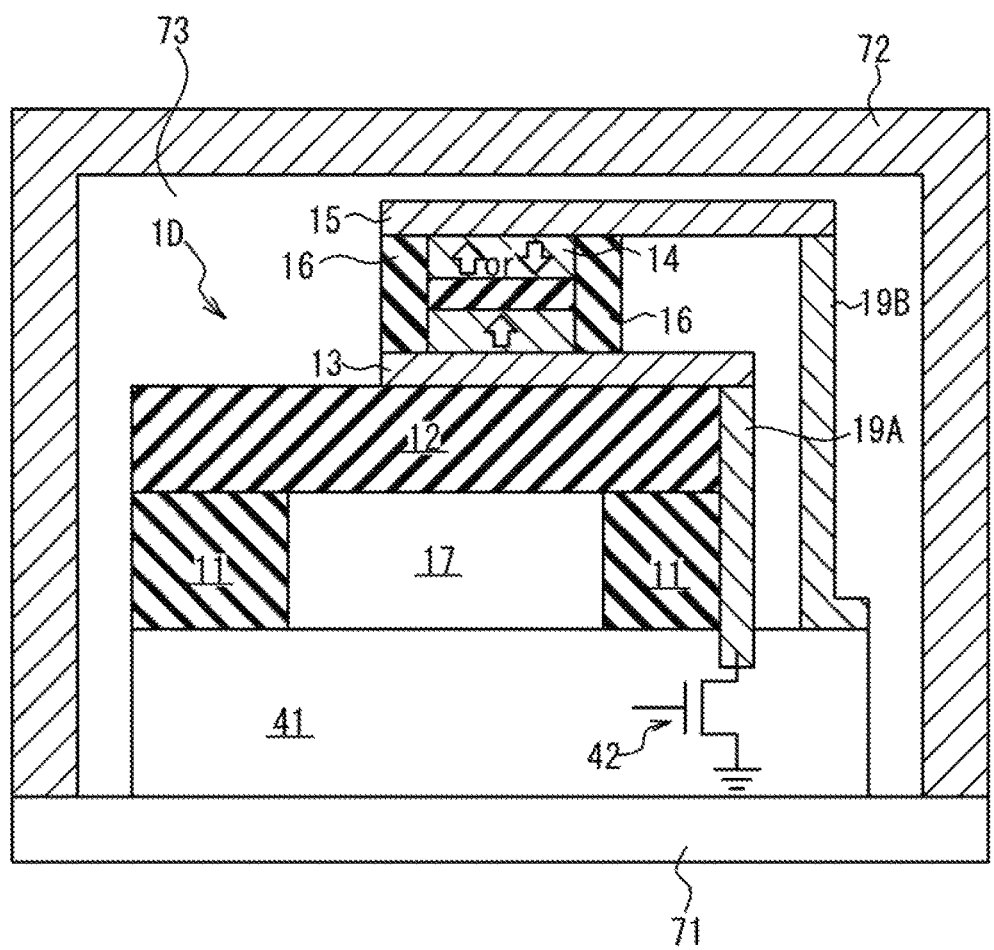
FIG. 35 is a cross-sectional view illustrating one example of the structure of a package in which a magnetic memory is packaged in one embodiment.

FIG. 35 is a cross-sectional view illustrating one example of the structure of a package in which a magnetic memory of one embodiment is packaged. FIG. 35 illustrates the structure of a package in which the magnetic memory 1D illustrated in FIG. 15 is packaged. A person skilled in the art would however appreciate that a magnetic memory of a different structure may be packaged in a similar manner.

In the package structure illustrated in FIG. 35, the lower surface of the semiconductor substrate 41 of the magnetic memory 1D is coupled with the upper surface of a mount substrate 71. A cap 72 is further coupled with the mount substrate 71 to entirely cover the magnetic memory 1D. The mount substrate 71 and the cap 72 are coupled with each other so that an enclosed space 73 is formed therebetween. In one embodiment, the mount substrate 71 and the cap 72 are coupled so that the enclosed space 73 is not filled with solid substance. Gas such as air and nitrogen may be sealed in the enclosed space 73 and other fluids may be sealed in the enclosed space 73. Alternatively, the enclosed space 73 may be vacuumed. This allows enclosing the magnetic memory 1D in a package so that the state is kept in which the lower surface of the deformable base plate 12 faces the space 17 which is not filled with solid substance.

Although undesirably increasing the cost, the vacuuming of the enclosed space 73 brings about the following merits: First, the vacuuming of the enclosed space 73 is advantageous for achieving a high-speed operation of the deformable base plate 12 and reducing the power consumption, since the vacuuming eliminates an effect of damping caused by air in the mechanical operation of the deformable base plate 12 (if air exists, this undesirably causes an air damping effect). The vacuuming of the enclosed space 73 also avoids an influence on the deformable base plate 12 of the ambient air temperature, improving the stability of the mechanical operation of the deformable base plate 12. It is preferable to select the structure in which air is left in the enclosed space 73 to reduce the cost or the structure in which the enclosed space 73 is vacuumed to improve the performance, depending on applications.

Alternatively, light element gas, such as helium, may be sealed into the enclosed space 73.

In one embodiment, a magnetic memory and a processing circuit (logic circuit) may be monolithically integrated, that is, integrated on the same semiconductor substrate. FIG. 36 is a sectional-view illustrating the structure of a semiconductor integrated circuit thus structured. Illustrated in FIG. 36 is the structure of a semiconductor integrated circuit in which a processing circuit and the magnetic memory 1D illustrated in FIG. 15 are monolithically integrated.

In the semiconductor integrate circuit illustrated in FIG. 36, a semiconductor substrate 41 includes a memory section 74 and a processing circuit section 75. Transistors used in the magnetic memory 1D are integrated in the memory section 74 of the semiconductor substrate 41. In FIG. 36, a transistor 42 connected with a lower electrode 13 of the magnetic memory 1D is illustrated. Transistors used in the processing circuit are, on the other hand, integrated in the processing circuit section 75. In FIG. 36, a transistor 43 of the processing circuit is illustrated.

Figure 37A:
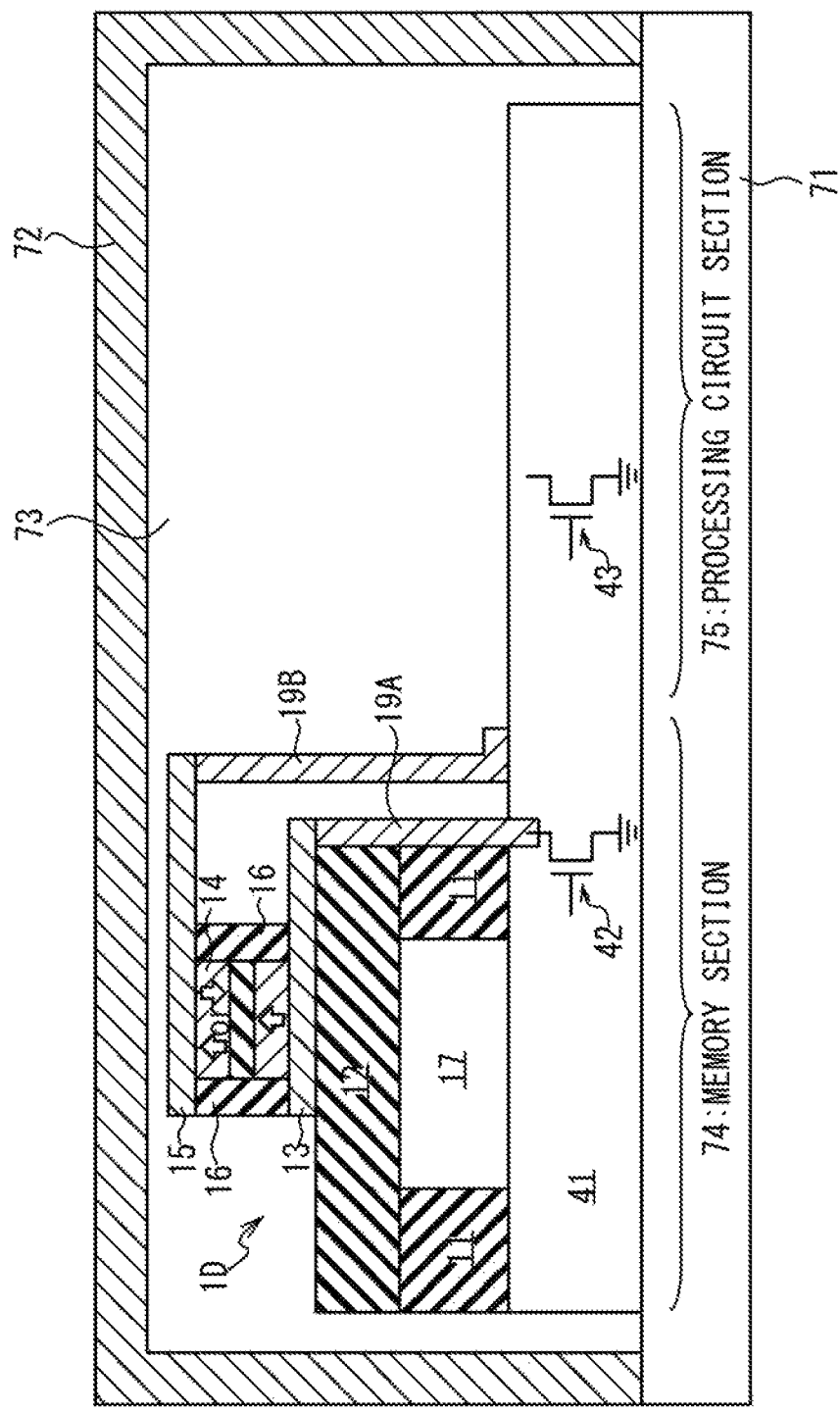
FIG. 37A is a cross-sectional view illustrating one example of a package in which the semiconductor integrated circuit illustrated in FIG. 36 is packaged.

Also in the case when the magnetic memory and the processing circuit (logic circuit) are monolithically integrated, the semiconductor integrate circuit is packaged so that at least one of the upper and lower surfaces of the deformable base plate of the magnetic memory faces a space which is not filled with solid substance. FIG. 37A is a cross-sectional view illustrating one example of a package in which the semiconductor integrated circuit illustrated in FIG. 36 is packaged.

Also in the package structure illustrated in FIG. 37A, the lower surface of the semiconductor substrate 41 is coupled with the upper surface of a mount substrate 71. A cap 72 is further coupled with the mount substrate 71 so that an enclosed space 73 is formed between the mount substrate 71 and the cap 72. In one embodiment, the mount substrate 71 and the cap 72 are coupled so that the enclosed space 73 is not filled with solid substance. This allows enclosing the semiconductor integrated circuit illustrated in FIG. 36 into a package so that the state is kept in which the lower surface of the deformable base plate 12 faces the space 17 which is not filled with solid substance.

Figure 37B:
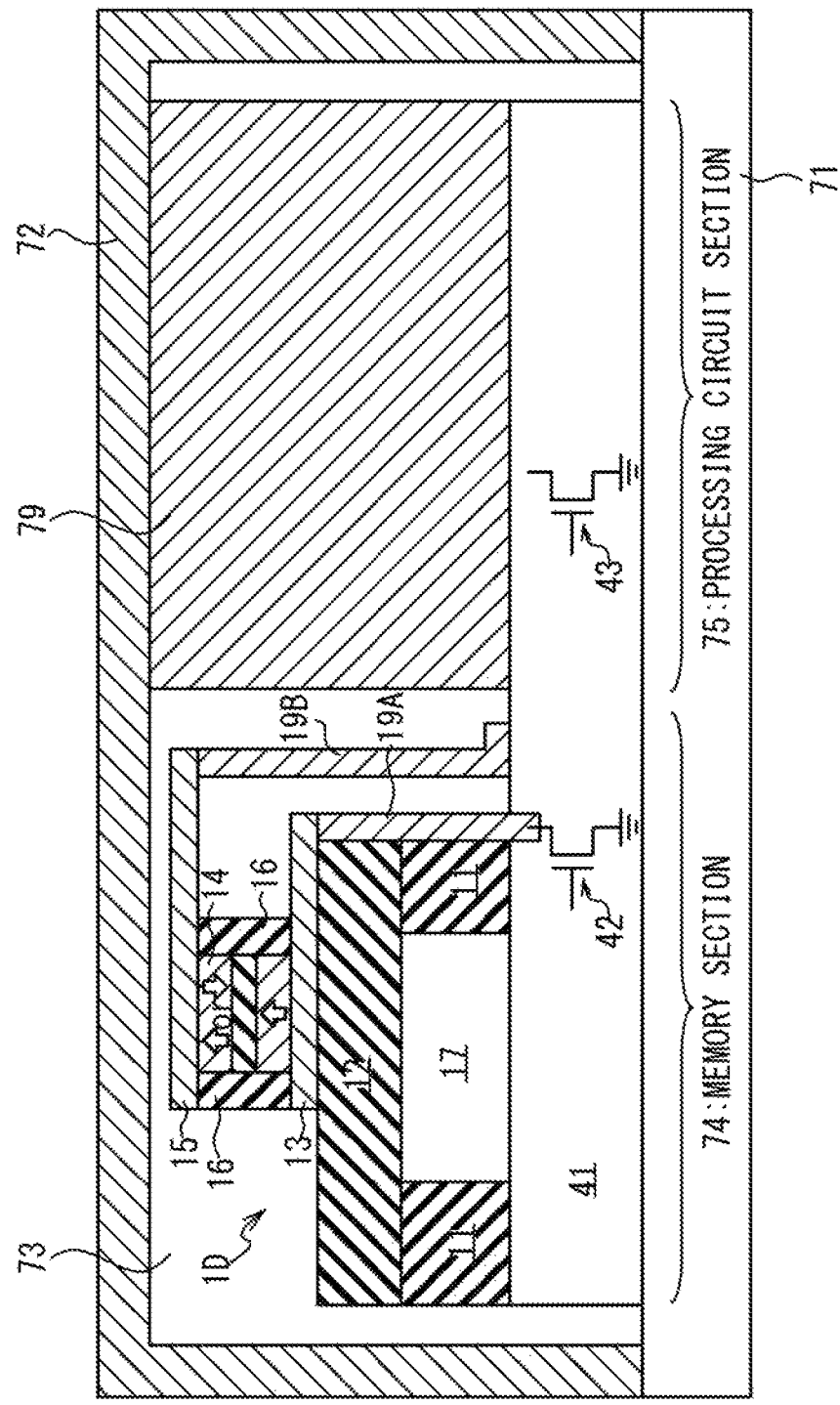
FIG. 37B is a cross-sectional view illustrating another example of a package in which the semiconductor integrated circuit illustrated in FIG. 36 is packaged.

When the enclosed space 73 is filled with gas, such as air, or vacuumed, this may undesirably deteriorate the heat radiation from the processing circuit integrated in the processing circuit section 75 of the semiconductor substrate 41. To avoid such deterioration of the heat radiation, as illustrated in FIG. 37B, it is preferable that a heat conduction member 79 formed with high heat conductivity material such as metal is coupled with the processing circuit section 75. It is preferable that the heat conduction member 79 is further coupled with the cap 72. In this case, it is preferable that the cap 72 is formed with high heat conductivity material, such as metal.

In an alternative embodiment, in order to offer a product for a specific application, a magnetic memory and a processing circuit (logic circuit) may be integrated in separate chips and the chips may be electrically connected with each other with appropriate connection means (such as, bonding wires). FIG. 38 is a cross-sectional view illustrating a semiconductor device thus structured. Illustrated in FIG. 38 is a semiconductor device in which the magnetic memory 1D illustrated in FIG. 15 and a processing circuit are integrated in separate chips.

The semiconductor device illustrated in FIG. 38 includes a memory chip 76 and a processing circuit chip 77. The magnetic memory 1D is integrated in the memory chip 76 and the processing circuit is integrated in the processing circuit chip 77. The processing circuit includes a transistor 45 integrated in the semiconductor substrate 44. The memory chip 76 and the processing circuit chip 77 are electrically connected with one or more wires 78. Although only one wire 78 is illustrated in FIG. 38, a person skilled in the art would appreciate that the memory chip 76 and the processing circuit chip 77 may be connected with a desired number of wires 78.

Figure 39A:
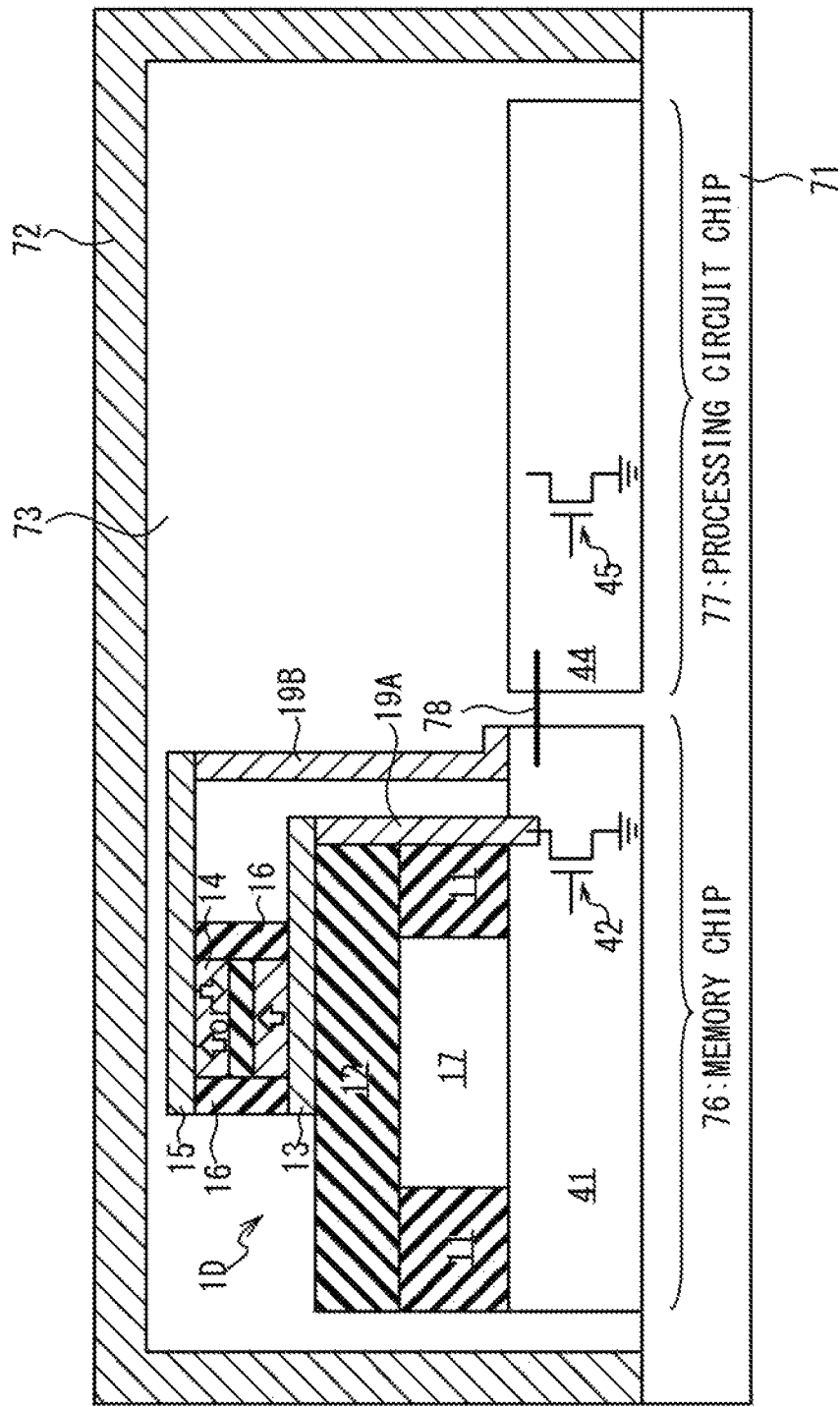
FIG. 39A is a cross-sectional view illustrating one example of the structure of a package in which the semiconductor device illustrated in FIG. 38 is packaged.

Also in the case when a magnetic memory and a processing circuit are integrated in separate chips, the semiconductor device is desirably packaged so that at least one of the upper and lower surfaces of the deformable base plate of the magnetic memory faces a space which is not filled with solid substance. FIG. 39A is a cross-sectional view illustrating the structure of a package in which the semiconductor device illustrated in FIG. 38 is packaged.

In the structure of the package illustrated in FIG. 39A, the memory chip 76 and the processing circuit chip 77 are mounted on the mount substrate 71. More specifically, the lower surfaces of the semiconductor substrate 41 of the memory chip 76 and the semiconductor substrate 44 of the processing circuit chip 77 are coupled with the upper surface of the mount substrate 71. A cap 72 is further coupled with the mount substrate 71 so that an enclosed space 73 is formed between the mount substrate 71 and the cap 72. In one embodiment, the mount substrate 71 and the cap 72 are coupled so that the enclosed space 73 includes a cavity which is not filled with solid substance. This allows enclosing the semiconductor device illustrated in FIG. 38 in a package so that the state is kept in which the lower surface of the deformable base plate 12 faces the space 17 which is not filled with solid substance.

As is the case with the package illustrated in FIG. 37A, when the enclosed space 73 is filled with gas, such as air, or vacuumed, this may undesirably deteriorate the heat radiation from the processing circuit integrated in the processing circuit chip 77. To avoid such deterioration of the heat radiation, as illustrated in FIG. 39B, it is preferable that a heat conduction member 79 formed with high heat conductivity material such as metal is coupled with the processing circuit chip 77. It is preferable that the heat conduction member 79 is further coupled with the cap 72. In this case, it is preferable that the cap 72 is formed with high heat conductivity material, such as metal.

Embodiments of the present invention can be also described as the following supplementary notes:

(Supplementary Note 1)

A magnetic memory, including:

a deformable base plate;

at least one spin device element coupled with the deformable base plate and storing a data as a magnetization direction; and a bending mechanism to bend the deformable base plate, wherein at least one of the upper and lower surfaces of the deformable base plate faces a space which is not filled with solid substance.

(Supplementary Note 2)

A data writing method into a magnetic memory including a deformable base plate; at least one spin device element coupled with the deformable base plate and storing a data as a magnetization direction; and a bending mechanism wherein at least one of the upper and lower surfaces of the deformable base plate faces a space which is not filled with solid substance, the method including:

writing a data into the spin device element by feeding a write signal to the spin device element in the state in which the deformable base plate is bent by the bending mechanism.

(Supplementary Note 3)

A method of manufacturing a magnetic memory, including:

forming a sacrificial layer on a semiconductor substrate in which a transistor is integrated;

forming a deformable base plate on the sacrificial layer;

forming a spin device element on the deformable base plate, the spin device element storing a data as a magnetization direction;

forming a bending mechanism configured to bend the deformable base plate; and forming a space which is not filled with solid substance by removing at least a portion of the sacrificial layer, so that the lower surface of the deformable base plate faces the space.

(Supplementary Note 4)

The method according to supplementary note 3, wherein the bending mechanism is configured to bend the deformable base plate with a piezoelectric effect.

(Supplementary Note 5)

The method according to supplementary note 4, wherein the forming of the bending mechanism includes:

forming a piezoelectric layer coupled with the deformable base plate.

(Supplementary Note 6)

The method according to supplementary note 4, wherein the forming of the bending mechanism includes forming a capacitor electrode, wherein the deformable base plate includes an electrode layer opposed to the capacitor electrode, wherein the bending mechanism is configured to bend the deformable base plate by using a force exerted between the capacitor electrode and the electrode layer when a voltage is applied between the capacitor electrode and the electrode layer.

(Supplementary Note 7)

The method according to supplementary note 4, wherein the spin device element is positioned opposed to the space which is not filled with solid substance, across the deformable base plate.

(Supplementary Note 8)

The method according to supplementary note 7, wherein the spin device element is coupled with the upper surface of the deformable base plate, and wherein the lower surface of the deformable base plate faces the space which is not filled with solid substance.

(Supplementary Note 9)

A semiconductor device, including:

a magnetic memory; and a package incorporating the magnetic memory in an enclosing space formed in the package, wherein the magnetic memory includes:

a deformable base plate;

at least one spin device element coupled with the deformable base plate and storing a data as a magnetization direction; and a bending mechanism to bend the deformable base plate, wherein the enclosed space includes such a cavity that at least one of the upper and lower surfaces of the deformable base plate faces a space which is not filled with solid substance.

(Supplementary Note 10)

The semiconductor device according to supplementary note 9, wherein the magnetic memory is integrated in a memory section of a semiconductor integrated circuit, and wherein a logic circuit is integrated in a processing circuit section of the semiconductor integrated circuit, the memory section and the processing circuit section being monolithically integrated in the semiconductor integrated circuit, and wherein the semiconductor integrated circuit is incorporated in the enclosing space of the package.

(Supplementary Note 11)

The semiconductor device according to supplementary note 10, wherein the enclosed space is filled with gas or vacuumed.

(Supplementary Note 12)

The semiconductor device according to supplementary note 11, further comprising a heat conduction member coupled with the processing circuit section of the semiconductor integrated circuit and formed with high heat conductivity material.

(Supplementary Note 13)

The semiconductor device according to supplementary note 12, wherein the package includes:

a mount substrate on which the semiconductor integrated circuit is mounted; and a cap coupled with the mount substrate to form the enclosed space between the mount substrate and the cap, wherein the heat conduction member is coupled with the cap.

(Supplementary Note 14)

The semiconductor device according to supplementary note 9, further comprising a logic circuit, wherein the magnetic memory is integrated in a first chip, and wherein a logic circuit is integrated in a second chip which is prepared separately from the first chip, the first and second chips being electrically connected with each other with at least one wire, wherein the first and second chips are incorporated in the enclosing space of the package.

(Supplementary Note 15)

The semiconductor device according to supplementary note 14, wherein the enclosed space is vacuumed or filled with gas.

(Supplementary Note 16)

The semiconductor device according to supplementary note 15, further comprising a heat conduction member coupled with the first chip and formed with high heat conductivity material.

(Supplementary Note 17)

The semiconductor device according to supplementary note 16, wherein the package includes:

a mount substrate on which the first and second chips are mounted; and a cap coupled with the mount substrate to form the enclosed space between the mount substrate and the cap, wherein the heat conduction member is coupled with the cap.

Although embodiments of the present invention have been specifically described above, the present invention must not be construed as being limited to the above-described embodiments. It would be apparent to a person skilled in the art that the present invention may be implemented with various modifications without departing from the scope of the invention.

What is claimed is:

1. A method of manufacturing a magnetic memory, including:

forming a sacrificial layer on a semiconductor substrate in which a transistor is integrated;

forming a deformable base plate on the sacrificial layer;

forming a spin device element on the deformable base plate, the spin device element storing a digital data representing a magnetization direction;

forming a bending mechanism configured to bend the deformable base plate; and forming a space which is not filled with solid substance by removing at least a portion of the sacrificial layer, so that the lower surface of the deformable base plate faces the space.

2. The method according to claim 1, wherein the bending mechanism is configured to bend the deformable base plate with a piezoelectric effect.

3. The method according to claim 2, wherein the forming the bending mechanism includes:
   forming a piezoelectric layer coupled with the deformable base plate.

4. The method according to claim 1, wherein the magnetization direction is allowed to be directed in first and second directions different from each other,
   wherein the first direction is associated with a first data value, and
   wherein the second direction is associated with a second data value.

5. The method according to claim 1, further comprising:
   forming a fixture base on the semiconductor substrate,
   wherein the fixture base and the sacrificial layer are commonly formed on a surface of the semiconductor substrate,
   wherein the deformable base plate are formed on the fixture base and the sacrificial layer.

6. The method according to claim 5,
   wherein the portion of the sacrificial layer is selectively removed while the fixture base and the deformable base plate remain unremoved.

7. The method according to claim 1, wherein the forming of the bending mechanism includes forming a first electrode, wherein the deformable base plate includes a second electrode opposed to the first electrode,
   wherein the bending mechanism is configured to bend the deformable base plate by using a force exerted between the first and second electrodes when a voltage is applied between the first and second electrodes.

8. The method according to claim 1, wherein the spin device element is positioned opposed to the space which is not filled with solid substance, across the deformable base plate.

9. The method according to claim 8, wherein the spin device element is coupled with the upper surface of the deformable base plate, and
   wherein the lower surface of the deformable base plate faces the space which is not filled with solid substance.

10. The method according to claim 1, further comprising:
    forming a contact providing an electrical connection between the spin device element and the transistor through the deformable base plate.

11. The method according to claim 5, further comprising:
    forming a contact providing an electrical connection between the spin device element and the transistor through the base fixture and the deformable base plate.

* * * * *